US 012262558B2

(12) United States Patent
Park et al.

(10) Patent No.: US 12,262,558 B2
(45) Date of Patent: Mar. 25, 2025

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Jaeseoung Park, Seoul (KR); Wandon Kim, Seongnam-si (KR); Suyoung Bae, Daegu (KR); Dongsoo Lee, Gunpo-si (KR); Dongsuk Shin, Suwon-si (KR); Doyoung Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 429 days.

(21) Appl. No.: 17/840,819

(22) Filed: Jun. 15, 2022

(65) Prior Publication Data

US 2023/0020176 A1 Jan. 19, 2023

(30) Foreign Application Priority Data

Jul. 14, 2021 (KR) .................. 10-2021-0092137

(51) Int. Cl.
*H10D 84/85* (2025.01)
*H01L 21/02* (2006.01)
(Continued)

(52) U.S. Cl.
CPC ......... *H10D 84/85* (2025.01); *H01L 21/0259* (2013.01); *H10D 30/031* (2025.01);
(Continued)

(58) Field of Classification Search
CPC ............ H01L 27/092; H01L 29/78391; H01L 29/0665; H01L 29/42392; H01L 29/4908; H01L 29/66545; H01L 29/66742; H01L 29/6684; H01L 29/78618; H01L 29/78696; H01L 21/823807; H01L 21/0259; H01L 21/823814; H01L 21/823857;
(Continued)

(56) References Cited

U.S. PATENT DOCUMENTS 6,292,874 B1  9/2001  Barnett
8,836,037 B2  9/2014  Ando et al.
(Continued)

FOREIGN PATENT DOCUMENTS

KR   10-0734340 B1   7/2007

*Primary Examiner* — Christine A Enad
(74) *Attorney, Agent, or Firm* — Wolf, Greenfield & Sacks, P.C.

(57) ABSTRACT

A semiconductor device includes a substrate including first and second regions, first and second active patterns provided on the first and second regions, respectively, a pair of first source/drain patterns on the first active pattern and a first channel pattern therebetween, a pair of second source/drain patterns on the second active pattern and a second channel pattern therebetween, first and second gate electrodes respectively provided on the first and second channel patterns, and first and second gate insulating layers respectively interposed between the first and second channel patterns and the first and second gate electrodes. Each of the first and second gate insulating layers includes an interface layer and a first high-k dielectric layer thereon, and the first gate insulating layer further includes a second high-k dielectric layer on the first high-k dielectric layer.

16 Claims, 53 Drawing Sheets

(51) Int. Cl.
*H10D 30/01* (2025.01)
*H10D 30/67* (2025.01)
*H10D 30/69* (2025.01)
*H10D 62/10* (2025.01)
*H10D 64/01* (2025.01)
*H10D 84/01* (2025.01)
*H10D 84/03* (2025.01)

(52) U.S. Cl.
CPC ..... *H10D 30/0415* (2025.01); *H10D 30/6713* (2025.01); *H10D 30/6735* (2025.01); *H10D 30/6739* (2025.01); *H10D 30/6757* (2025.01); *H10D 30/701* (2025.01); *H10D 62/118* (2025.01); *H10D 64/017* (2025.01); *H10D 84/0167* (2025.01); *H10D 84/017* (2025.01); *H10D 84/0181* (2025.01); *H10D 84/038* (2025.01)

(58) Field of Classification Search
CPC .... H10D 84/85; H10D 30/701; H10D 62/118; H10D 30/6735; H10D 84/017; H10D 64/017; H10D 30/6739; H10D 30/6757
See application file for complete search history.

(56) References Cited

U.S. PATENT DOCUMENTS

| | | |
|---|---|---|
| 10,559,687 B2 | 2/2020 | Song et al. |
| 10,600,913 B2 | 3/2020 | Chung et al. |
| 10,651,285 B2 | 5/2020 | Liu et al. |
| 10,770,563 B2 | 9/2020 | Cheng et al. |
| 10,923,602 B2 | 2/2021 | Kim et al. |
| 10,991,695 B2 | 4/2021 | Chang et al. |
| 2017/0256544 A1 | 9/2017 | Chai et al. |
| 2019/0378911 A1 | 12/2019 | Lee et al. |
| 2021/0066137 A1* | 3/2021 | Hsu ................ H01L 29/517 |
| 2021/0083054 A1 | 3/2021 | Liaw |
| 2021/0375629 A1* | 12/2021 | Lai ................ H01L 21/823462 |
| 2022/0140097 A1* | 5/2022 | Hsu ................ H01L 21/823842 |
| 2022/0199472 A1* | 6/2022 | Chao ................ H01L 29/517 |
| 2022/0320293 A1* | 10/2022 | Liao ................ H01L 27/092 |

* cited by examiner

SEMICONDUCTOR DEVICE AND METHOD OF MANUFACTURING THE SAME

CROSS-REFERENCE TO THE RELATED APPLICATIONS

This application is based on and claims priority from Korean Patent Application No. 10-2021-0092137, filed on Jul. 14, 2021, in the Korean Intellectual Property Office, the entire disclosure of which is incorporated herein by reference.

BACKGROUND

The present disclosure relates to a semiconductor device and a method of manufacturing the same, and in particular, to a semiconductor device including a field effect transistor and a method of fabricating the same.

A semiconductor device includes an integrated circuit formed of metal-oxide-semiconductor field-effect transistors (MOSFETs). To meet an increasing demand for a semiconductor device with a small pattern size and a reduced design rule, the MOSFETs are being aggressively scaled down. The scale-down of the MOSFETs may lead to deterioration in operational properties of the semiconductor device. A variety of studies are being conducted to overcome technical limitations associated with the scale-down of the semiconductor device and realize high performance the semiconductor device.

SUMMARY

Various embodiments of the inventive concept provide a semiconductor device with improved reliability and electric characteristics.

The embodiments also provide a method of fabricating a semiconductor device with improved reliability and electric characteristics.

According to an embodiment, a semiconductor device may include a substrate including a first region and a second region, a first active pattern on the first region and a second active pattern on the second region, a pair of first source/drain patterns on the first active pattern and a first channel pattern therebetween, the first channel pattern including a plurality of first semiconductor patterns stacked on the first active pattern, a pair of second source/drain patterns on the second active pattern and a second channel pattern therebetween, the second channel pattern including a plurality of second semiconductor patterns stacked on the second active pattern, a first gate electrode and a second gate electrode provided on the first and second channel patterns, respectively, and a first gate insulating layer between the first channel pattern and the first gate electrode and a second gate insulating layer between the second channel pattern and the second gate electrode. Each of the first and second gate insulating layers may include an interface layer and a first high-k dielectric layer on the interface layer, and the first gate insulating layer may further include a second high-k dielectric layer on the first high-k dielectric layer. A width of the first gate electrode may be greater than a width of the second gate electrode in a channel length direction, and the second high-k dielectric layer may not be included in the second gate insulating layer. The second high-k dielectric layer may include a material of which a band gap is greater than the first high-k dielectric layer.

According to an embodiment, a semiconductor device may include an active pattern on a core/peri region of a substrate, a pair of source/drain patterns on the active pattern and a channel pattern therebetween, the channel pattern including first to third semiconductor patterns, which are sequentially stacked on the active pattern and are spaced apart from each other, a gate electrode on the first to third semiconductor patterns, the gate electrode including a first portion between the active pattern and the first semiconductor pattern, a second portion between the first semiconductor pattern and the second semiconductor pattern, a third portion between the second semiconductor pattern and the third semiconductor pattern, and a fourth portion on the third semiconductor pattern, a gate insulating layer between the first to third semiconductor patterns and the gate electrode, the gate insulating layer enclosing each of the first to third semiconductor patterns, a pair of gate spacers provided at both sides of the gate electrode, a gate capping pattern on a top surface of the gate electrode, an active contact electrically connected to at least one of the pair of source/drain patterns, a gate contact electrically connected to the gate electrode, a first metal layer on the active contact and the gate contact, the first metal layer including first interconnection lines electrically connected to the active contact and the gate contact, and a second metal layer on the first metal layer. The gate insulating layer may include an interface layer, a first high-k dielectric layer, and a second high-k dielectric layer, which are sequentially stacked on each of the first to third semiconductor patterns. A thickness of the gate insulating layer may range from 3 nm to 5 nm, and a thickness of the second portion of the gate electrode in a vertical direction may range from 4 nm to 8 nm.

According to an embodiment, a method of fabricating a semiconductor device may include forming a first active pattern and a second active pattern on a first region and a second region of a substrate, respectively, forming a first stacking pattern and a second stacking pattern on the first and second active patterns, respectively, each of the first and second stacking patterns including sacrificial layers and active layers, which are alternately stacked, forming a first sacrificial pattern and a second sacrificial pattern on the first and second stacking patterns, respectively, forming an interlayer insulating layer on the first and second sacrificial patterns, removing the first sacrificial pattern and the sacrificial layers of the first stacking pattern to form a first empty space, removing the second sacrificial pattern and the sacrificial layers of the second stacking pattern to form a second empty space, sequentially forming an interface layer, a first high-k dielectric layer, and a second high-k dielectric layer in the first and second empty spaces, forming a mask layer on the first region to fill the first empty space and to expose the second region, and selectively removing the second high-k dielectric layer in the second empty space.

DETAILED DESCRIPTION

All of the embodiments described herein are example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
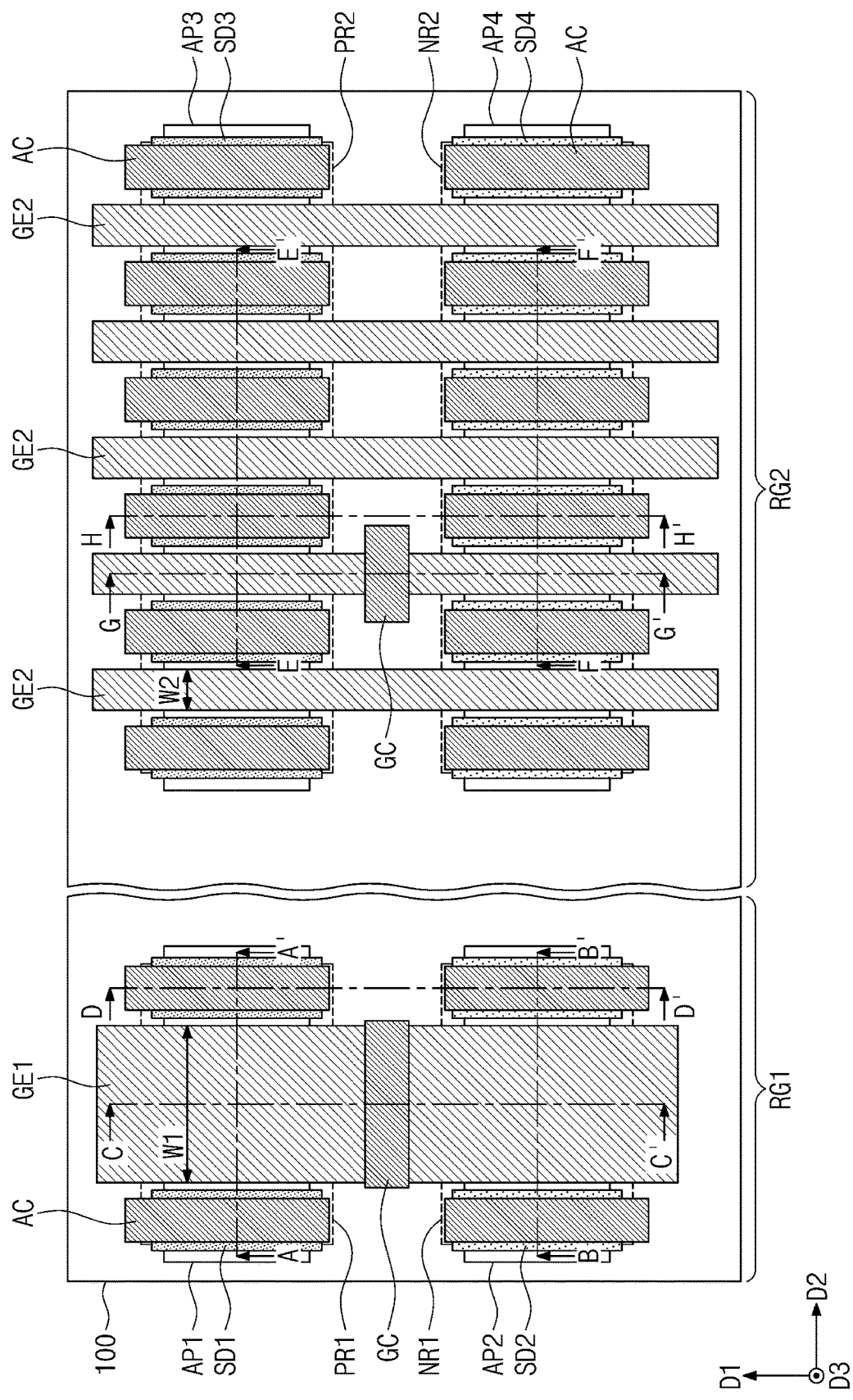
FIG. 1 is a plan view illustrating a semiconductor device according to an embodiment.

FIG. 1 is a plan view illustrating a semiconductor device according to an embodiment. FIGS. 2A to 2H are sectional views which are respectively taken along lines A-A', B-B', C-C', D-D', E-E', F-F', G-G', and H-H' shown in FIG. 1.

Referring first to FIG. 1, a substrate 100 including a first region RG1 and a second region RG2 may be provided. The substrate 100 may be a semiconductor substrate that is formed of or includes silicon, germanium, silicon-germanium, a compound semiconductor material, or the like. In an embodiment, the substrate 100 may be a silicon wafer. Each of the first and second regions RG1 and RG2 may be a cell region, in which a standard cell constituting a logic circuit is disposed. As another example, the first region RG1 may be a peripheral region, in which transistors constituting a processor core or I/O terminals are disposed. For example, the first region RG1 may be a core/peri region of a logic die. A long gate transistor or a long channel transistor having a relatively long gate length or a relatively long channel length may be provided in the first region RG1. The transistor in the first region RG1 may be operated under high power condition, compared with the transistor in the second region RG2. The transistor in the first region RG1 may be an extra gate (EG) device. The transistor in the second region RG2 may be a single gate (SG) device. Hereinafter, the transistor in the first region RG1 will be described in more detail with reference to FIGS. 1 and 2A to 2D.

The first region RG1 may include a first p-type MOSFET (hereafter "PMOS") region PR1 and a first n-type MOSFET (hereafter "NMOS") region NR1. The first PMOS region PR1 and the first NMOS region NR1 may be defined by a trench TR, which is formed in an upper portion of the substrate 100. In other words, the trench TR may be provided between the first PMOS region PR1 and the first NMOS region NR1. The first PMOS region PR1 and the first NMOS region NR1 may be spaced apart from each other in a first direction D1 with the trench TR interposed therebetween.

A first active pattern AP1 and a second active pattern AP2 may be provided on the first PMOS region PR1 and the first NMOS region NR1, respectively. In a plan view, the first and second active patterns AP1 and AP2 may be extended in a second direction D2. Each of the first and second active patterns AP1 and AP2 may be a vertically-protruding portion of the substrate 100. It is understood here that the first and second directions D1 and D2 represent channel width and channel length directions, respectively.

A device isolation layer ST may be provided to fill the trench TR. The device isolation layer ST may define the first PMOS region PR1 and the first NMOS region NR1 of the substrate 100. The device isolation layer ST may be formed on side surfaces of the first and second active patterns AP1 and AP2. A device isolation layer ST may include a silicon oxide layer.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2 and SP3 may be spaced apart from each other in a vertical direction (i.e., a third direction D3).

Each of the first to third semiconductor patterns SP1, SP2 and SP3 may be formed of or include at least one of silicon (Si), germanium (Ge), or silicon-germanium (SiGe). In an embodiment, each of the first to third semiconductor patterns SP1, SP2 and SP3 may be formed of or include crystalline silicon.

A pair of first source/drain patterns SD1 may be provided on the first active pattern AP1. The first source/drain patterns SD1 may be impurity regions of a first conductivity type (e.g., p-type). The first to third semiconductor patterns SP1, SP2 and SP3 of the first channel pattern CH1 may be interposed between the first source/drain patterns SD1 in the second direction D2. In other words, the first to third semiconductor patterns SP1, SP2 and SP3 of the first channel pattern CH1 may connect the first source/drain patterns SD1 to each other in the second direction D2.

A pair of second source/drain patterns SD2 may be provided on the second active pattern AP2. The second source/drain patterns SD2 may be impurity regions of a second conductivity type (e.g., n-type). The first to third semiconductor patterns SP1, SP2 and SP3 of the second channel pattern CH2 may be interposed between the second source/drain patterns SD2 in the second direction D2. In other words, the first to third semiconductor patterns SP1, SP2 and SP3 of the second channel pattern CH2 may connect the second source/drain patterns SD2 to each other in the second direction D2.

The first and second source/drain patterns SD1 and SD2 may be epitaxial patterns, which are formed by a selective epitaxial growth process. As an example, each of the first and second source/drain patterns SD1 and SD2 may have a top surface that is located at substantially the same level as a top surface of the third semiconductor pattern SP3 in the third direction D3. As another example, a top surface of at least one of the first and second source/drain patterns SD1 and SD2 may be higher than a top surface of the third semiconductor pattern SP3 adjacent thereto.

The first source/drain patterns SD1 may be formed of or include a semiconductor material (e.g., SiGe) having a lattice constant greater than that of the substrate 100. In this case, the first source/drain patterns SD1 may exert a compressive stress on the first channel pattern CH1.

In an embodiment, the second source/drain patterns SD2 may be formed of or include the same semiconductor material (e.g., Si) as the substrate 100. Alternatively, the second source/drain patterns SD2 may be formed of or include a material containing both of silicon (Si) and carbon (C). For example, the second source/drain patterns SD2 may be formed of or include silicon carbide (SiC). In the case where the second source/drain patterns SD2 are formed of silicon carbide (SiC), a concentration of carbon in each of the second source/drain patterns SD2 may range from 10 at % to 30 at %. The second source/drain patterns SD2 containing the silicon carbide (SiC) may exert a tensile stress on the second channel pattern CH2 therebetween.

Each of the first source/drain patterns SD1 may include a first semiconductor layer SEL1 and a second semiconductor layer SEL2, which are sequentially stacked. A cross-sectional shape of the first source/drain patterns SD1 taken in the second direction D2 will be described with reference to FIG. 2A. The first semiconductor layer SEL1 may have a 'U'-shaped section. The first semiconductor layer SEL1 may have a decreasing thickness in an upward direction. The second semiconductor layer SEL2 may be provided on the first semiconductor layer SEL1. A volume of the second semiconductor layer SEL2 may be greater than a volume of the first semiconductor layer SEL1. For example, a ratio of the volume of the second semiconductor layer SEL2 to a total volume of each of the first source/drain patterns SD1 may be greater than a ratio of the volume of the first semiconductor layer SEL1 to the total volume of each of the first source/drain patterns SD1.

Each of the first and second semiconductor layers SEL1 and SEL2 may be formed of or include silicon-germanium (SiGe). In detail, the first semiconductor layer SEL1 may be provided to have a relatively low germanium concentration. In another embodiment, the first semiconductor layer SEL1 may be provided to contain silicon (Si) without germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the upward direction. For example, the germanium concentration of the second semiconductor layer SEL2 may be about 40 at % near the first semiconductor layer SEL1 but may be about 60 at % at its top level.

The first and second semiconductor layers SEL1 and SEL2 may include impurities (e.g., boron), and in this case, the first source/drain patterns SD1 may have the p-type conductivity. In an embodiment, a concentration of impurities in the second semiconductor layer SEL2 (in at %) may be higher than that in the first semiconductor layer SEL1.

The first semiconductor layer SEL1 may prevent a stacking fault from occurring between the substrate 100 and the second semiconductor layer SEL2 and between the first channel pattern CH1 and the second semiconductor layer SEL2. The stacking fault may lead to an increase in channel resistance, but due to the first semiconductor layer SEL1, it may be possible to prevent the stacking fault, and thereby, improve electric characteristics of the semiconductor device.

The first semiconductor layer SEL1 may protect the second semiconductor layer SEL2, during a process of replacing sacrificial layers SAL with first to third portions PO1, PO2 and PO3 of a first gate electrode GE1 to be described later. For example, the first semiconductor layer SEL1 may prevent the second semiconductor layer SEL2 from being undesirably etched by an etching material, which is used to remove the sacrificial layers SAL.

Referring back to FIGS. 1 and 2A to 2D, the first gate electrode GE1 may be provided to cross the first and second active patterns AP1 and AP2, and extend in the first direction D1. The first gate electrode GE1 may be extended from the first PMOS region PR1 to the first NMOS region NR1. The first gate electrode GE1 may vertically overlap the first and second channel patterns CH1 and CH2. The first gate electrode GE1 may have a first width W1 in the second direction D2. For example, the first width W1 may range from 70 nm to 300 nm.

The first gate electrode GE1 may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 provided on the third semiconductor pattern SP3.

Figure 2A:
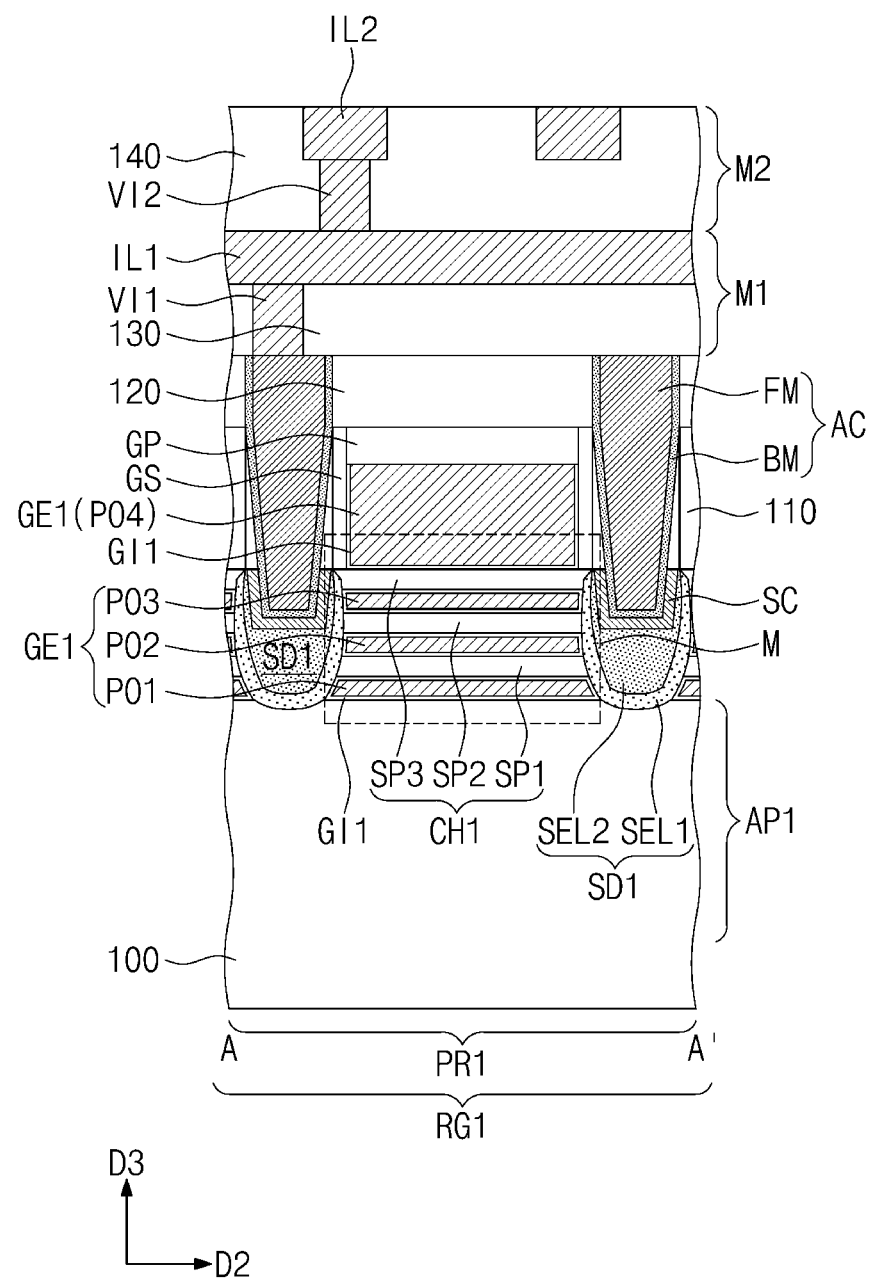
FIGS. 2A to 2H are sectional views which are respectively taken along lines A-A', B-B', C-C', D-D', E-E', F-F', G-G', and H-H' of FIG. 1.
Figure 2B:
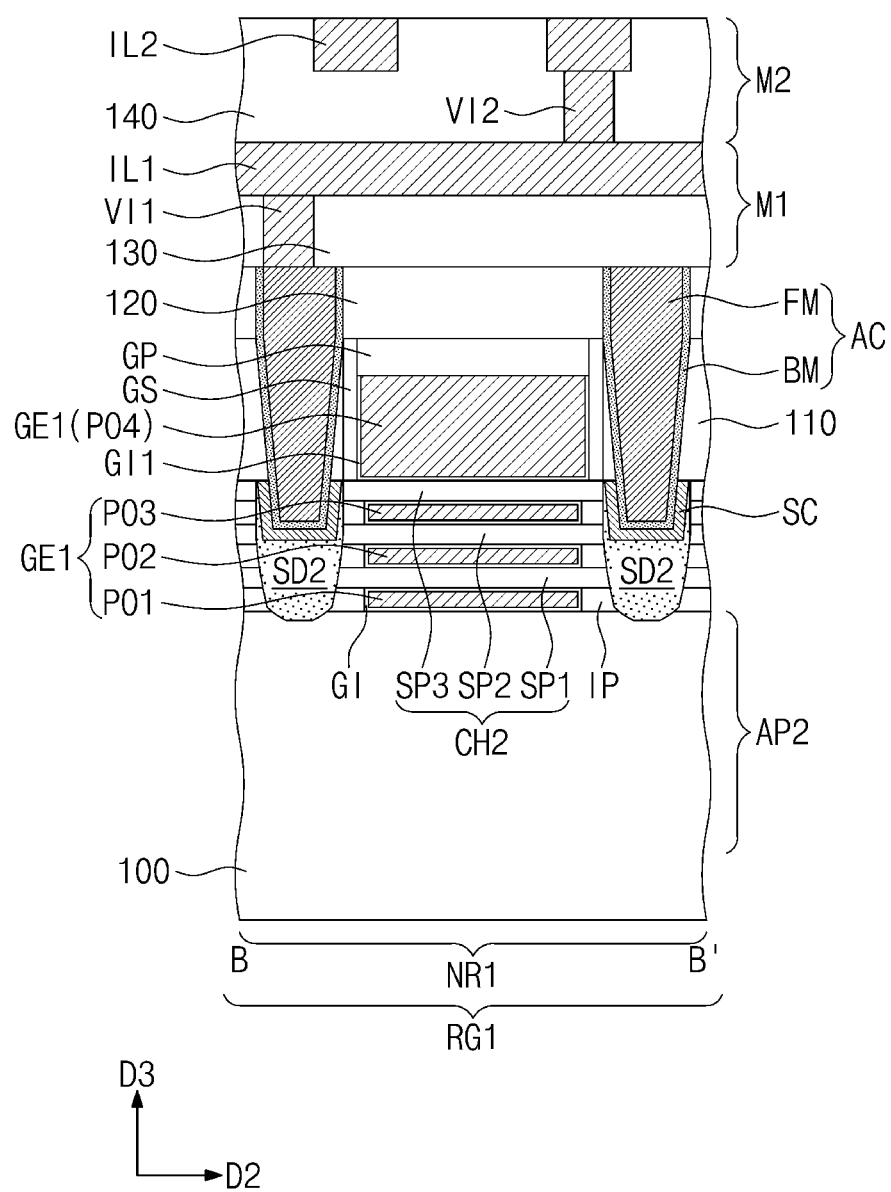
Figure 2C:
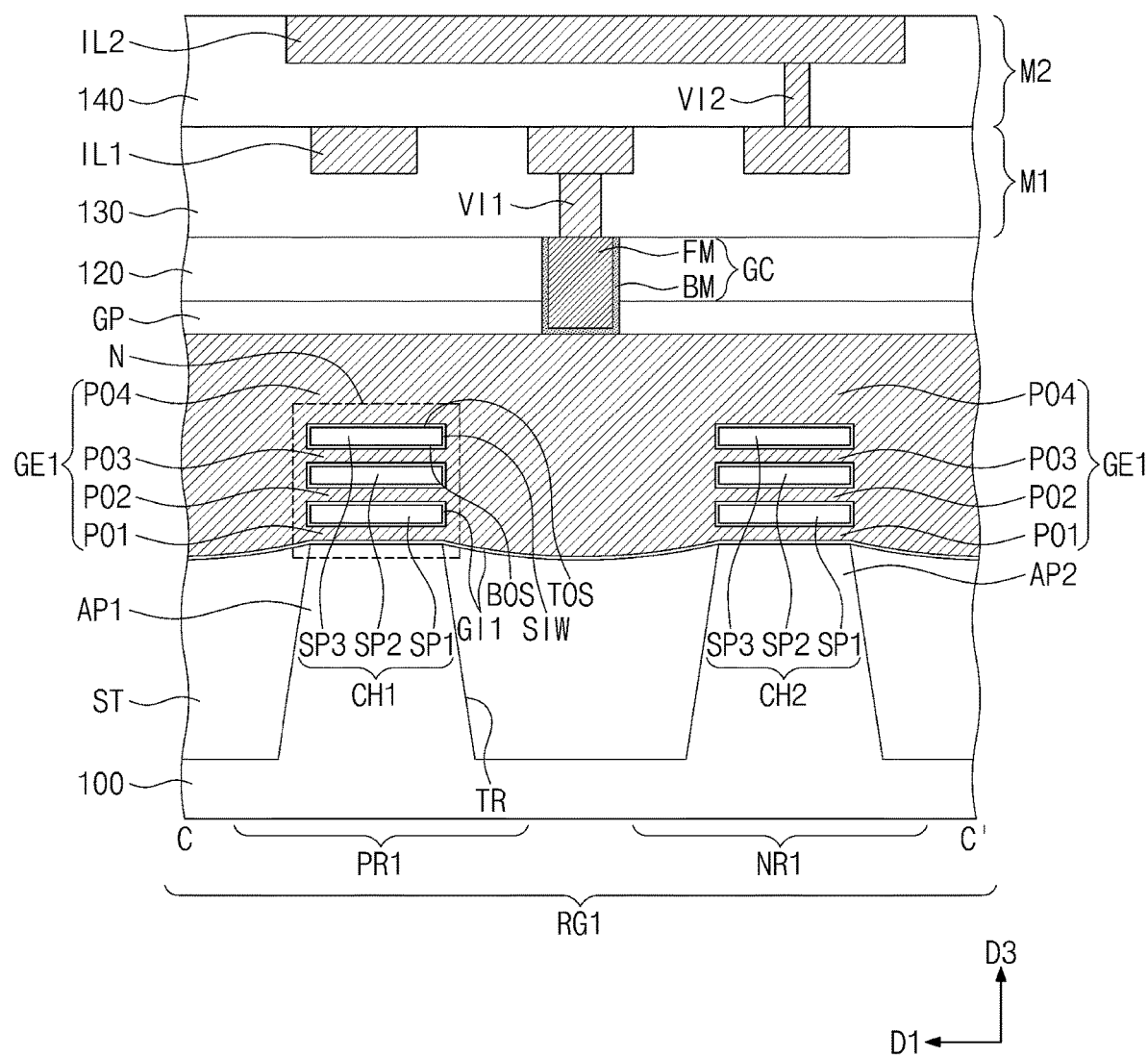
Figure 2D:
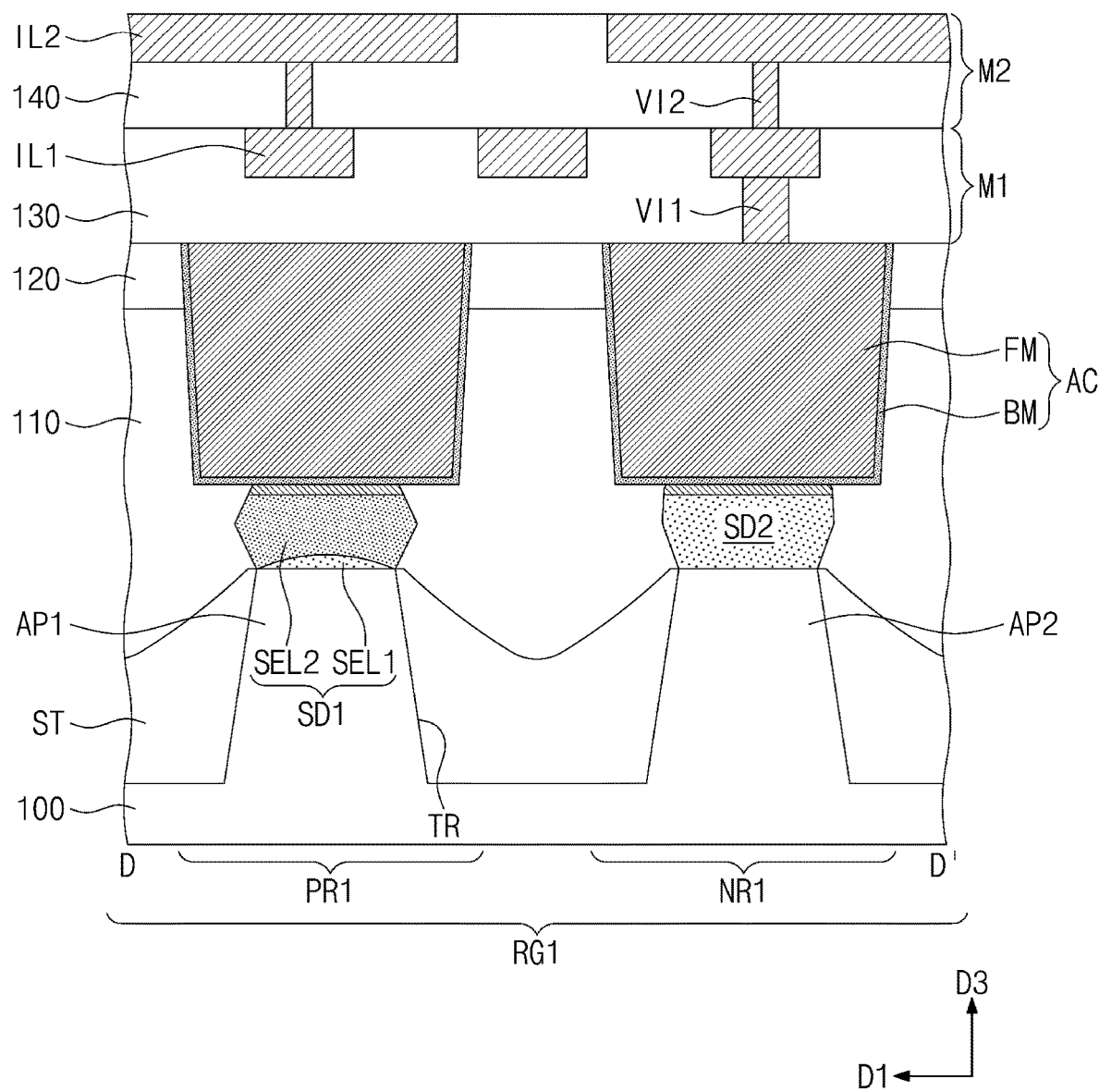

Referring back to FIG. 2C, the first gate electrode GE1 may be provided to face a top surface TOS, a bottom surface BOS, and opposite side surfaces SIW of each of the first to third semiconductor patterns SP1, SP2 and SP3 in the first direction D1. That is, the transistor according to the present embodiment may be a three-dimensional field effect transistor (e.g., multi-bridge channel field-effect transistor (MBCFET) or gate-all-around field-effect transistor (GAAFET)) in which a gate electrode is provided to three-dimensionally surround the channel pattern. As shown in FIG. 2C, the gate electrode GE1 may surround all four sides of each of the first and second channel patterns CH1 and CH2, for example, each of the first to third semiconductor patterns SP1, SP2 and SP3 of each of the first and second channel patterns CH1 and CH2, in a cross-sectional view of the semiconductor device in the first direction D1.

Referring back to FIGS. 1 and 2A to 2D, gate spacers GS may be disposed on opposite side surfaces of the first gate electrode GE1 in the second direction D2. The gate spacers GS may be extended along the first gate electrode GE1 or in the first direction D1. The gate spacers GS may have top surfaces that are higher than the top surface of the first gate electrode GE1. In an embodiment, the top surfaces of the gate spacers GS may be coplanar with a top surface of a first interlayer insulating layer 110, which will be described later. Alternatively, the top surfaces of the gate spacers GS may be lower than the top surface of the first interlayer insulating layer 110. The gate spacers GS may be formed of or include at least one of SiCN, SiCON or SiN. As an example, the gate spacers GS may have a multi-layered structure including at least two of silicon carbonitride (SiCN), silicon carbon oxynitride (SiCON) or silicon nitride (SiN).

A gate capping pattern GP may be provided on the first gate electrode GE1. The gate capping pattern GP may be extended along the first gate electrode GE1 or in the first direction D1. The gate capping pattern GP may be formed of or include a material having an etch selectivity with respect to first and second interlayer insulating layers 110 and 120, which will be described later. For example, the gate capping patterns GP may be formed of or include at least one of silicon oxynitride (SiON), SiCN, SiCON or SiN.

A first gate insulating layer GI1 may be interposed between the first gate electrode GE1 and the first channel pattern CH1 and between the first gate electrode GE1 and the second channel pattern CH2. The first gate insulating layer GI1 may be provided to be directly formed on the top surface TOS, the bottom surface BOS, and the opposite side surfaces SIW of each of the first to third semiconductor patterns SP1, SP2 and SP3 in the first direction D1 (e.g., see FIG. 2C). The first gate insulating layer GI1 may be extended along a bottom surface of the first gate electrode GE1 thereon. The first gate insulating layer GI1 may be formed on a top surface of the device isolation layer ST, which is located below the first gate electrode GE1.

In an embodiment, the first gate insulating layer GI1 may include a silicon oxide layer, a silicon oxynitride layer, and/or a high-k dielectric layer. The high-k dielectric layer may be formed of or include at least one of high-k dielectric materials of which dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The first gate electrode GE1 may include a first metal pattern and a second metal pattern on the first metal pattern. The first metal pattern may be provided on the first gate insulating layer GI1 to be adjacent to the first and second channel patterns CH1 and CH2. The first metal pattern may include a work-function metal, which can be used to adjust a threshold voltage of each transistor in the first region RG1. By adjusting a thickness and composition of the first metal pattern, it may be possible to realize a transistor having a desired threshold voltage.

The first metal pattern may include a metal nitride layer. For example, the first metal pattern may include a layer that includes at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of stacked work-function metal layers.

The second metal pattern may be formed of or include a metallic material of which resistance is lower than the first metal pattern. For example, the second metal pattern may include at least one metallic material, which is selected from the group consisting of tungsten (W), aluminum (Al), titanium (Ti), and tantalum (Ta).

Although not shown, the second metal pattern may not be included in the first to third portions PO1, PO2 and PO3 of the first gate electrode, and may be included in only the fourth portion PO4 of the first gate electrode GE1. In other words, the first to third portions PO1, PO2 and PO3 of the first gate electrode GE1 may include only the first metal pattern (i.e., the work-function metal). The fourth portion PO4 of the first gate electrode GE1 may include the first metal pattern and the second metal pattern thereon.

Referring back to FIG. 2B, inner spacers IP may be provided on the first NMOS region NR1. The inner spacers IP may be respectively interposed between the first to third portions PO1, PO2 and PO3 of the first gate electrode GE1 and each of the second source/drain patterns SD2. The inner spacers IP may be in a direct contact with the second source/drain patterns SD2. Each of the first to third portions PO1, PO2 and PO3 of the first gate electrode GE1 may be spaced apart from each of the second source/drain patterns SD2 by the inner spacer IP.

The inner spacer IP may be formed of or include at least one of low-k dielectric materials. The low-k dielectric materials may include silicon oxide or dielectric materials of which dielectric constants are lower than that of silicon oxide. For example, the low-k dielectric materials may include silicon oxide, fluorine- or carbon-doped silicon oxide, porous silicon oxide, or organic polymeric dielectric materials.

The first interlayer insulating layer 110 may be provided on the substrate 100. The first interlayer insulating layer 110 may surround the gate spacers GS and the first and second source/drain patterns SD1 and SD2. The first interlayer insulating layer 110 may have a top surface, which is substantially coplanar with the top surface of the gate capping pattern GP. A second interlayer insulating layer 120 may be formed on the first interlayer insulating layer 110 and the gate capping pattern GP. In an embodiment, at least one of the first and second interlayer insulating layers 110 and 120 may include a silicon oxide layer.

Active contacts AC may be provided to penetrate the first and second interlayer insulating layers 110 and 120, and may be electrically connected to the first and second source/drain patterns SD1 and SD2, respectively. A pair of the active contacts AC may be respectively provided at both sides of the first gate electrode GE1. In a plan view, the active contact AC may be a bar-shaped pattern extended in the first direction D1.

The active contact AC may include a conductive pattern FM and a barrier pattern BM surrounding the conductive pattern FM. For example, the conductive pattern FM may be formed of or include at least one of metallic materials (e.g., aluminum, copper, tungsten, molybdenum, and cobalt). The barrier pattern BM may be provided on side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

The active contact AC may be a self-aligned contact. For example, the active contact AC may be formed by a self-alignment process using the gate capping pattern GP and the gate spacer GS. In an embodiment, the active contact AC may be formed on at least a portion of the side surface of the gate spacer GS. Although not shown, the active contact AC may also be formed on a portion of the top surface of the gate capping pattern GP.

Silicide patterns SC may be interposed between the active contact AC and each of the first source/drain patterns SD1, and between the active contact AC and each of the second source/drain patterns SD2. The active contact AC may be electrically connected to the source/drain patterns SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

A gate contact GC may be provided to penetrate the second interlayer insulating layer 120 and the gate capping pattern GP, and may be electrically connected to the first gate electrode GE1. The gate contact GC may be provided on the device isolation layer ST between the first PMOS region PR1 and the first NMOS region NR1. In a plan view, the gate contact GC may be a bar-shaped pattern extending in the second direction D2. The gate contact GC may include the conductive pattern FM and the barrier pattern BM surrounding the conductive pattern FM, similar to the active contact AC.

A third interlayer insulating layer 130 may be provided on the second interlayer insulating layer 120. A first metal layer M1 may be provided in the third interlayer insulating layer 130. The first metal layer M1 may include first interconnection lines IL1 and first vias VI1. The first vias VI1 may be provided below the first interconnection lines IL1. The first interconnection lines IL1 may be disposed in the first direction D1. Each of the first interconnection lines IL1 may be a line- or bar-shaped pattern extending in the second direction D2.

The first vias VI1 may be provided below the first interconnection lines IL1 of the first metal layer M1, respectively. The first vias VI1 may be respectively interposed between the active contacts AC and the first interconnection lines IL1. The first vias VI1 may be respectively interposed between the gate contacts GC and the first interconnection lines IL1.

The first interconnection line IL1 and the first via VI1 thereunder may be formed by separate processes, respectively. For example, each of the first interconnection line IL1 and the first via VI1 may be formed by a single damascene process. The semiconductor device according to the present embodiment may be fabricated using a sub-20 nm process.

A fourth interlayer insulating layer 140 may be provided on the third interlayer insulating layer 130. A second metal layer M2 may be provided in the fourth interlayer insulating layer 140. The second metal layer M2 may include second interconnection lines IL2. Each of the second interconnection lines IL2 may be a line- or bar-shaped pattern extending in the first direction D1. For example, the second interconnection lines IL2 may be extended in the first direction D1 to be parallel to each other.

The second metal layer M2 may further include second vias VI2. The second vias VI2 may be provided below the second interconnection lines IL2, respectively. The second vias VI2 may be respectively interposed between the first interconnection lines IL1 and the second interconnection lines IL2.

The second interconnection line IL2 and the second via VI2 thereunder may be formed by the same process, and in this case, they may constitute a single object. For example, the second interconnection line IL2 and the second via VI2 of the second metal layer M2 may be formed together by a dual damascene process.

The first interconnection lines IL1 of the first metal layer M1 and the second interconnection lines IL2 of the second metal layer M2 may be formed of or include the same conductive material or different conductive materials. For example, the first interconnection lines IL1 and the second interconnection lines IL2 may be formed of or include at least one of metallic materials (e.g., copper (Cu), ruthenium (Ru), cobalt (Co), tungsten (W), aluminum (Al), and/or molybdenum (Mo)).

In an embodiment, although not shown, additional metal layers (e.g., M3, M4, M5, and so forth) may be further stacked on the fourth interlayer insulating layer 140. Each of the stacked metal layers may include routing lines.

Hereinafter, the transistors in the second region RG2 will be described in more detail with reference to FIGS. 1 and 2E to 2H. The same features as those of the transistors in the first region RG1 described with reference to FIGS. 1 and 2A to 2D may be omitted in the following description, for the sake of brevity.

The second region RG2 may include a second PMOS region PR2 and a second NMOS region NR2. The second PMOS region PR2 and the second NMOS region NR2 may be defined by a trench TR, which is formed in an upper portion of the substrate 100. A third active pattern AP3 and a fourth active pattern AP4 may be defined by the device isolation layer ST filling the trench TR. The third active pattern AP3 and the fourth active pattern AP4 may be provided on the second PMOS region PR2 and the second NMOS region NR2, respectively. The trench TR and the device isolation layer ST formed in the second region RG2 may be extended from, or separate from the trench TR and the device isolation layer ST formed in the first region RG1, according to embodiments.

A third channel pattern CH3 may be provided on the third active pattern AP3, and a fourth channel pattern CH4 may be provided on the fourth active pattern AP4. Each of the third and fourth channel patterns CH3 and CH4 may include first to third semiconductor patterns SP1, SP2 and SP3, which are sequentially stacked.

The first to third semiconductor patterns SP1, SP2 and SP3 of the third and fourth channel patterns CH3 and CH4 may be shorter than the first to third semiconductor patterns SP1, SP2 and SP3 of the first and second channel patterns CH1 and CH2 described above, respectively. In detail, a length, in the second direction D2, of each of the first to third semiconductor patterns SP1, SP2 and SP3 of the third and fourth channel patterns CH3 and CH4 may be smaller than a length, in the second direction D2, of each of the first to third semiconductor patterns SP1, SP2 and SP3 of the first and second channel patterns CH1 and CH2. In other words, a short gate transistor or a short channel transistor having a relatively short gate length or a relatively short channel length may be provided in the second region RG2.

A pairs of third source/drain patterns SD3 may be provided in an upper portion of the third active pattern AP3. A pair of fourth source/drain patterns SD4 may be provided in an upper portion of the fourth active pattern AP4. The first to third semiconductor patterns SP1, SP2 and SP3 of the third channel pattern CH3 may be interposed between the third source/drain patterns SD3. The first to third semiconductor patterns SP1, SP2 and SP3 of the fourth channel pattern CH4 may be interposed between the fourth source/drain patterns SD4.

Each of the third source/drain patterns SD3 may be an epitaxial pattern containing in which impurities of the first conductivity type (e.g., p-type). Each of the fourth source/drain patterns SD4 may be an epitaxial pattern containing impurities of the second conductivity type (e.g., n-type). The third and fourth source/drain patterns SD3 and SD4 may be substantially the same as the first and second source/drain patterns SD1 and SD2, respectively, described above.

A plurality second gate electrodes GE2 may be provided to cross the third and fourth channel patterns CH3 and CH4 and to extend in the first direction D1. A second gate electrode GE2 may be extended from the second PMOS region PR2 to the second NMOS region NR2. The second gate electrode GE2 may vertically overlap the third and fourth channel patterns CH3 and CH4. The second gate electrode GE2 may have a second width W2 in the second direction D2. The second width W2 may be smaller than the first width W1 of the first gate electrode GE1. The gate spacers GS may be disposed on opposite side surfaces of the second gate electrode GE2 in the second direction D2. The gate capping pattern GP may be provided on the second gate electrode GE2.

Figure 2E:
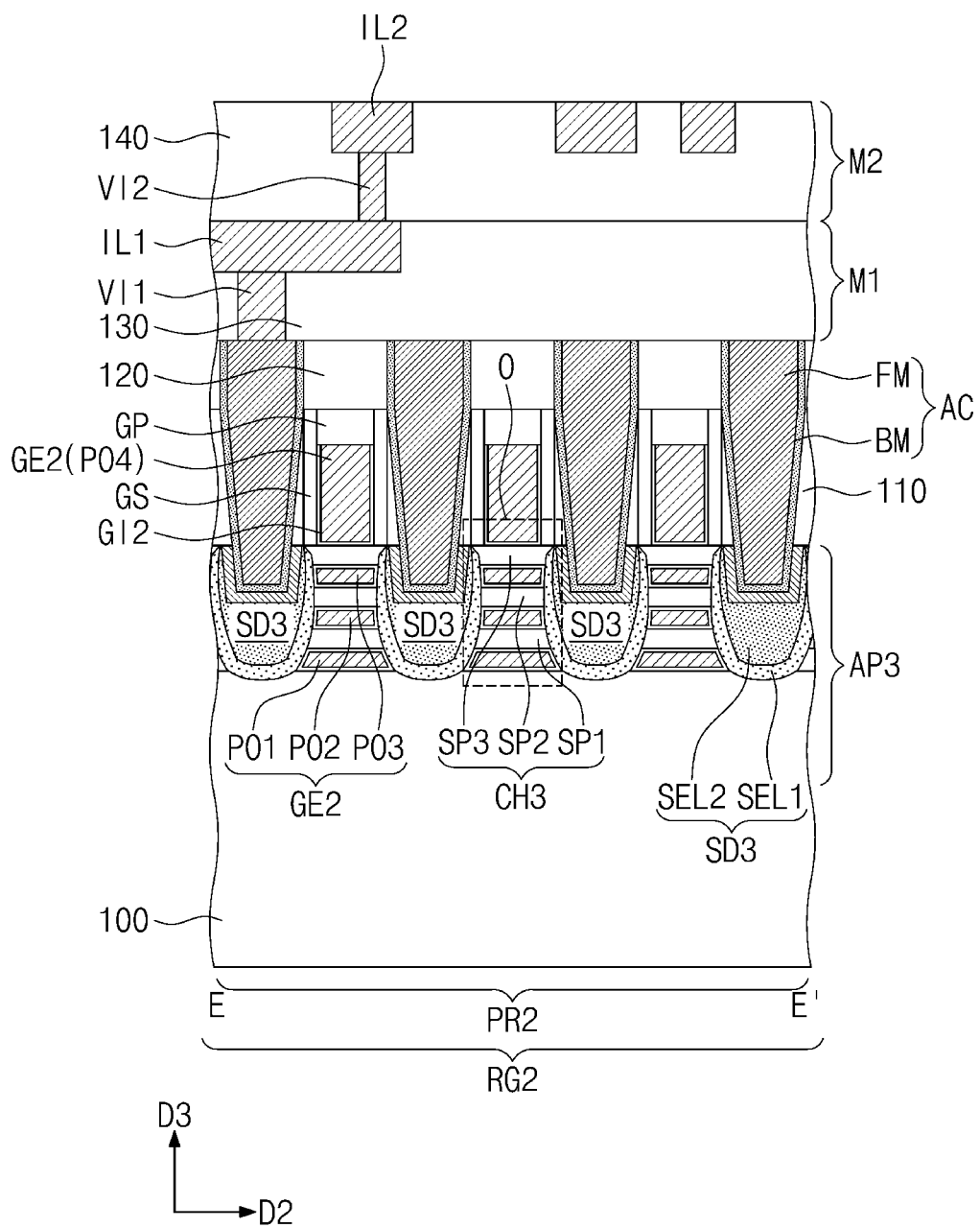
Figure 2F:
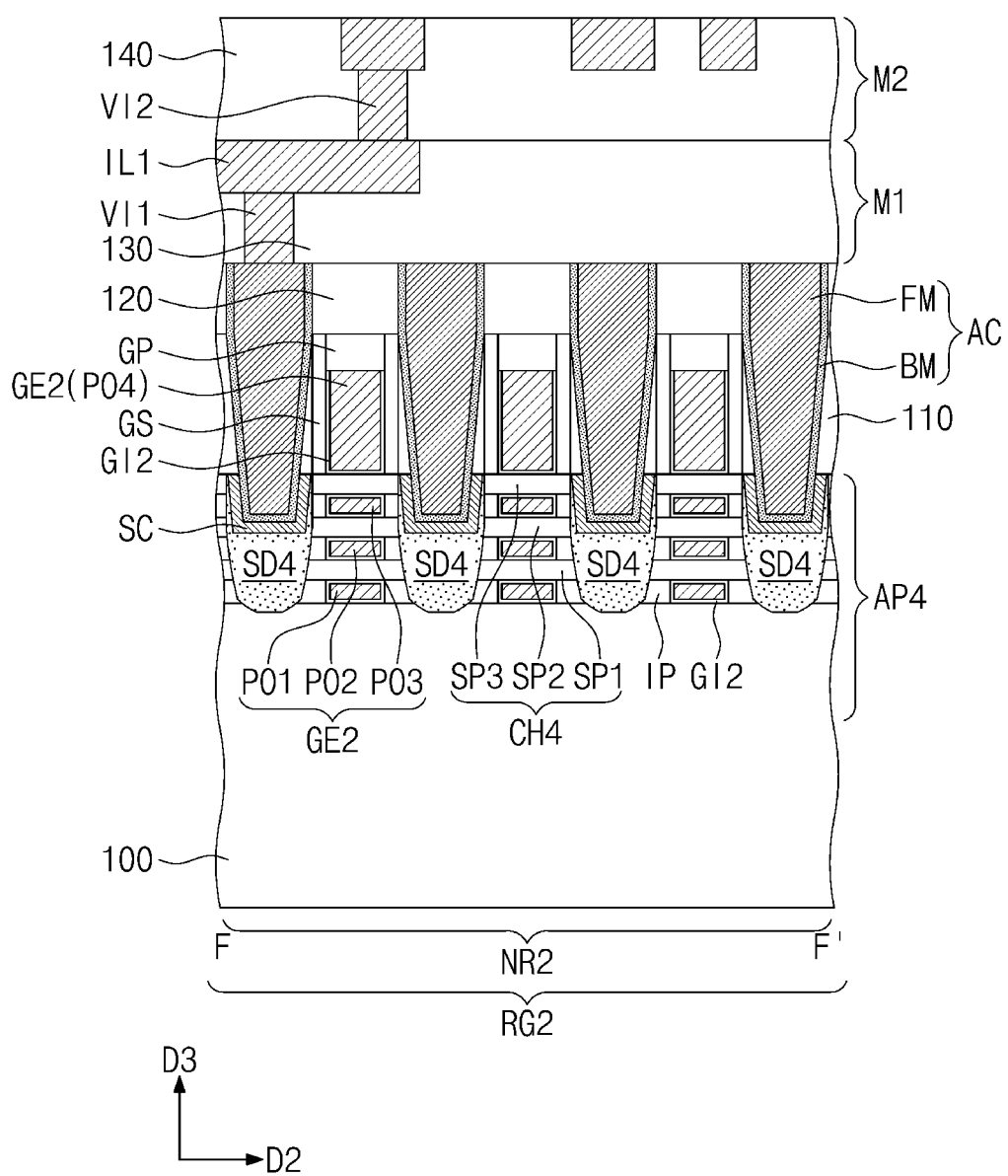
Figure 2G:
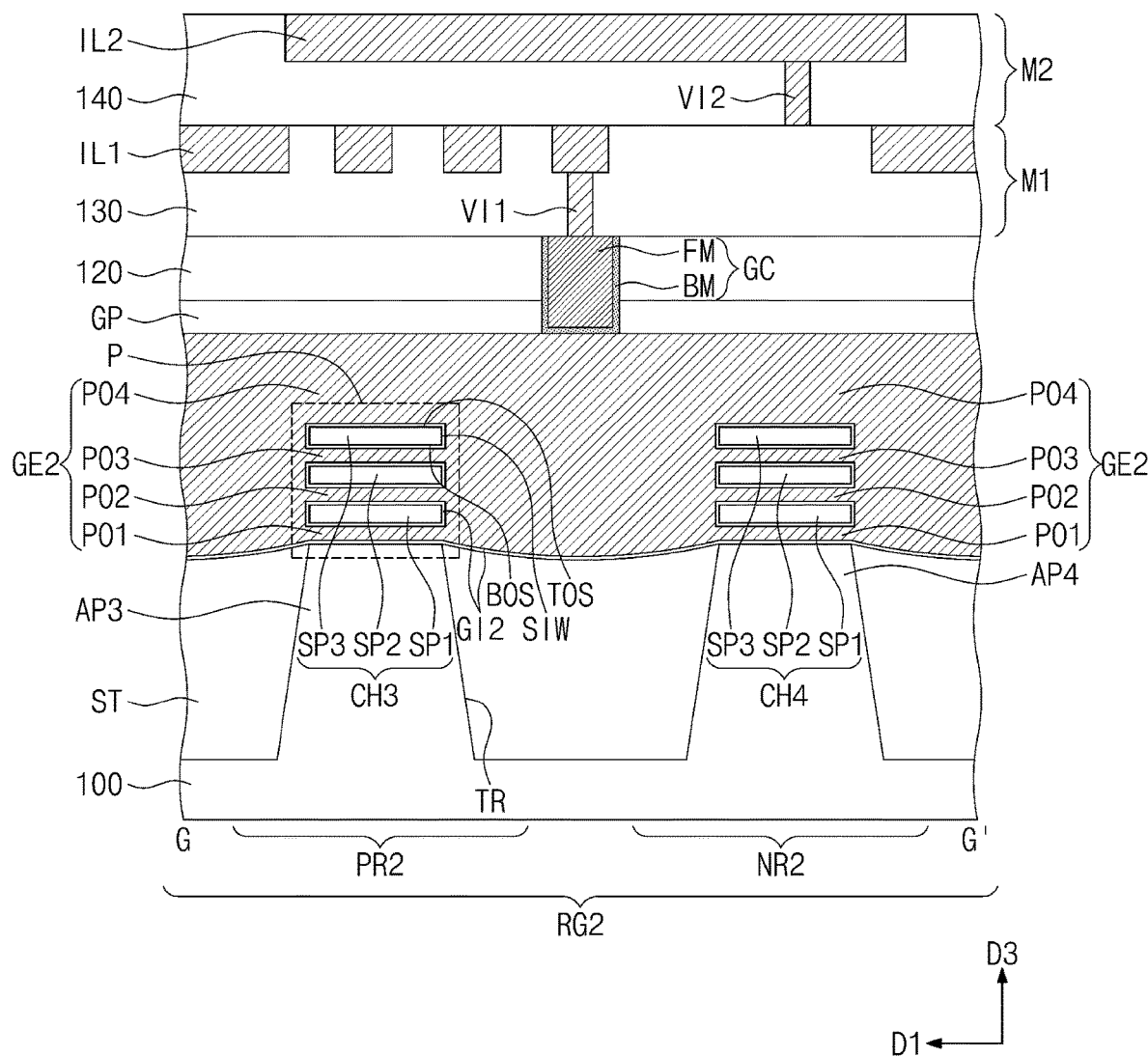
Figure 2H:
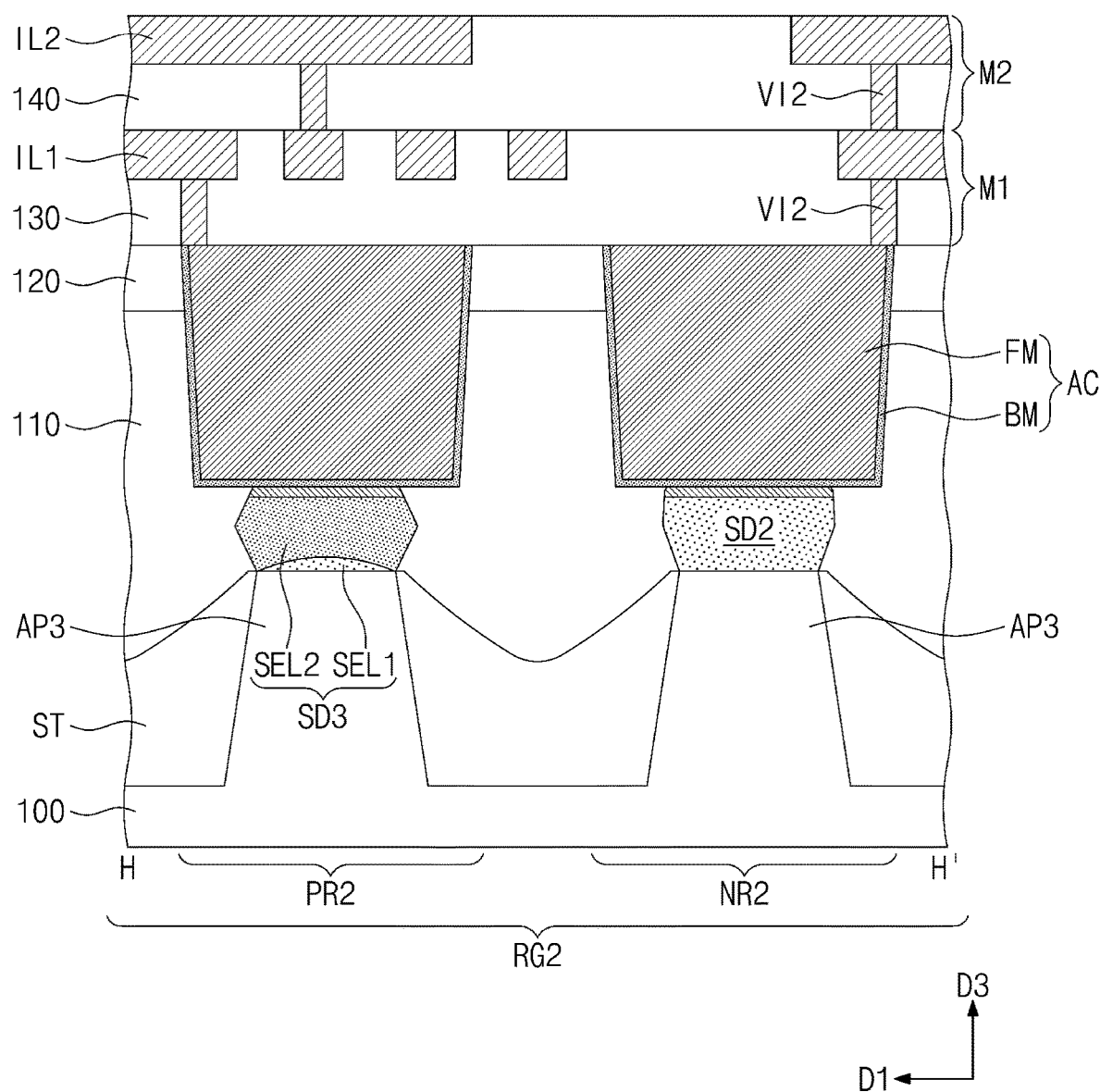

The second gate electrode GE2 may include first to fourth portions PO1 to PO4, similar to the first gate electrode GE1. The second gate electrode GE2 may be provided to face the top surface TOS, the bottom surface BOS, and the opposite side surfaces SIW of each of the first to third semiconductor patterns SP1, SP2 and SP3 in the first direction D1. In other words, the transistor on the second region RG2 may also be a three-dimensional field effect transistor (e.g., MBCFET or GAAFET). As shown in FIG. 2G, the gate electrode GE2 may surround all four sides of each of the third and fourth channel patterns CH3 and CH4, for example, each of the first to third semiconductor patterns SP1, SP2 and SP3 of each of the third and fourth channel patterns CH3 and CH4, in a cross-sectional view of the semiconductor device in the first direction D1.

Referring back to FIGS. 1 and 2E to 2H, a second gate insulating layer GI2 may be interposed between the second gate electrode GE2 and the third channel pattern CH3 and between the second gate electrode GE2 and the fourth channel pattern CH4. The second gate insulating layer GI2 may be directly formed on the top surface TOS, the bottom surface BOS, and the opposite side surfaces SIW of each of the first to third semiconductor patterns SP1, SP2 and SP3 in the first direction D1 (e.g., see FIG. 2G). The second gate insulating layer GI2 may include a silicon oxide layer, a silicon oxynitride layer, and/or a high-k dielectric layer. A thickness of the second gate insulating layer GI2 on the second region RG2 may be smaller than a thickness of the first gate insulating layer GI1 on the first region RG1, as will be described with reference to FIGS. 3A to 3D.

Inner spacers IP may be provided on the second NMOS region NR2. The inner spacers IP may be respectively interposed between the first to third portions PO1, PO2 and PO3 of the second gate electrode GE2 and each of the fourth source/drain patterns SD4. Meanwhile, the inner spacers IP may not be formed in the second PMOS region PR2.

A first interlayer insulating layer 110 and a second interlayer insulating layer 120 may be provided on the substrate 100. Active contacts AC may be provided to penetrate the first and second interlayer insulating layers 110 and 120, and may be electrically and respectively connected to the third and fourth source/drain patterns SD3 and SD4. A gate contact GC may be provided to penetrate the second interlayer insulating layer 120, and a gate capping pattern GP and may be electrically connected to the gate electrode GE. A first metal layer M1 and a second metal layer M2 may be provided on the second interlayer insulating layer 120. The active contacts AC, the gate contact GC, the first metal layer M1, and the second metal layer M2 may be configured to have substantially the same features as those in the embodiment described with reference to FIGS. 1 and 2A to 2D. The first and second insulating layers 110 and 120 formed in the second region RG2 may be extended from and later separated from, for example, in a fin-cut operation, the first and second insulating layers 110 and 120 formed in the first region RG1, according to embodiments.

Figure 3A:
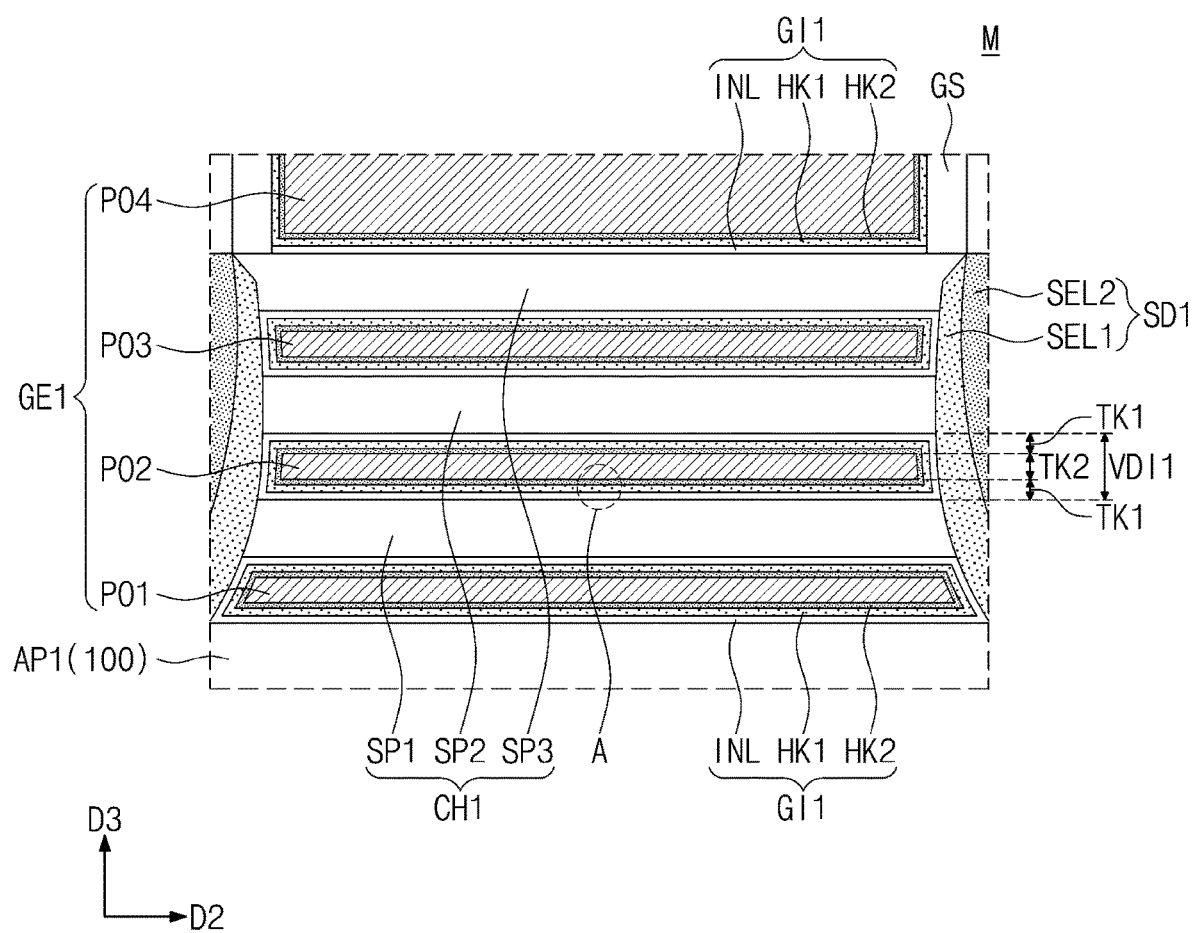
FIG. 3A is an enlarged sectional view illustrating a portion 'M' of FIG. 2A.

Hereinafter, the first channel pattern CH1 and the first gate insulating layer GI1 on the first region RG1 will be described in more detail below. FIG. 3A is an enlarged sectional view illustrating a portion 'M' of FIG. 2A, and FIG. 3B is an enlarged sectional view illustrating a portion 'N' of FIG. 2C.

Figure 3B:
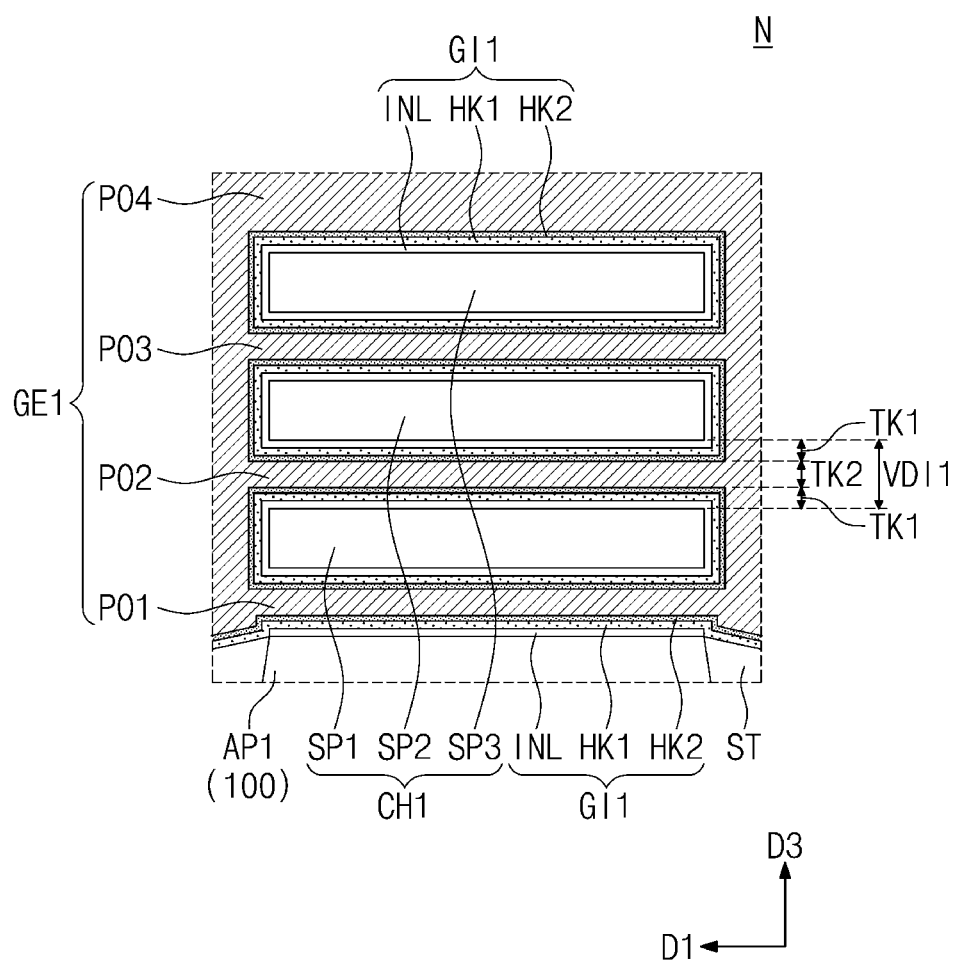
FIG. 3B is an enlarged sectional view illustrating a portion 'N' of FIG. 2C.

Referring to FIGS. 3A and 3B, the first gate insulating layer GI1 may be provided to enclose each of the first to third semiconductor patterns SP1, SP2 and SP3 of the first channel pattern CH1. The first gate insulating layer GI1 may include an interface layer INL, a first high-k dielectric layer HK1, and a second high-k dielectric layer HK2, which are sequentially stacked on each of the first to third semiconductor patterns SP1, SP2 and SP3. The first high-k dielectric layer HK1 may be interposed between the interface layer INL and the second high-k dielectric layer HK2.

The interface layer INL may be directly formed on of each of the first to third semiconductor patterns SP1, SP2 and SP3. The interface layer INL may be directly formed on a top surface of the first active pattern AP1. The interface layer INL may include an oxide layer such as a silicon oxide layer or a silicon oxynitride layer. As an example, the interface layer INL may include a silicon oxide layer.

The first high-k dielectric layer HK1 may be provided on the interface layer INL, and may be in a direct contact with the interface layer INL. The first high-k dielectric layer HK1 may be formed of or include another oxide layer including at least one of hafnium oxide, zirconium oxide, yttrium oxide, or a compound thereof. As an example, the first high-k dielectric layer HK1 may be formed of or include hafnium oxide.

The second high-k dielectric layer HK2 may be directly provided on the first high-k dielectric layer HK1, and may be in a direct contact with the first high-k dielectric layer HK1. The second high-k dielectric layer HK2 may be formed of or include a high-k dielectric material that is different from the first high-k dielectric layer HK1. The second high-k dielectric layer HK2 may include a material of which a band gap is greater than that of the first high-k dielectric layer HK1. The second high-k dielectric layer HK2 may be formed of or include a material having an etch selectivity with respect to the first high-k dielectric layer HK1. The second high-k dielectric layer HK2 may be formed of or include still another oxide layer including at least one of aluminum oxide, magnesium oxide, or a compound thereof. As an example, the second high-k dielectric layer HK2 may be formed of or include aluminum oxide. It is understood here that the above-described gate oxide layers are included in the first gate insulating layer GI1 at least to prevent oxide breakdown of the first gate electrode GE1 in the first region providing the extra gate (EG) device.

The first gate insulating layer GI1 and the first gate electrode GE1 may fill a space between the semiconductor patterns SP1, SP2 and SP3, which are adjacent to each other. A size of the space between the adjacent ones of the semiconductor patterns SP1, SP2 and SP3 on the first region RG1 (i.e., a distance between adjacent ones of the semiconductor patterns SP1, SP2 and SP3 in the third direction D3) may be represented by a first vertical distance VDI1 in the third direction D3. For example, the first vertical distance VDI1 may range from 9 nm to 13 nm.

The first gate insulating layer GI1 may have a first thickness TK1. The first thickness TK1 of the first gate insulating layer GI1 may be equal to a sum of a thickness of the interface layer INL, a thickness of the first high-k dielectric layer HK1, and a thickness of the second high-k dielectric layer HK2. In an embodiment, even if the first gate insulating layer GI1 includes a combination of the first and second high-k dielectric layers HK1 and HK2 in the transistor, which is an EG device, the first gate insulating layer GI1 may have a considerably small thickness. For example, the first thickness TK1 of the first gate insulating layer GI1 may range from 3 nm to 5 nm.

Each of the first to third portions PO1, PO2 and PO3 of the first gate electrode GE1 may fill a remaining portion of the space between the semiconductor patterns SP1, SP2 and SP3 which is not filled with the first gate insulating layer GI1. Each of the first to third portions PO1, PO2 and PO3 of the first gate electrode GE1 may have a second thickness TK2 in the third direction D3. The first vertical distance VDI1 may be given by 2×TK1+TK2. In the case where the first vertical distance VDI1 is a fixed value, the second thickness TK2 may be determined by a value of the first thickness TK1. Since the first gate insulating layer GI1 according to the present embodiment has a relatively small thickness, it may be possible to secure the second thickness TK2 of 2 nm to 6 nm.

According to the present embodiment, in the case where the second thickness TK2 is a sufficient thickness, the first to third portions PO1, PO2 and PO3 of the first gate electrode GE1 may stably fill spaces between adjacent ones of the semiconductor patterns SP1, SP2 and SP3. For a conventional EG device, since the first gate insulating layer GI1 necessarily includes a relatively thick EG oxide layer, the first gate insulating layer GI1 may inevitably have a thick thickness of 5 nm or greater. That is, under a given value of the first vertical distance VDI1, the first gate electrode GE1 of the EG device may have a difficulty in filling spaces between the semiconductor patterns SP1, SP2 and SP3.

However, in the semiconductor device according to an embodiment, a combination of the first high-k dielectric layer HK1 and the second high-k dielectric layer HK2 may be used as a part of a gate insulating layer, instead of the EG oxide layer, and in this case, it may be possible to realize a good reliability property and a high breakdown voltage, even when a gate insulating layer is thin. In addition, since the first gate insulating layer GI1 has a relatively small thickness, the spaces between the semiconductor patterns SP1, SP2 and SP3 may be stably filled with the first to third portions PO1, PO2 and PO3, respectively, of the first gate electrode GE1.

In the semiconductor device according to the present embodiment, it may be possible to realize a good reliability property and a high breakdown voltage, even when the first gate insulating layer GI1 in the EG device has a reduced thickness. Furthermore, since the thickness of the first gate insulating layer GI1 is reduced, it may be possible to sufficiently secure spaces for the first to third portions PO1, PO2 and PO3 of the first gate electrode GE1. The first to third portions PO1, PO2 and PO3 of the first gate electrode GE1 may be formed of the first metal pattern (i.e., the work-function metal) described above, and this use of the work-function metal may make it possible to easily adjust a threshold voltage of the EG device. As a result, it may be possible to improve electric characteristics of the semiconductor device.

Figure 4:
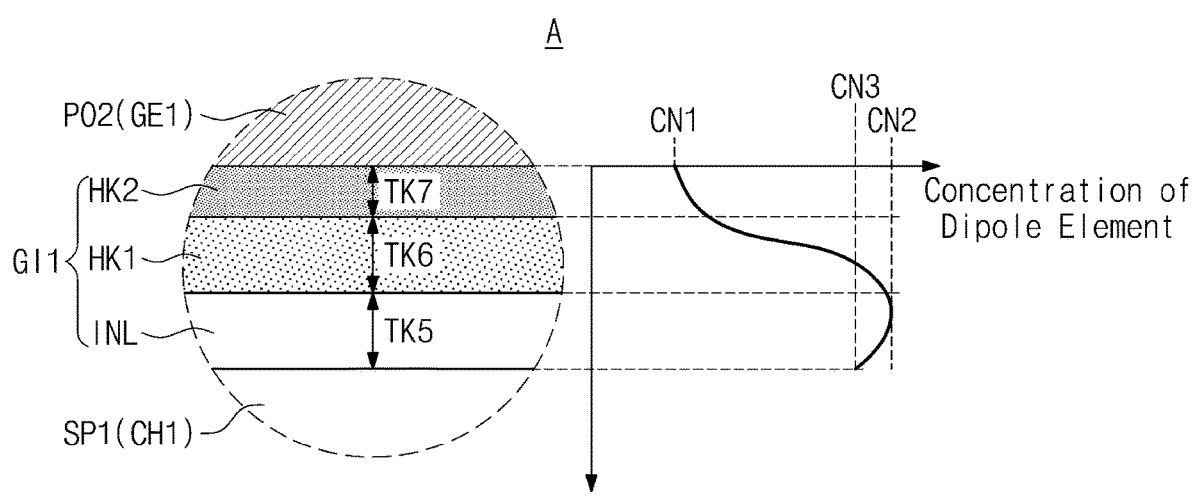
FIG. 4 is an enlarged sectional view illustrating a portion 'A' of FIG. 3A.
Figure 5:
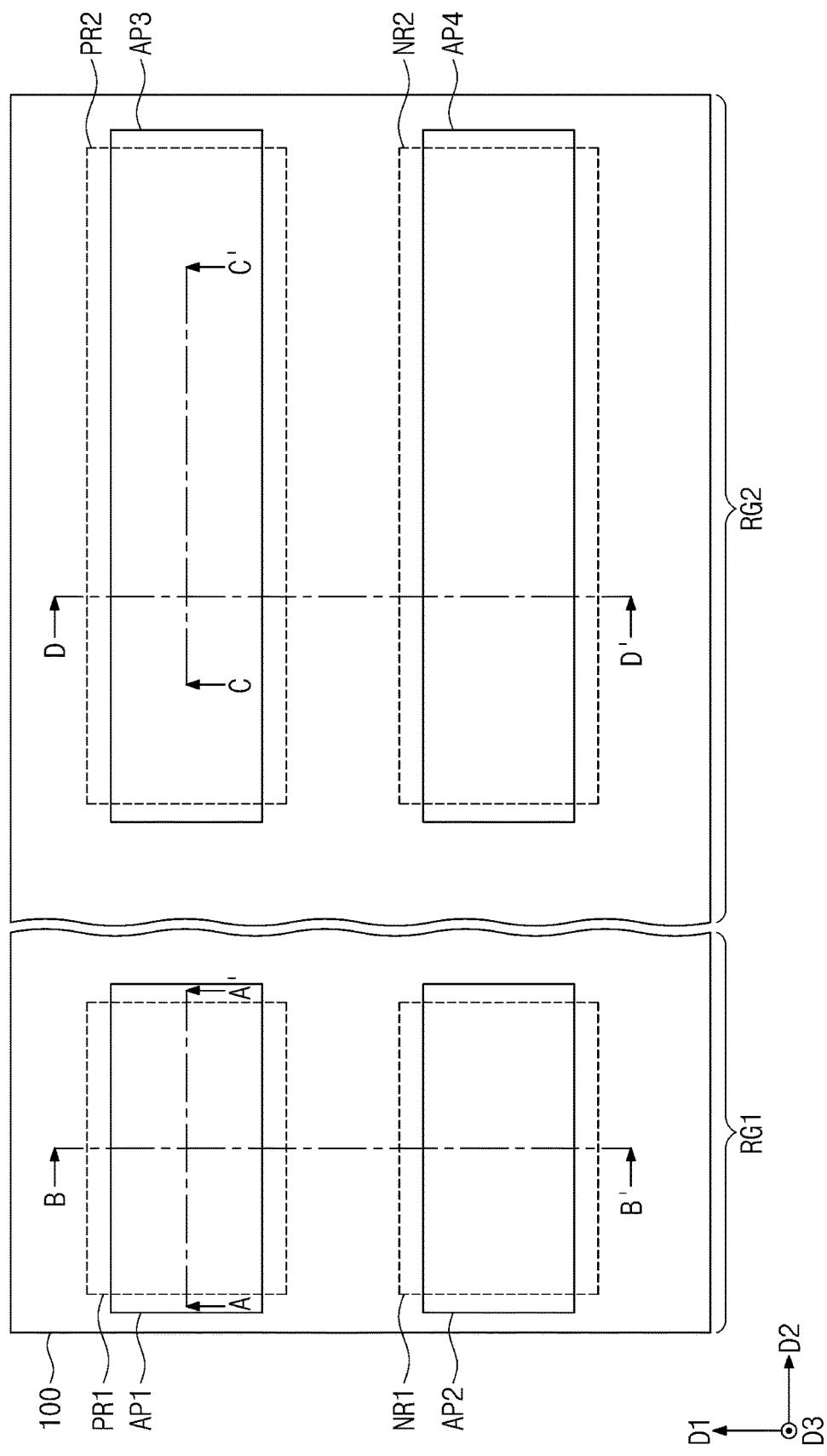
FIGS. 5, 7, 9, 11, and 13 are plan views illustrating a method of fabricating a semiconductor device, according to an embodiment.
Figure 6A:
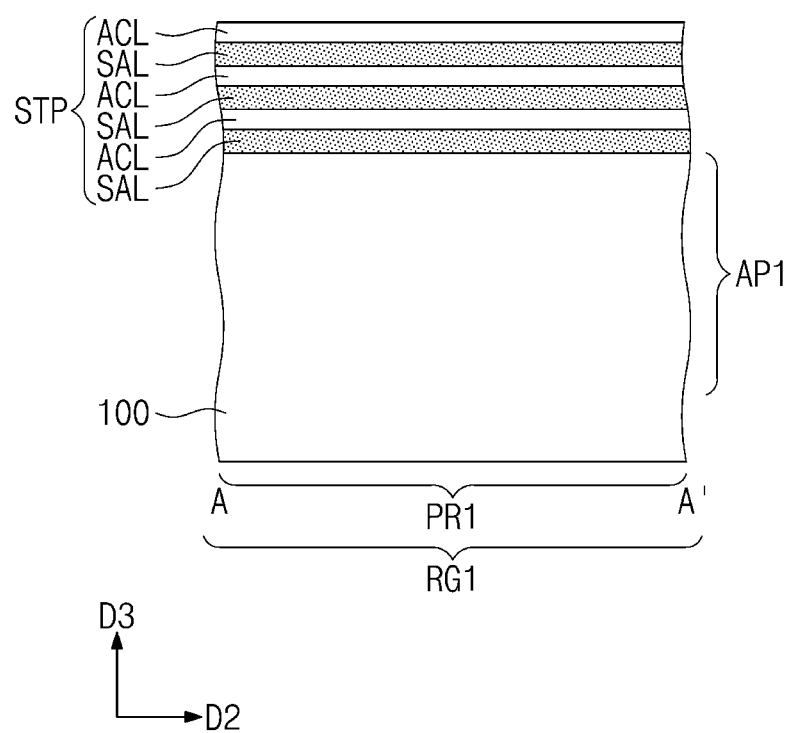
FIGS. 6A, 8A, 10A, 12A, and 14A are sectional views taken along lines A-A' of FIGS. 5, 7, 9, 11, and 13, respectively.
Figure 6B:
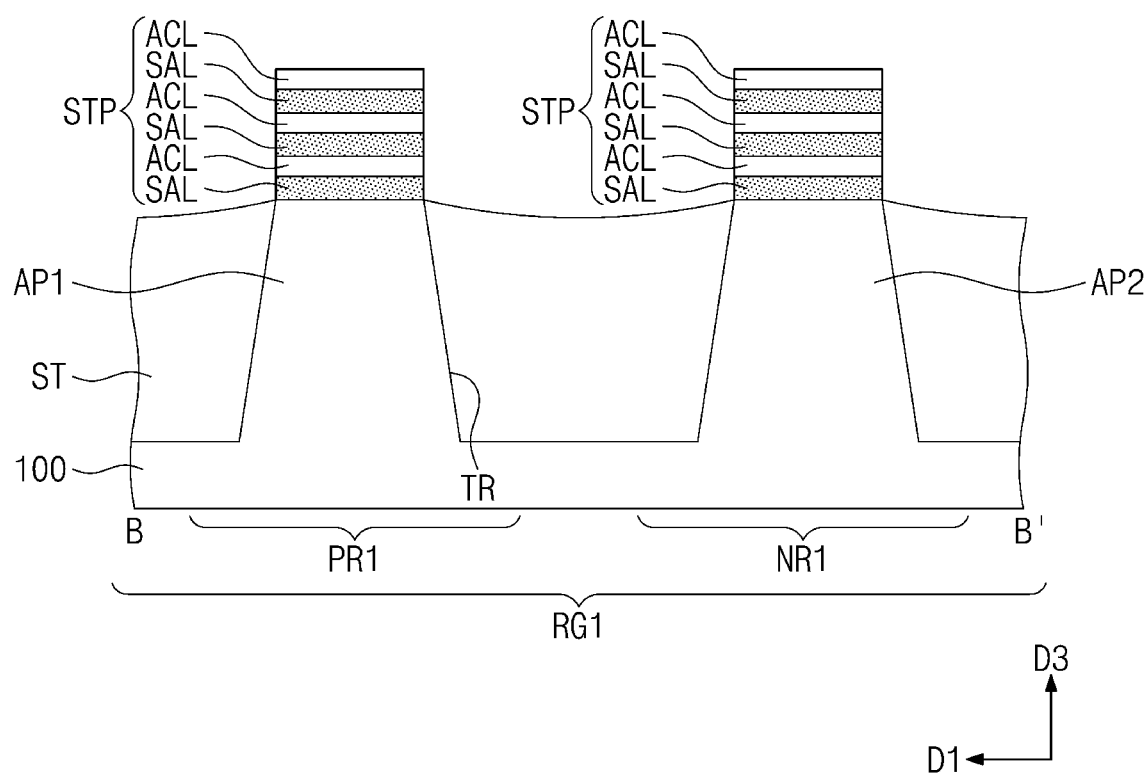
FIGS. 6B, 8B, 10B, 12B, and 14B are sectional views taken along lines B-B' of FIGS. 5, 7, 9, 11, and 13, respectively.
Figure 6C:
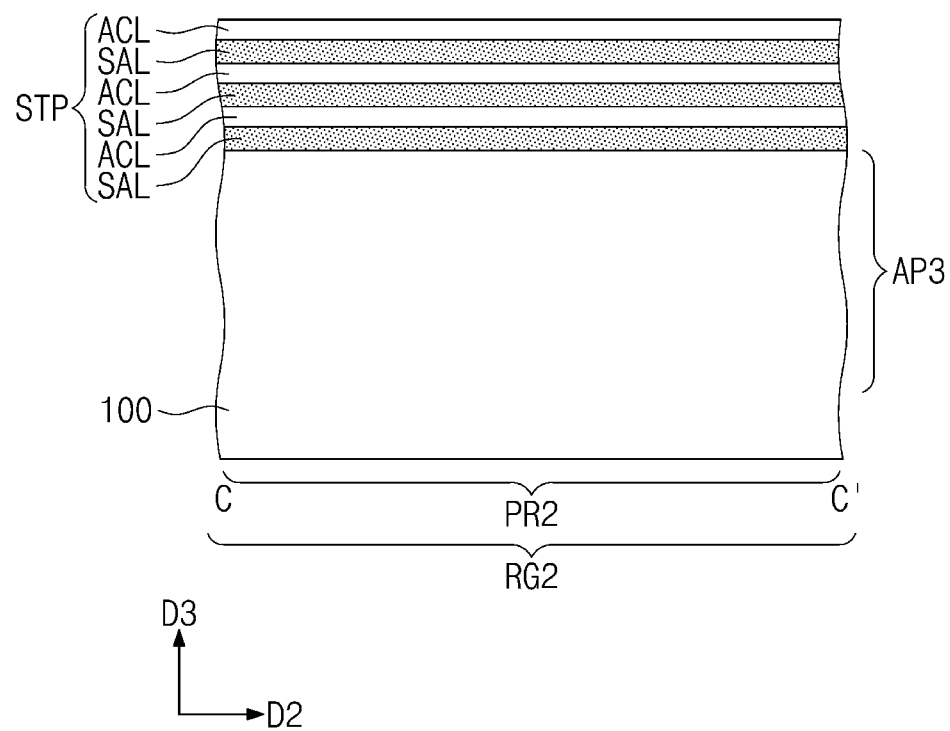
FIGS. 6C, 8C, 10C, 12C, and 14C are sectional views taken along lines C-C' of FIGS. 5, 7, 9, 11, and 13, respectively.
Figure 6D:
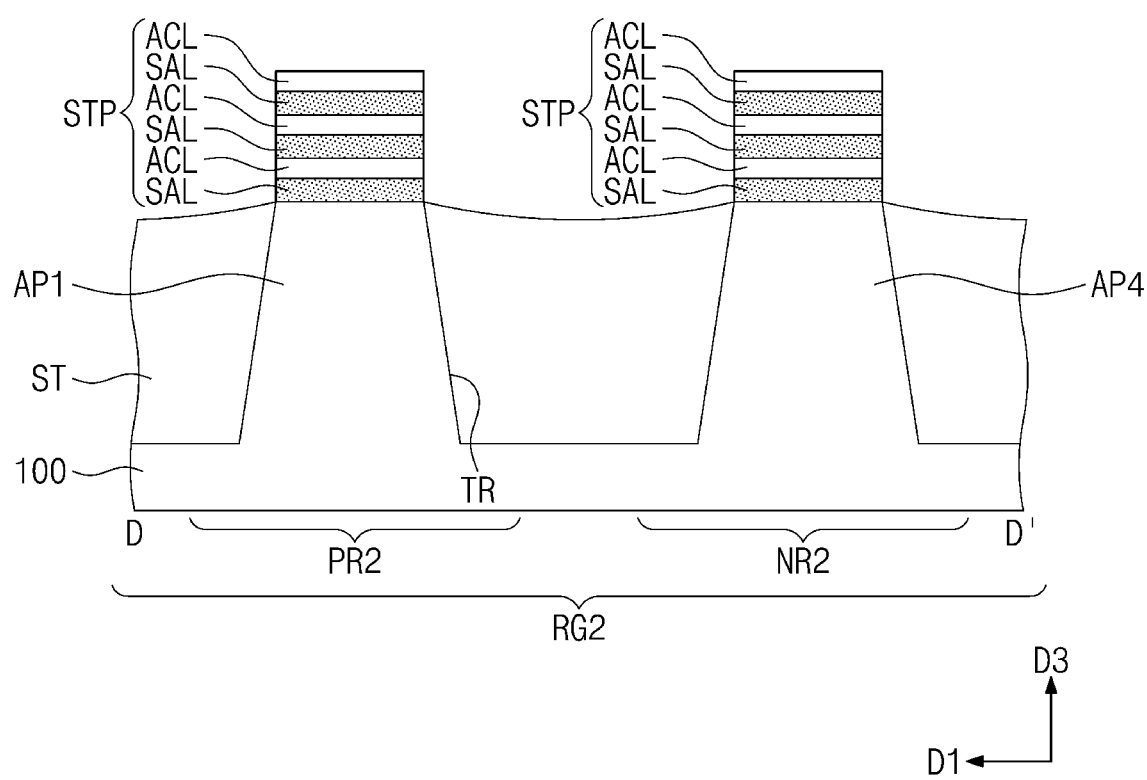
FIGS. 6D, 8D, 10D, 12D, and 14D are sectional views taken along lines D-D' of FIGS. 5, 7, 9, 11, and 13, respectively.
Figure 7:
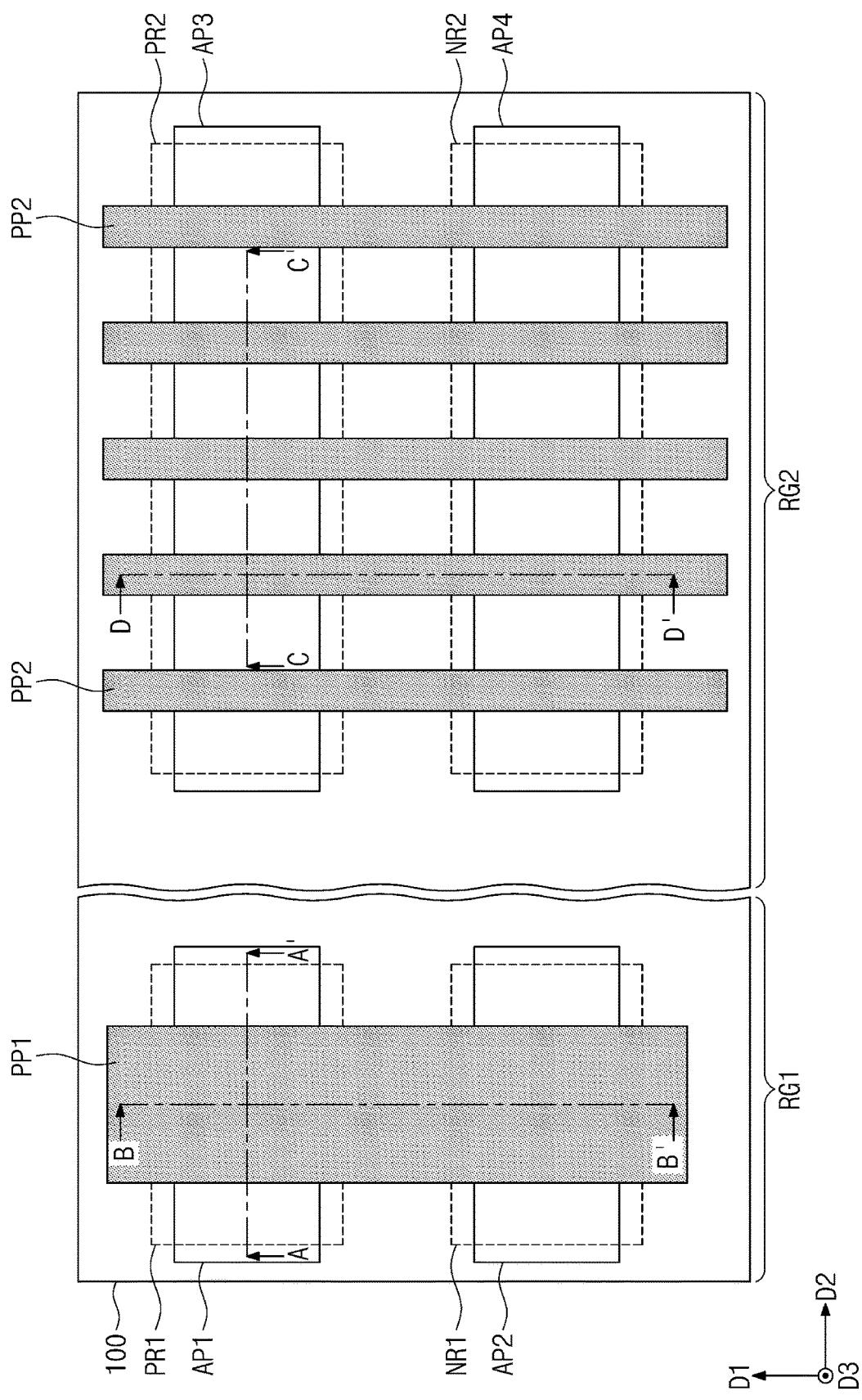
Figure 8A:
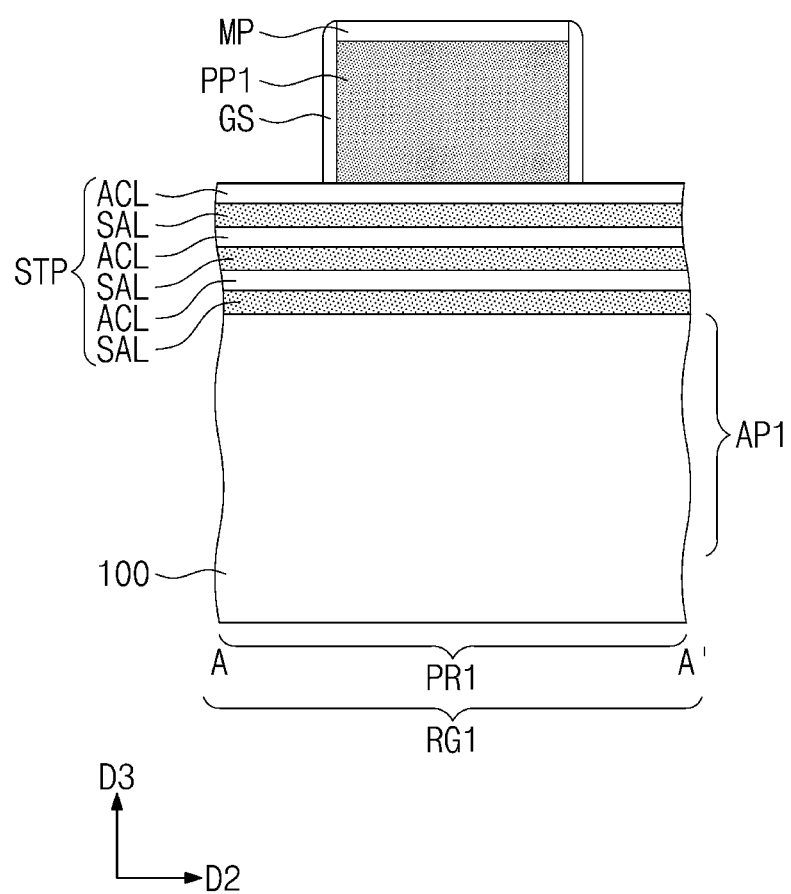
Figure 8B:
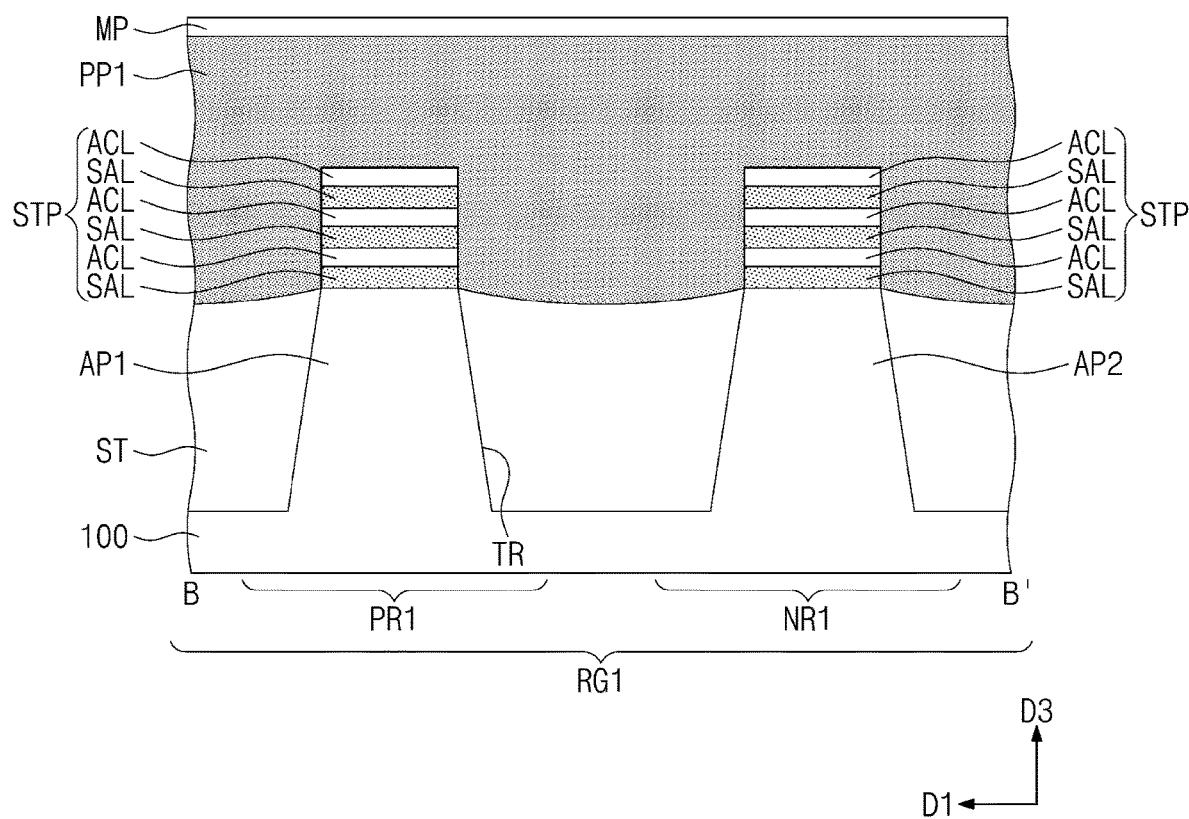
Figure 8C:
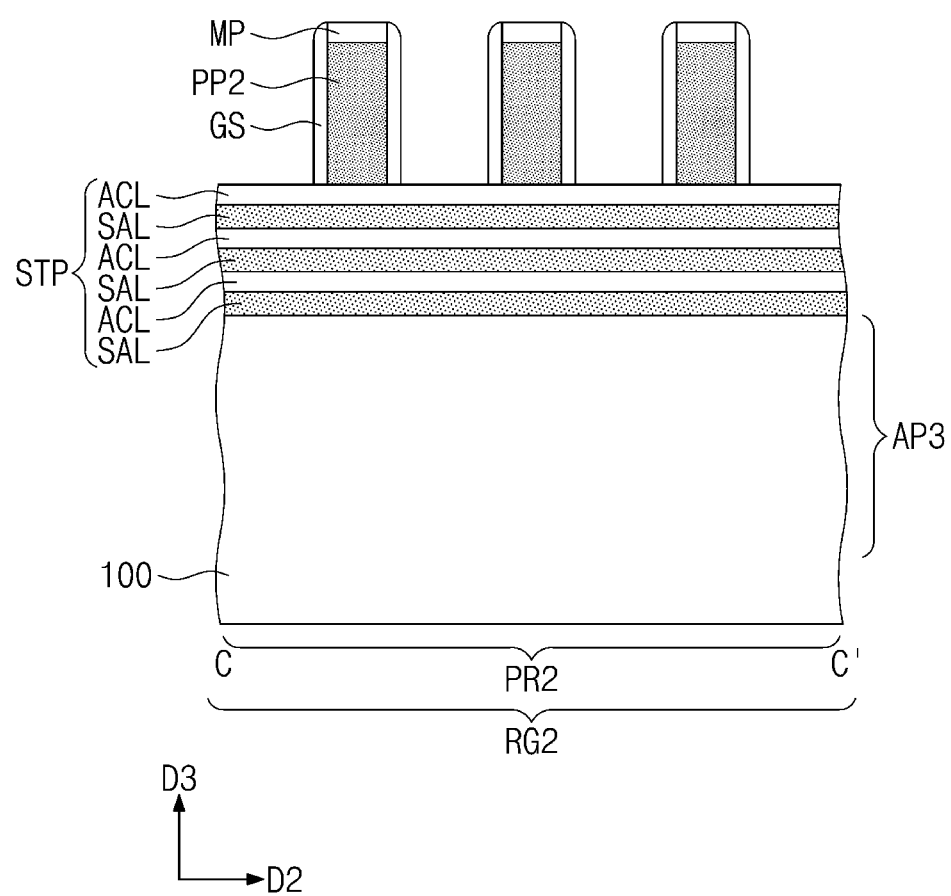
Figure 8D:
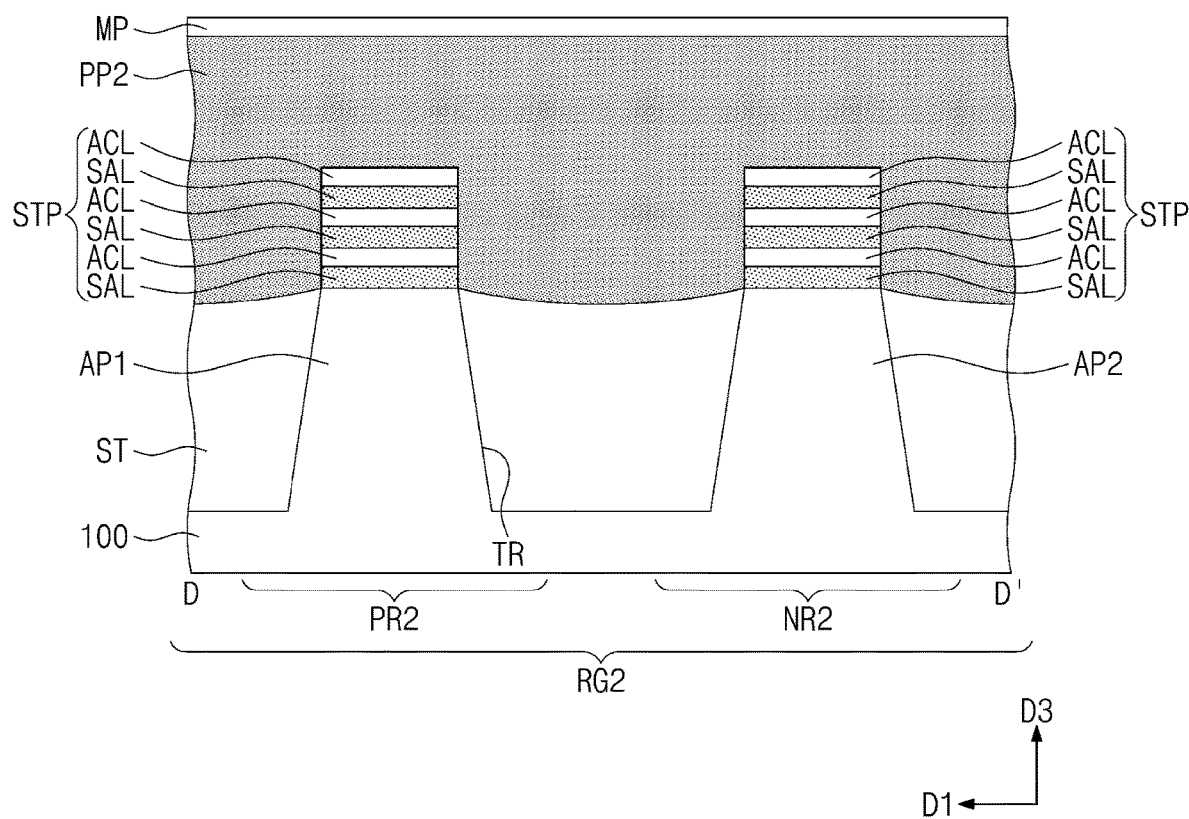
Figure 9:
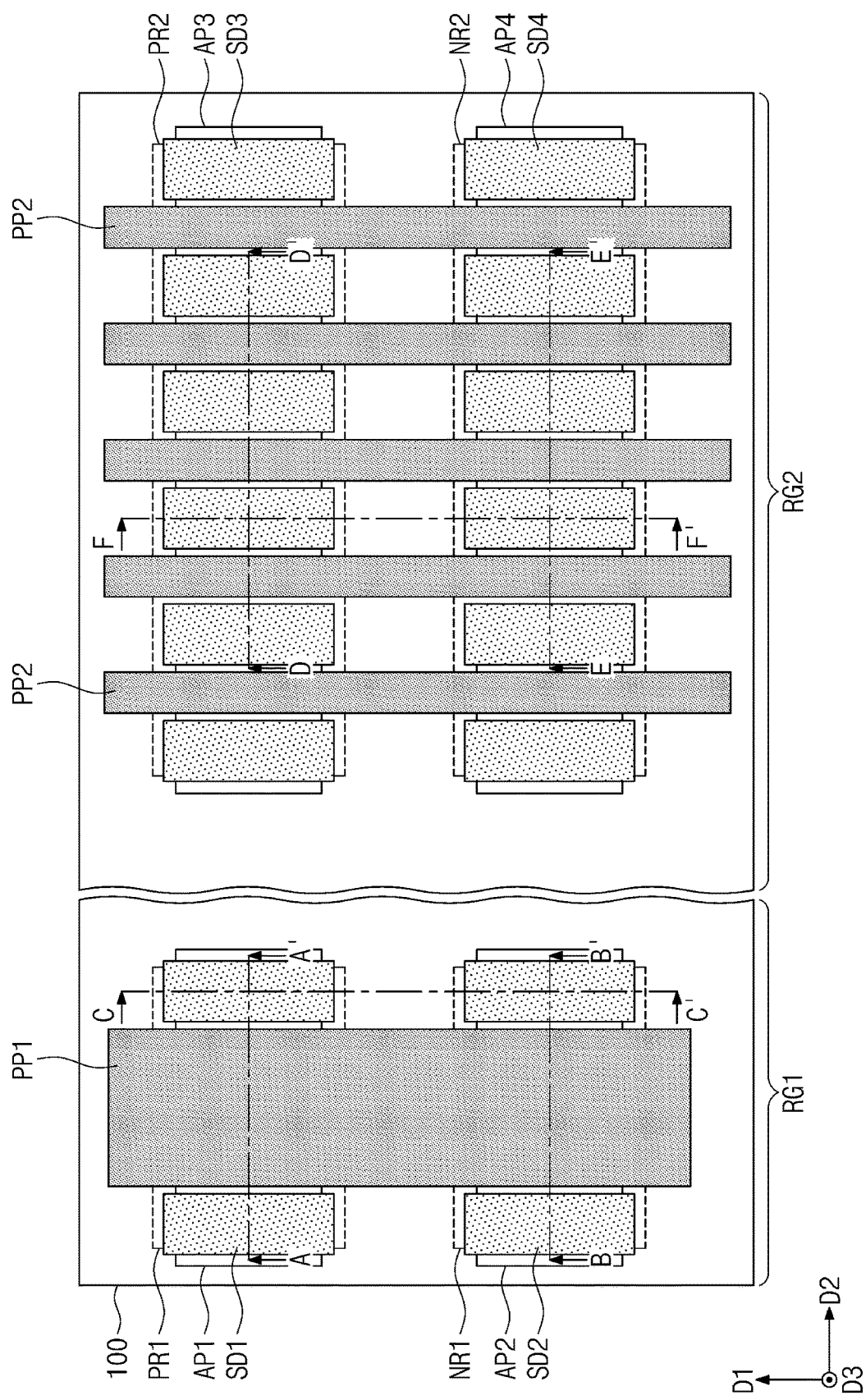

FIG. 4 is an enlarged sectional view illustrating a portion 'A' of FIG. 3A. Referring to FIG. 4, the first gate insulating layer GI1 may include a dipole element. The dipole element may include lanthanum (La), aluminum (Al), or a combination thereof. In other words, the first gate insulating layer GI1 may contain lanthanum (La), aluminum (Al), or a combination thereof, which is used as an impurity. In an embodiment, the first gate insulating layer GI1 may contain lanthanum (La), which is used as the dipole element.

The first gate insulating layer GI1 may include a dipole-interface, which is formed near the first high-k dielectric layer HK1 or the interface layer INL by the dipole element. In the case where the first gate insulating layer GI1 contains lanthanum (La), it may be possible to reduce an effective work function of the first gate electrode GE1. For example, the dipole element (La) may lead to an increase in a threshold voltage of a PMOS transistor. For example, the dipole element (La) may lead to a reduction in a threshold voltage of an NMOS transistor.

FIG. 4 illustrates a doping profile of the dipole element in the first gate insulating layer GI1. A concentration of the dipole element may be increased from an interface between the first gate electrode GE1 and the second high-k dielectric layer HK2 to the interface layer INL until it reaches its highest value in the interface layer INL, and then, may be decreased from the interface layer INL to an interface between the interface layer INL and the first semiconductor pattern SP1. In other words, the concentration of the dipole element in the interface layer INL may be higher than the concentration of the dipole element in the first high-k dielectric layer HK1, and the concentration of the dipole element in the first high-k dielectric layer HK1 may be higher than the concentration of the dipole element in the second high-k dielectric layer HK2.

At the interface between the first gate electrode GE1 and the second high-k dielectric layer HK2, a concentration of the dipole element may be a first concentration CN1. A concentration of the dipole element in the interface layer INL may be a second concentration CN2. At the interface between the interface layer INL and the first semiconductor pattern SP1, a concentration of the dipole element may be a third concentration CN3. The second concentration CN2 may be the highest value of the concentration of the dipole element in the first gate insulating layer GI1. The third concentration CN3 may be higher than the first concentration CN1.

A fifth thickness TK5 of the interface layer INL may range from 1.0 nm to 2.5 nm. A sixth thickness TK6 of the first high-k dielectric layer HK1 may range from 0.5 nm to 1.5 nm. A seventh thickness TK7 of the second high-k dielectric layer HK2 may range from 0.5 nm to 1.0 nm. The fifth thickness TK5, the sixth thickness TK6, and the seventh thickness TK7 may be chosen such that the first thickness TK1 is within a range of 3 nm to 5 nm. In an embodiment, the fifth thickness TK5 may be equal to or greater or smaller than the sixth thickness TK6. The seventh thickness TK7 may be smaller than the fifth thickness TK5 and may be smaller than the sixth thickness TK6.

Since the first gate insulating layer GI1 according to the present embodiment further includes the dipole element, it may be possible to more easily adjust a threshold voltage of the EG device. As a result, electric characteristics of a semiconductor device may be improved.

Figure 3C:
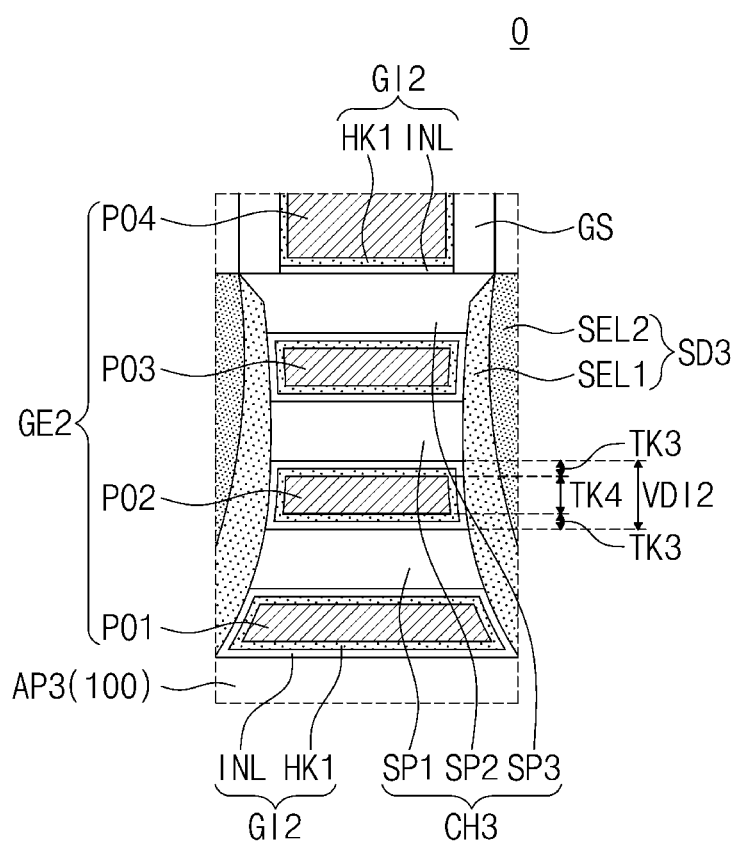
FIG. 3C is an enlarged sectional view illustrating a portion 'O' of FIG. 2E.

Hereinafter, the third channel pattern CH3 and the second gate insulating layer GI2 on the second region RG2 will be described in more detail below. FIG. 3C is an enlarged sectional view illustrating a portion 'O' of FIG. 2E, and FIG. 3D is an enlarged sectional view illustrating a portion 'P' of FIG. 2G.

Figure 3D:
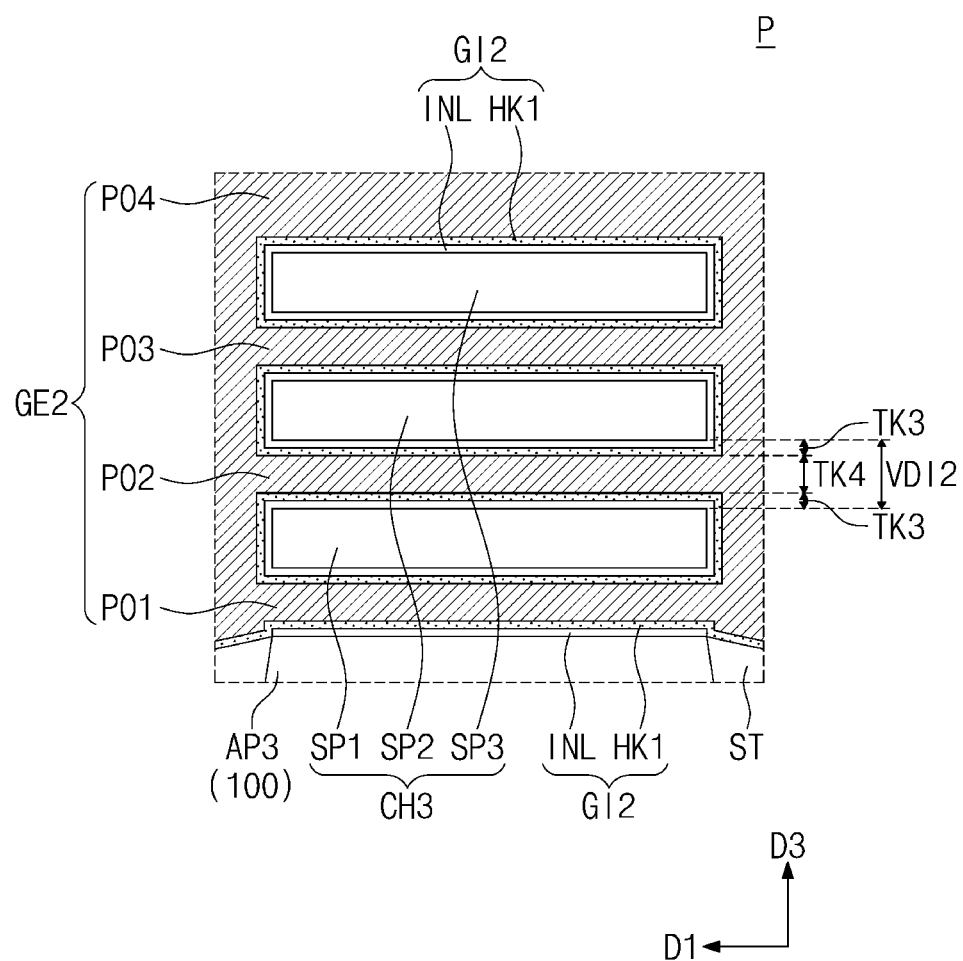
FIG. 3D is an enlarged sectional view illustrating a portion 'P' of FIG. 2G.

Referring to FIGS. 3C and 3D, the second gate insulating layer GI2 may enclose each of the first to third semiconductor patterns SP1, SP2 and SP3 of the third channel pattern CH3. The second gate insulating layer GI2 may include an interface layer INL and a first high-k dielectric layer HK1, which are sequentially stacked on each of the first to third semiconductor patterns SP1, SP2 and SP3. A second high-k dielectric layer HK2 such as the second high-k dielectric layer HK2 in the first gate insulating layer GI1 may not be included in the second gate insulating layer GI2. The interface layer INL and the first high-k dielectric layer HK1 in the second gate insulating layer GI2 may be respectively configured to have substantially the same features as the interface layer INL and the first high-k dielectric layer HK1 in the first gate insulating layer GI1 described above.

The second gate insulating layer GI2 and the second gate electrode GE2 may fill a space between the semiconductor patterns SP1, SP2 and SP3, which are adjacent to each other. A size of the space between the adjacent ones of the semiconductor patterns SP1, SP2 and SP3 on the second region RG2 (i.e., a distance between the adjacent ones of the semiconductor patterns SP1, SP2 and SP3 in the third direction D3) may be represented by a second vertical distance VDI2 in the third direction D3. For example, the second vertical distance VDI2 may range from 9 nm to 13 nm. The second vertical distance VDI2 may be substantially equal to the first vertical distance VDI1 described above.

The second gate insulating layer GI2 may have a third thickness TK3. The third thickness TK3 of the second gate insulating layer GI2 may be equal to a sum of the thickness of the interface layer INL and the thickness of the first high-k dielectric layer HK1. Since the second high-k dielectric layer HK2 is not included in the second gate insulating layer GI2, the third thickness TK3 may be smaller than the first thickness TK1 described above. For example, the third thickness TK3 may range from 2 nm to 4 nm.

Each of the first to third portions PO1, PO2 and PO3 of the second gate electrode GE2 may fill a remaining portion of the space between the semiconductor patterns SP1, SP2 and SP3 which is not filled with the second gate insulating layer GI2. Each of the first to third portions PO1, PO2 and PO3 of the second gate electrode GE2 may have a fourth thickness TK4 in the third direction D3. The second vertical distance VDI2 may be given by 2×TK3+TK4. The fourth thickness TK4 may be greater than the second thickness TK2 described above. For example, the fourth thickness TK4 may range from 4 nm to 8 nm.

The second gate insulating layer GI2 may also include the dipole element described above. The second gate insulating layer GI2 may include a dipole-interface which is formed between the first high-k dielectric layer HK1 and the interface layer INL. A concentration of the dipole element in the second gate insulating layer GI2 may have the highest value in the interface layer INL.

Figure 10A:
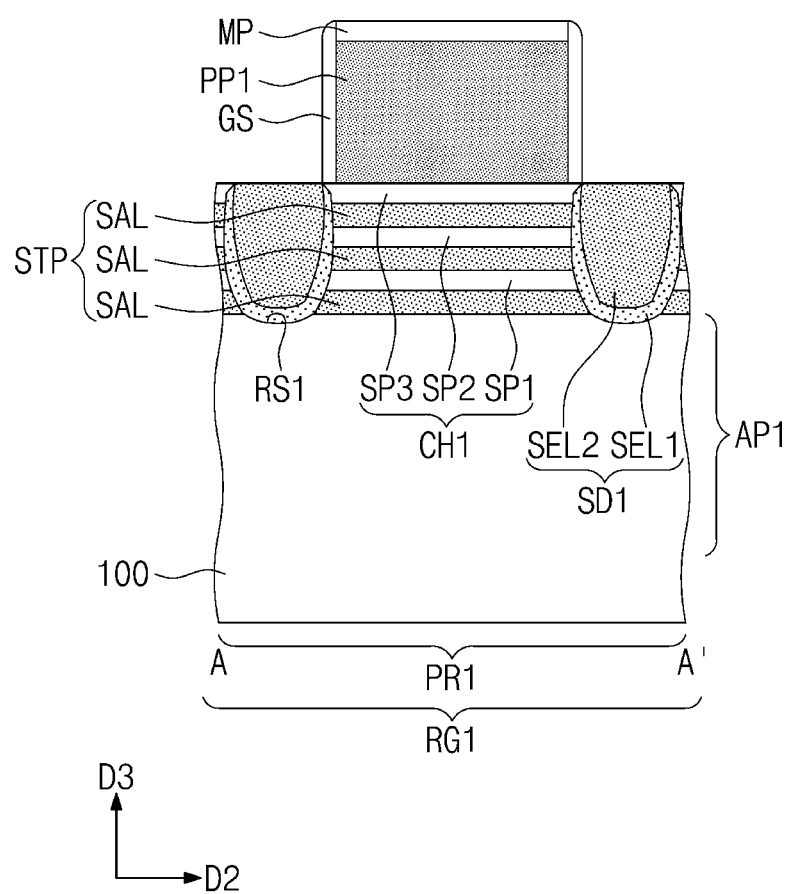
Figure 10B:
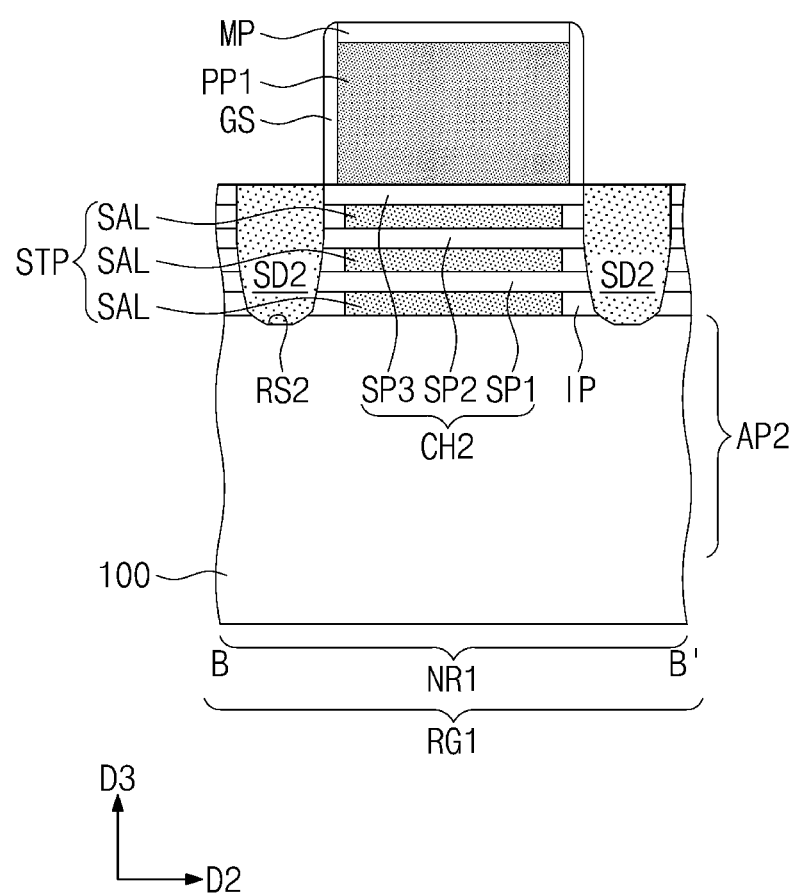
Figure 10C:
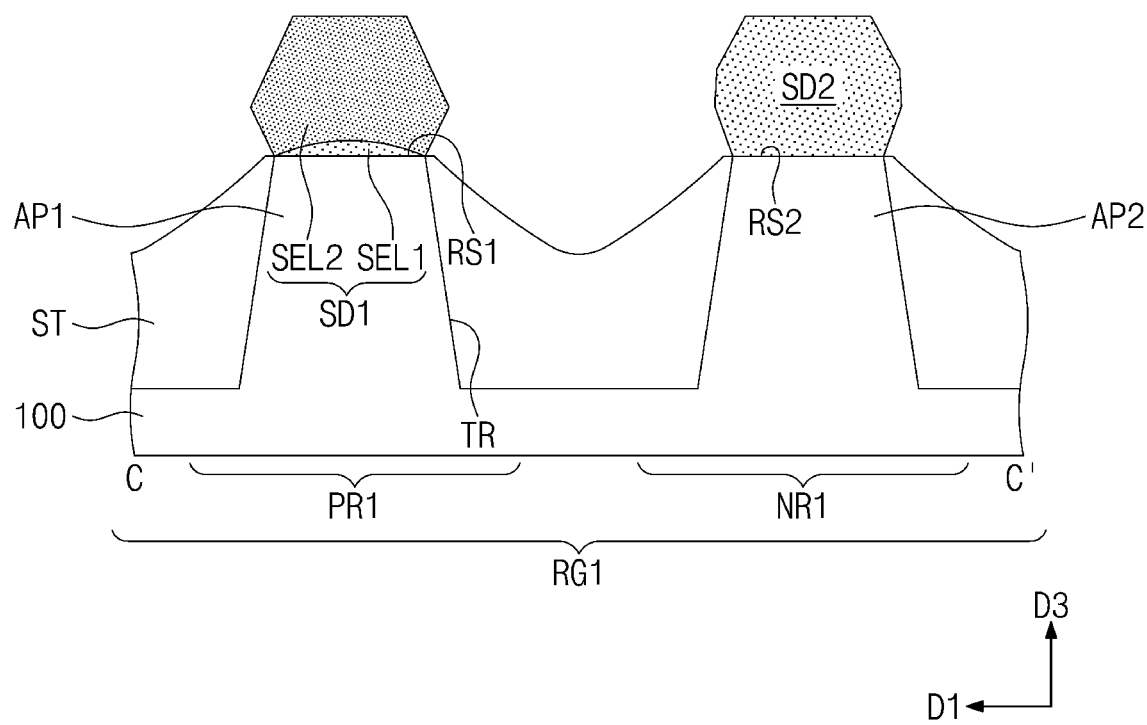
Figure 10D:
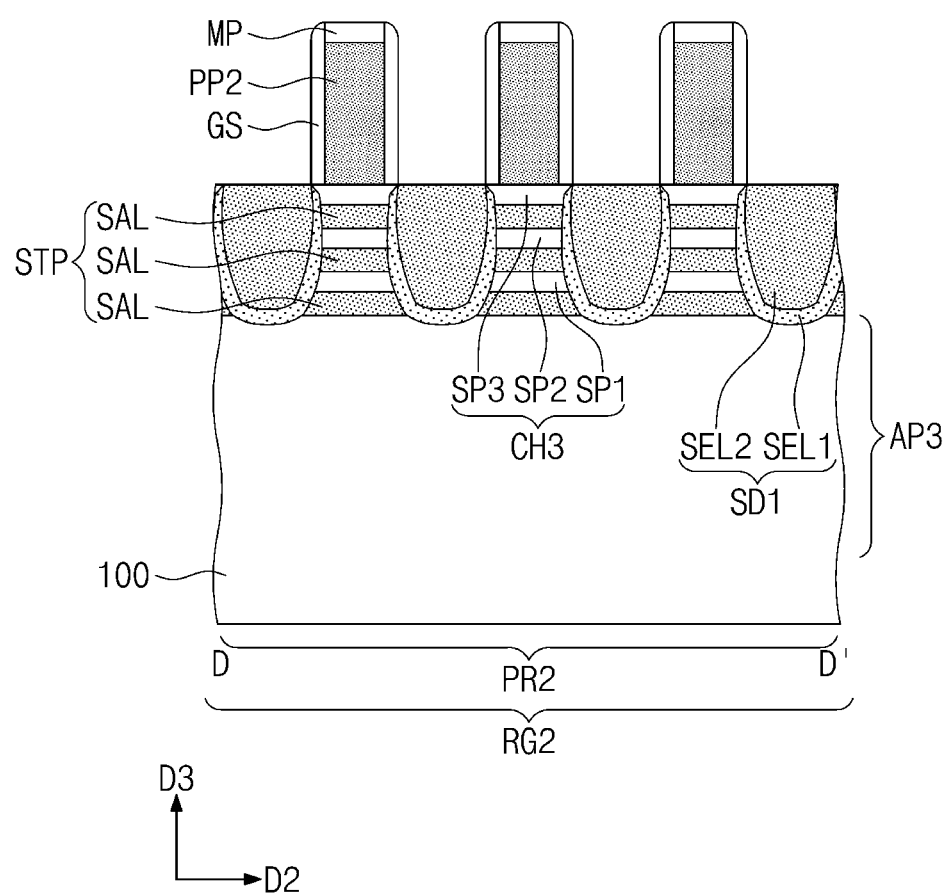
Figure 10E:
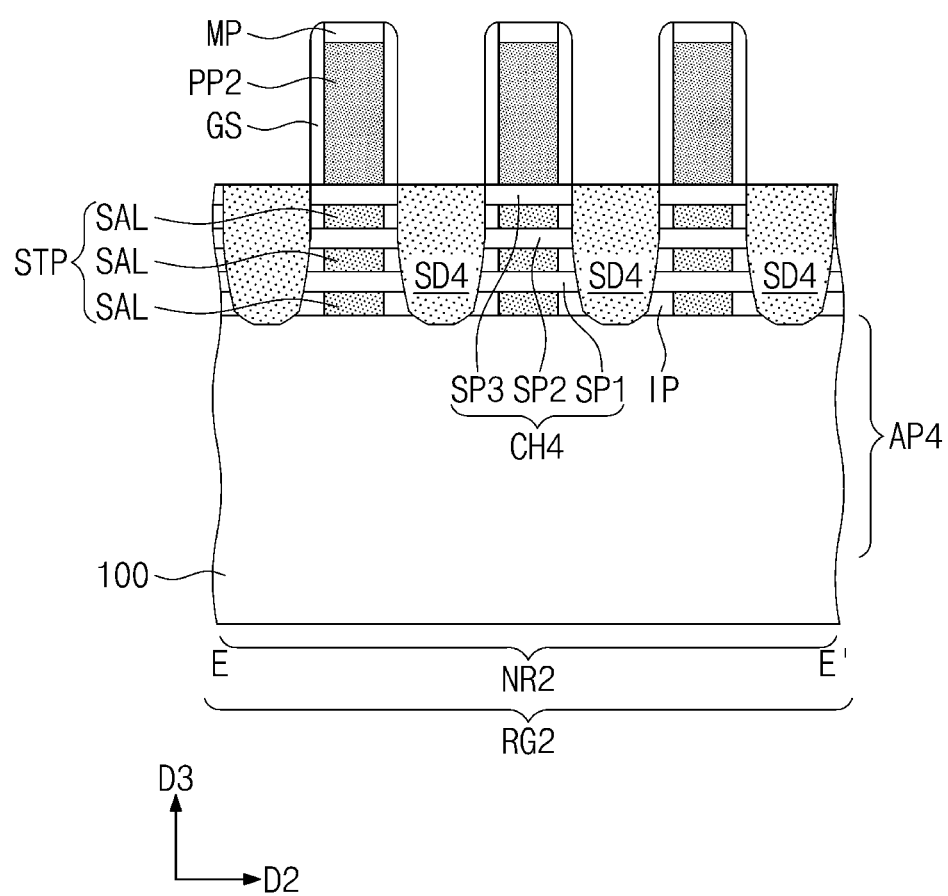
FIGS. 10E, 12E, and 14E are sectional views taken along lines E-E' of FIGS. 9, 11, and 13, respectively.
Figure 10F:
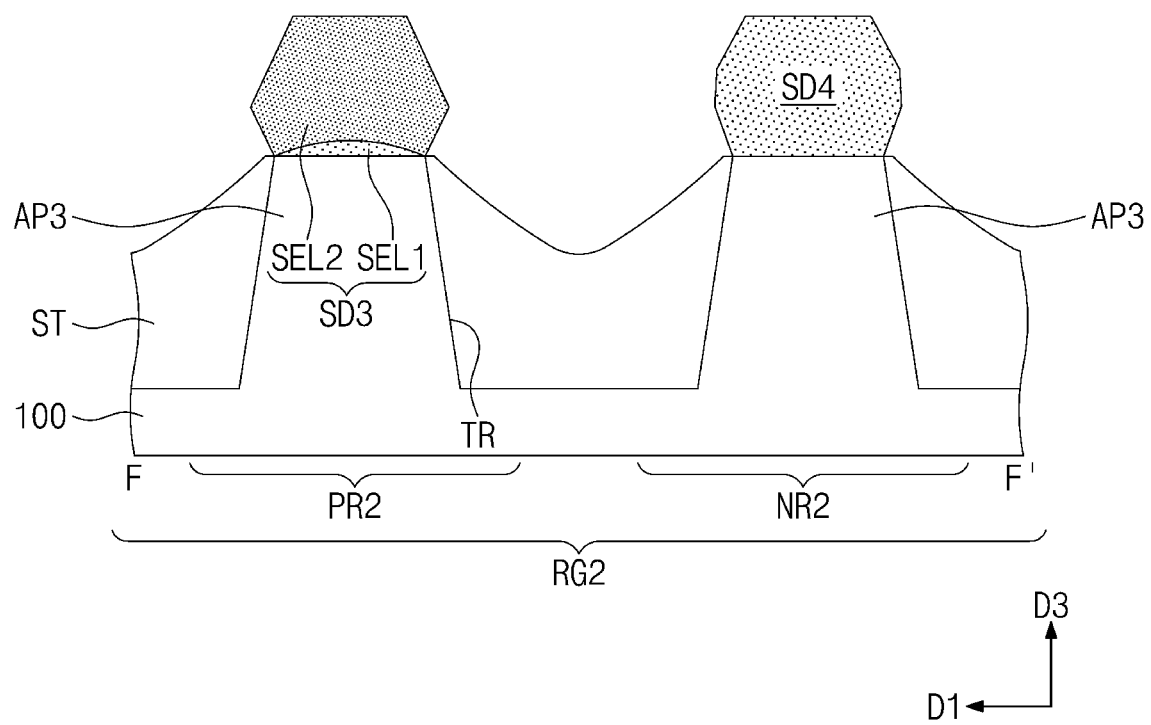
FIGS. 10F, 12F, and 14F are sectional views taken along lines F-F' of FIGS. 9, 11, and 13, respectively.
Figure 11:
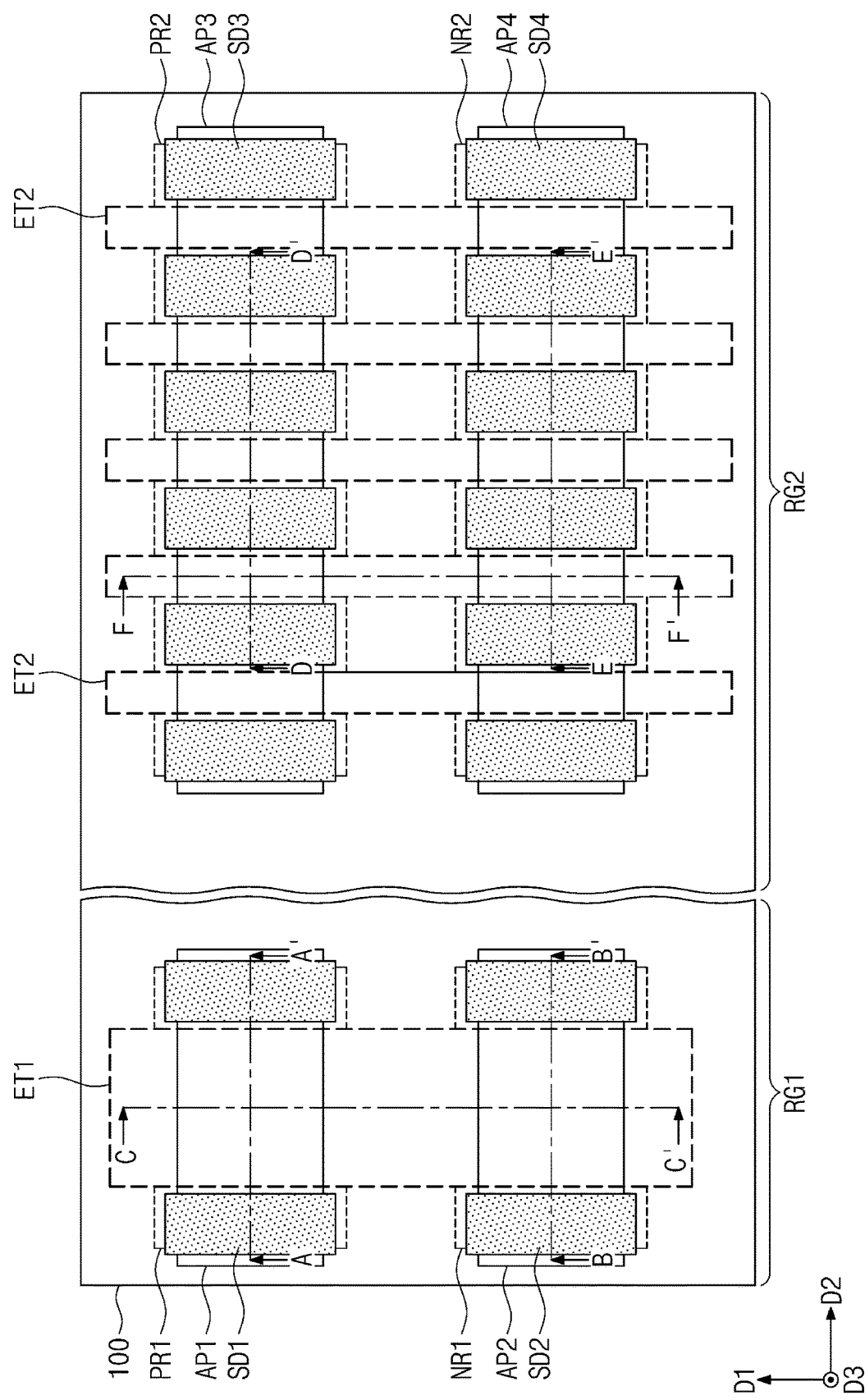
Figure 12A:
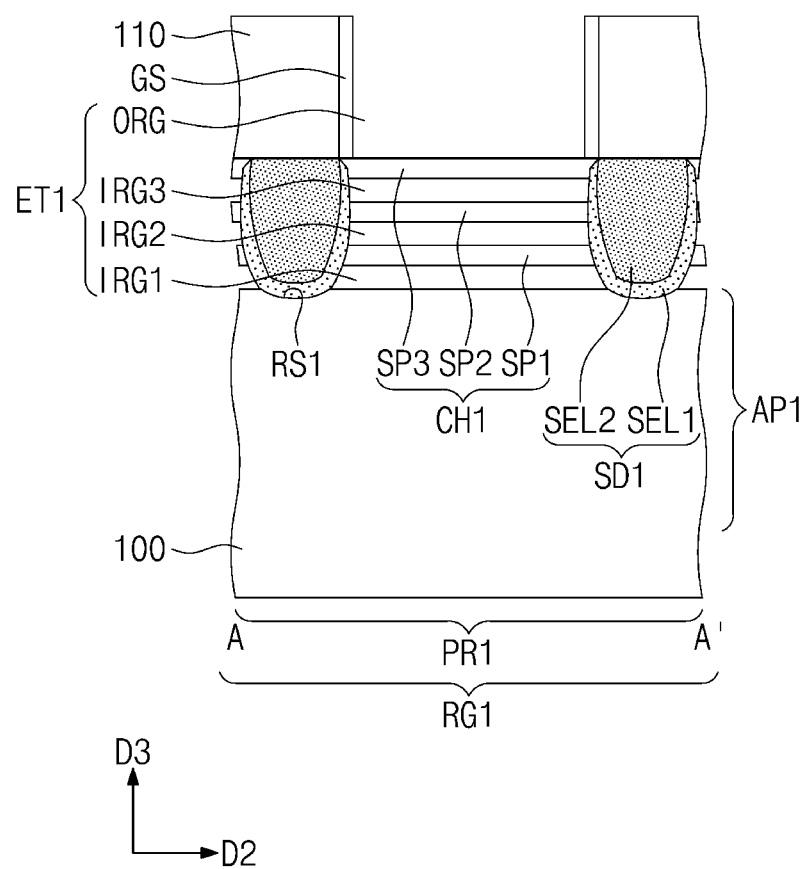
Figure 12B:
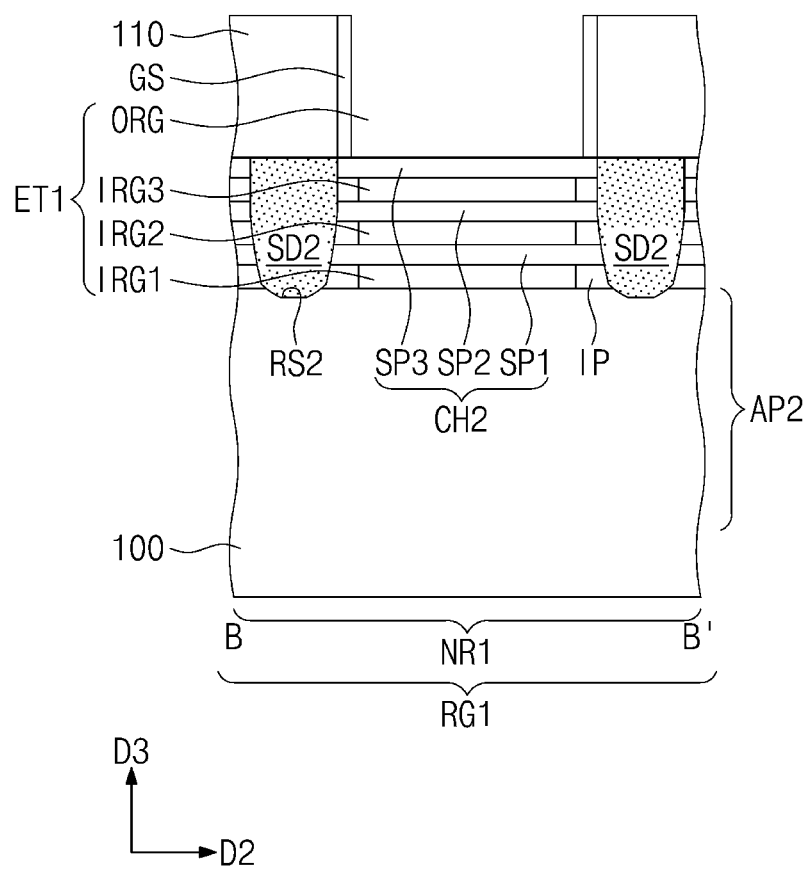
Figure 12C:
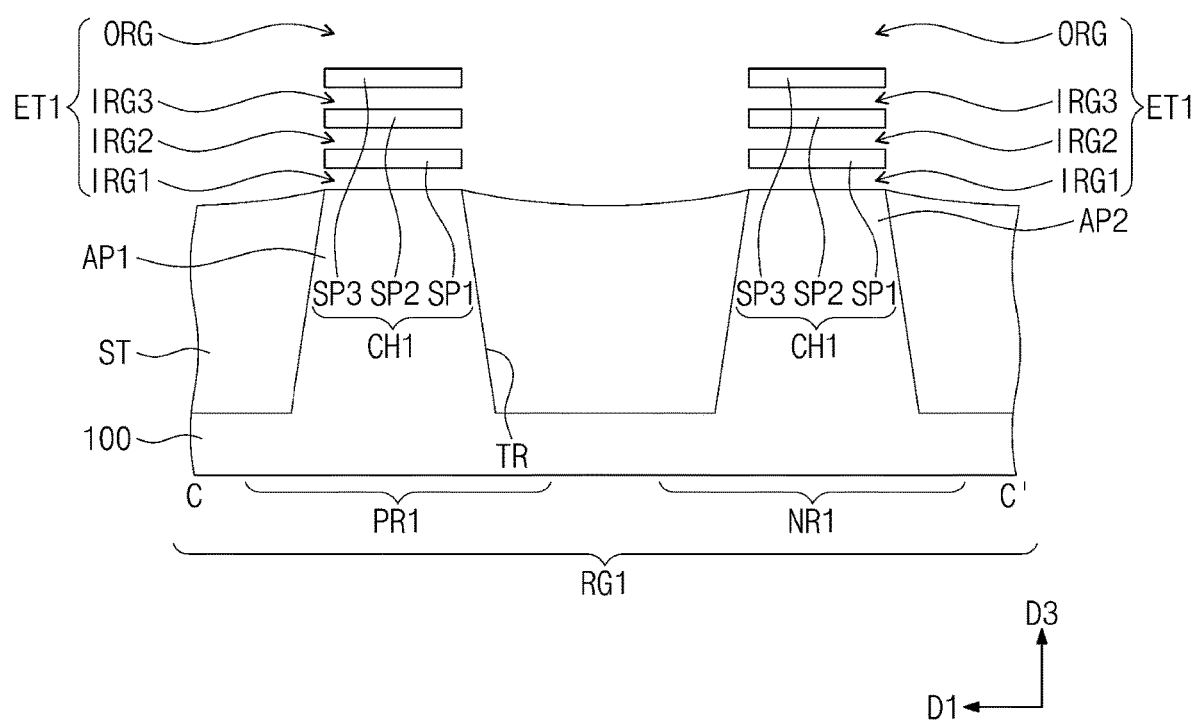
Figure 12D:
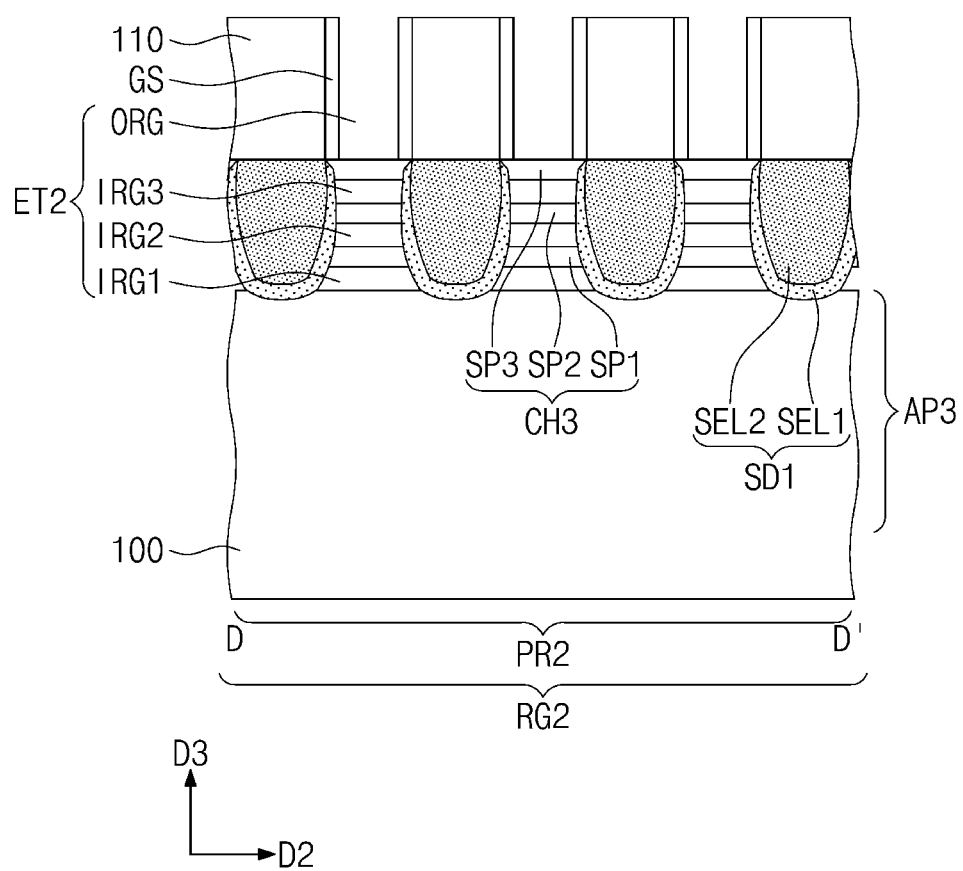
Figure 12E:
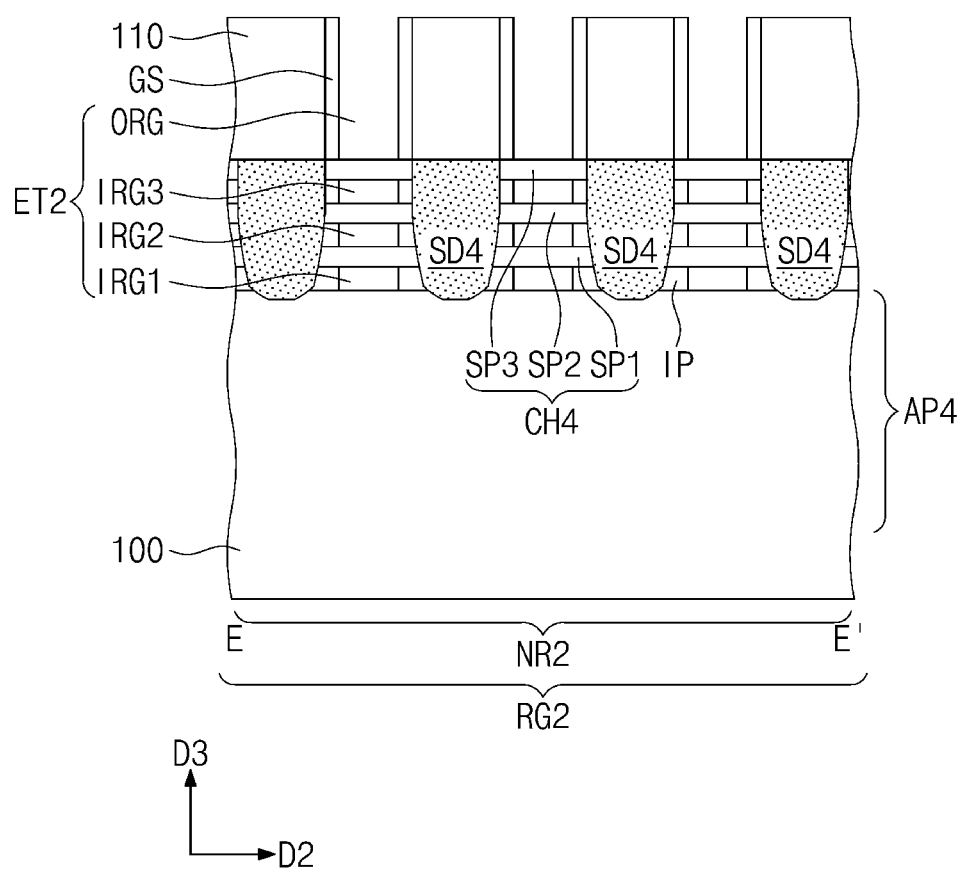
Figure 12F:
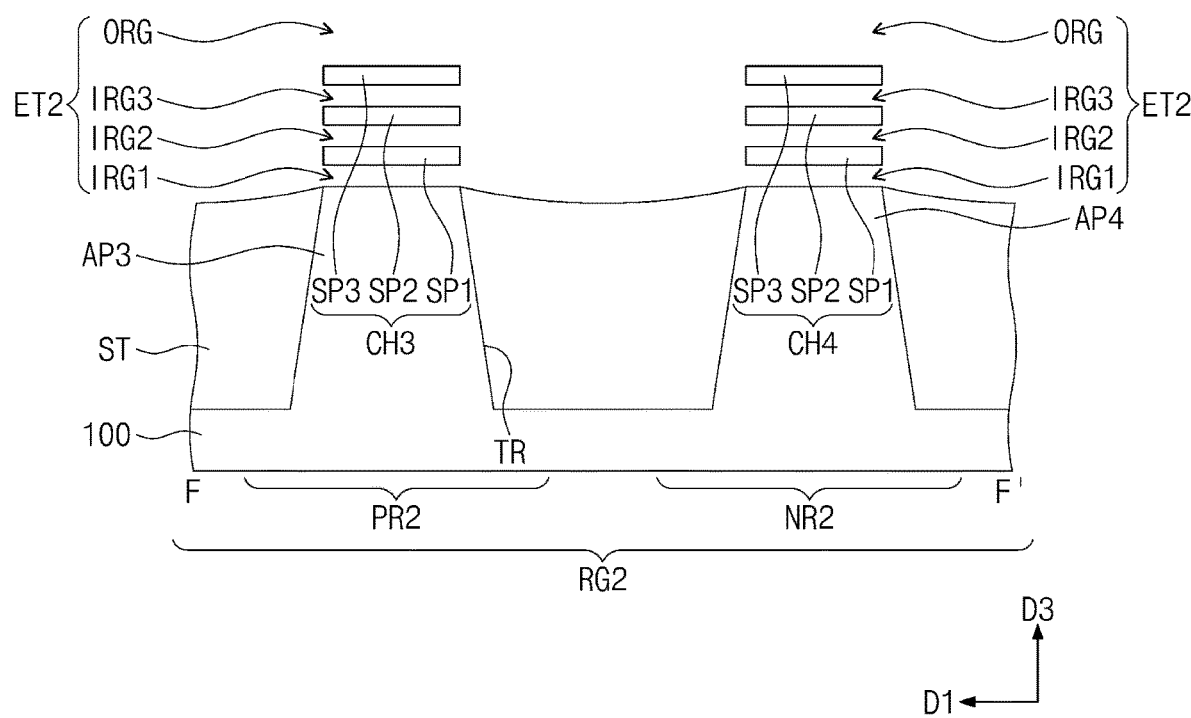
Figure 13:
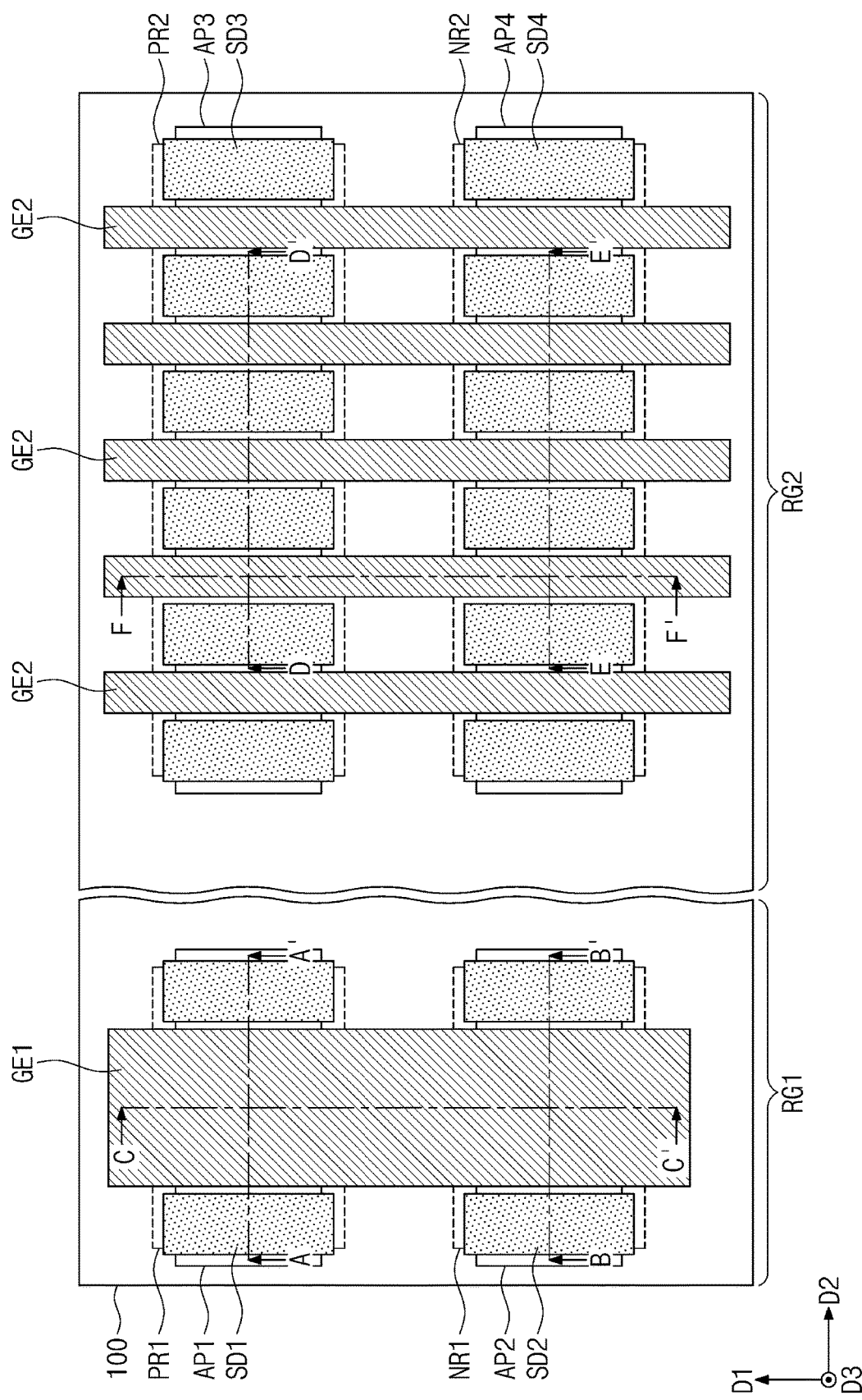
Figure 14A:
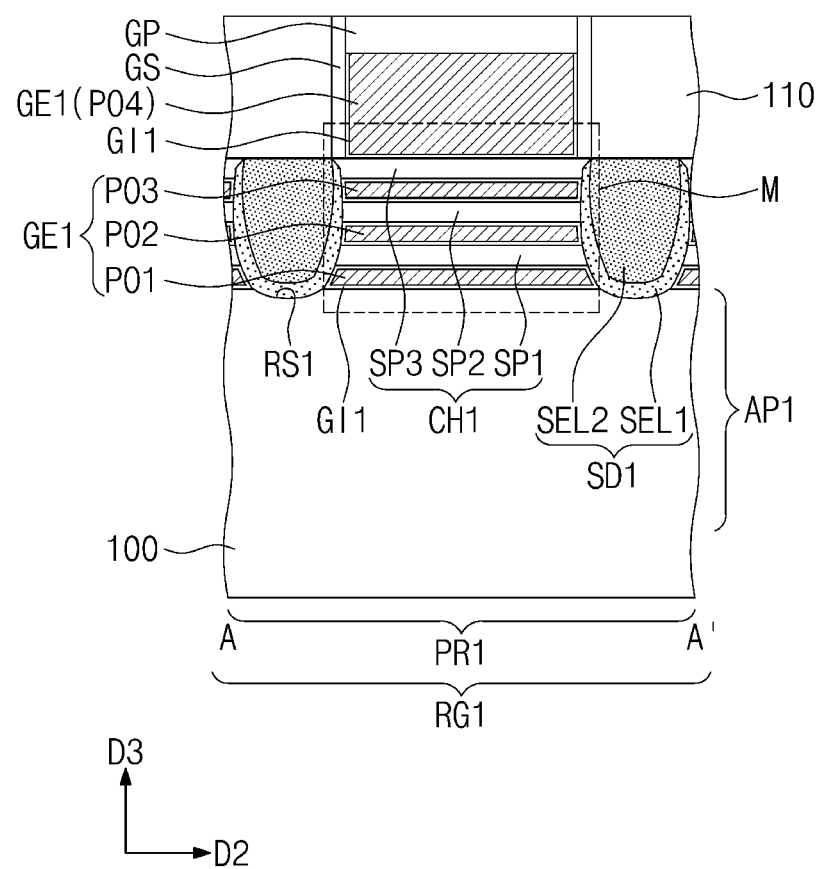
Figure 14B:
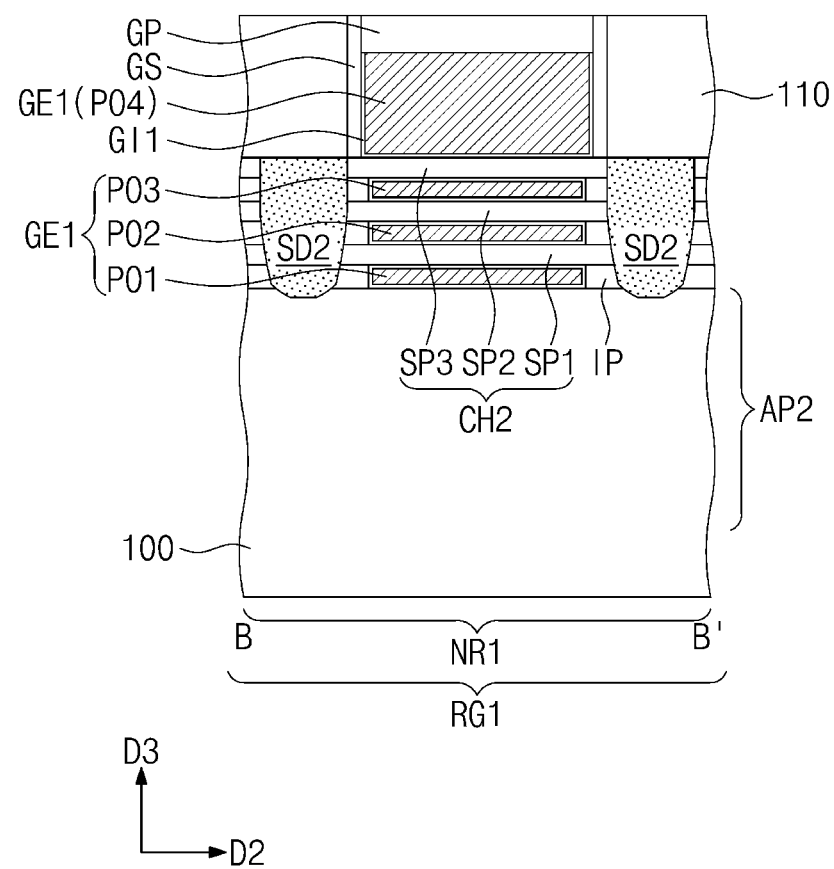
Figure 14C:
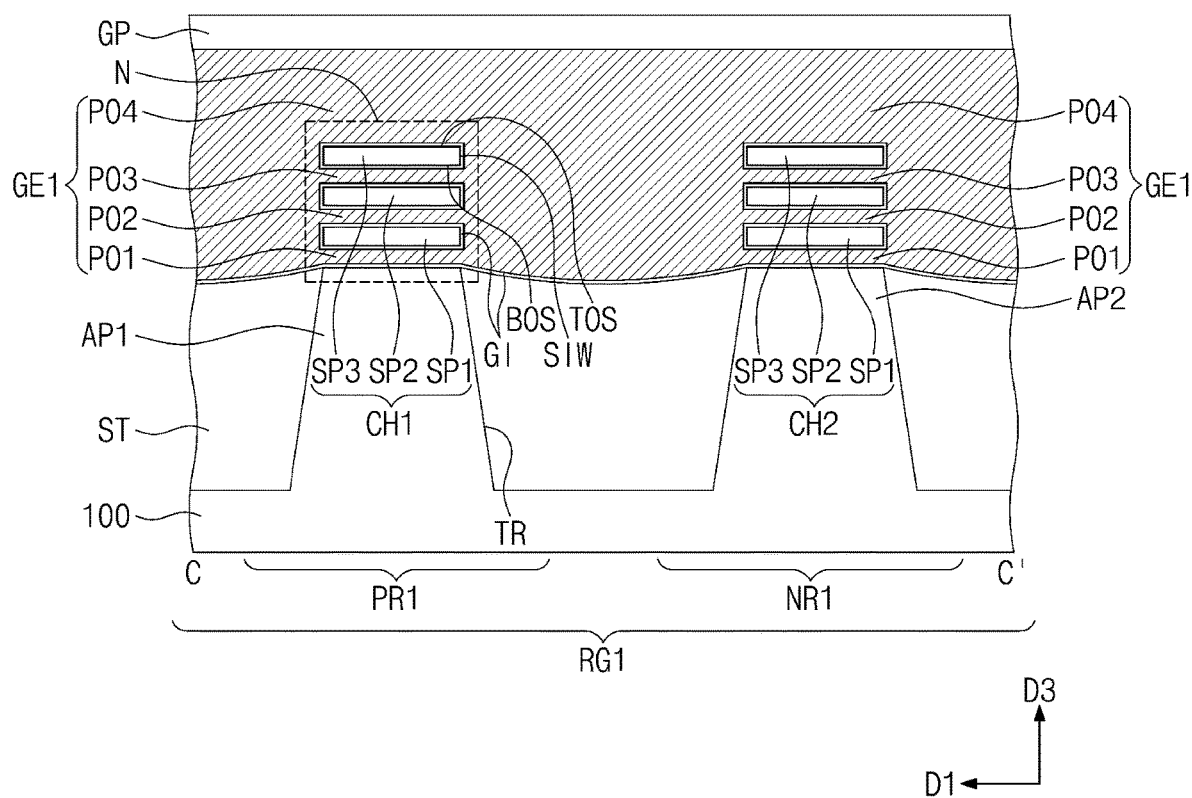
Figure 14D:
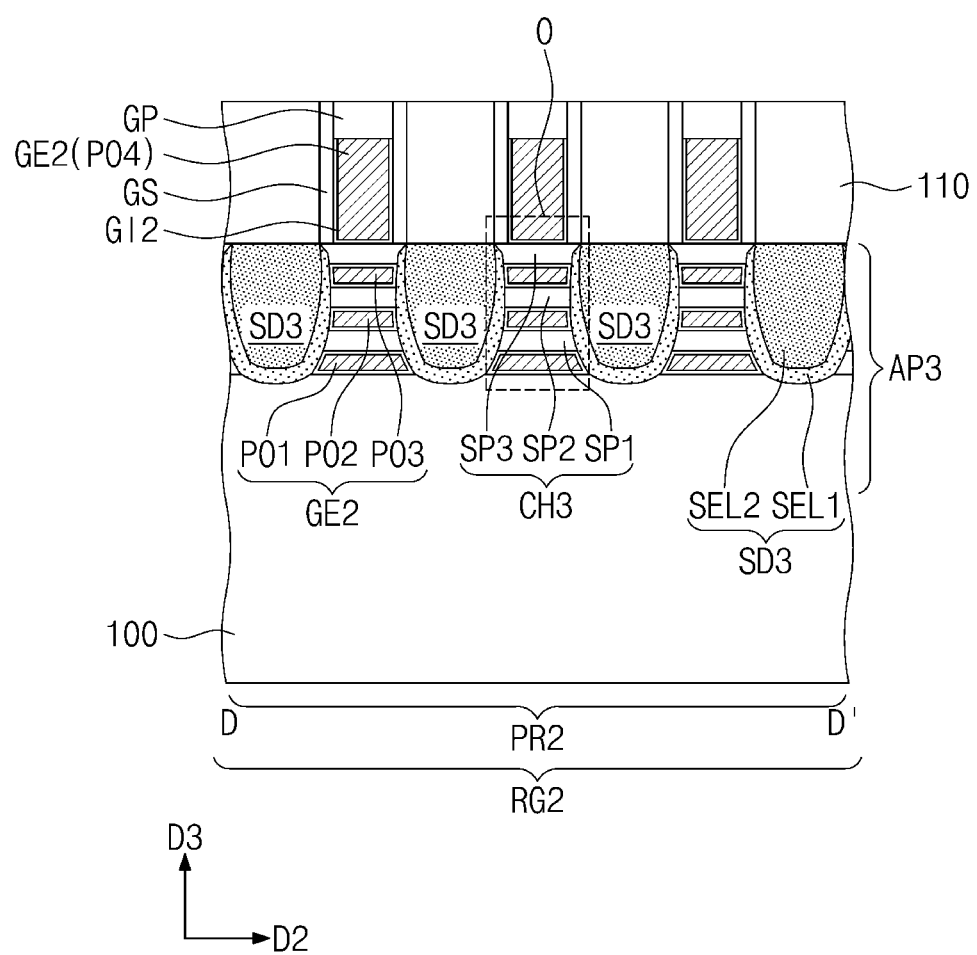
Figure 14E:
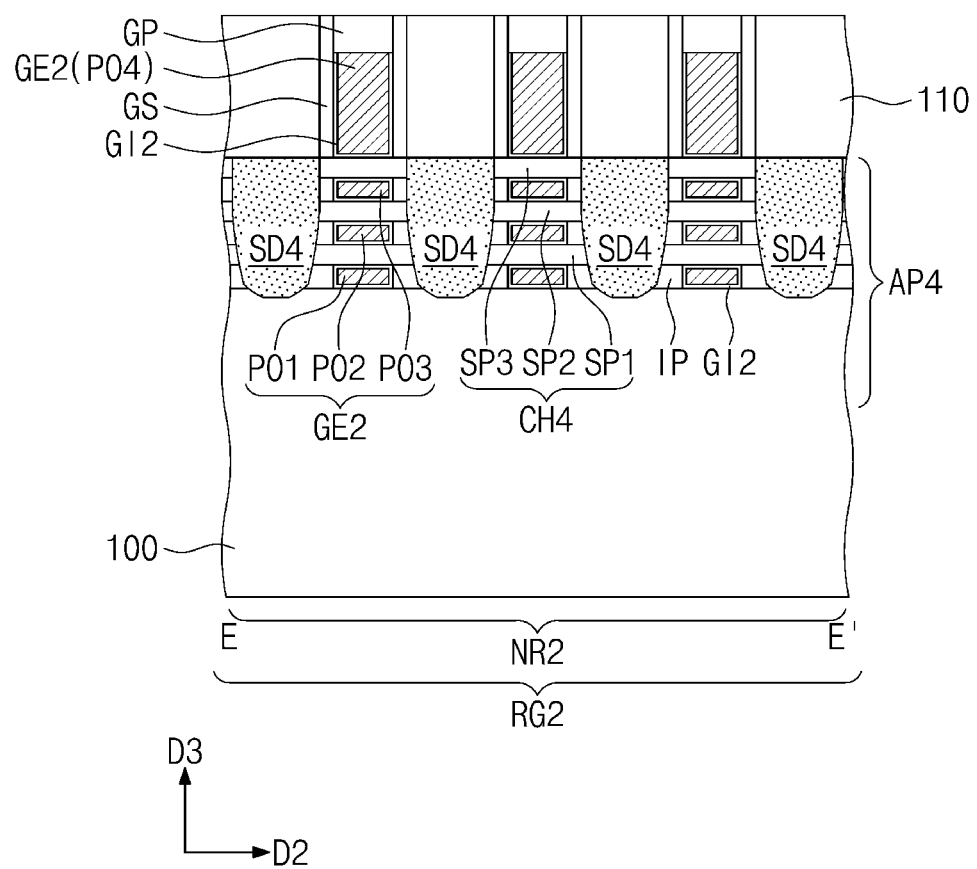
Figure 14F:
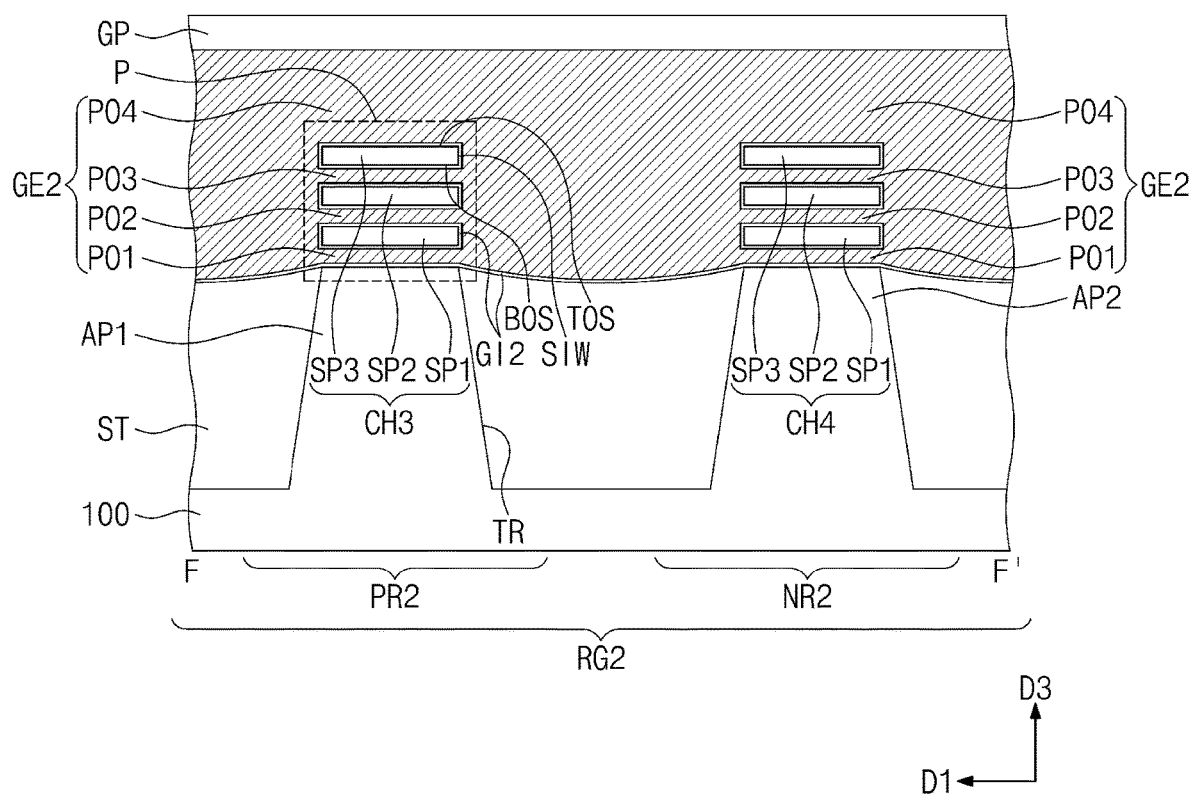

FIGS. 5, 7, 9, 11, and 13 are plan views illustrating a method of fabricating a semiconductor device according to an embodiment. FIGS. 6A, 8A, 10A, 12A, and 14A are sectional views taken along lines A-A' of FIGS. 5, 7, 9, 11, and 13, respectively. FIGS. 6B, 8B, 10B, 12B, and 14B are sectional views taken along lines B-B' of FIGS. 5, 7, 9, 11, and 13, respectively. FIGS. 6C, 8C, 10C, 12C, and 14C are sectional views taken along lines C-C' of FIGS. 5, 7, 9, 11, and 13, respectively. FIGS. 6D, 8D, 10D, 12D, and 14D are sectional views taken along lines D-D' of FIGS. 5, 7, 9, 11, and 13, respectively. FIGS. 10E, 12E, and 14E are sectional views taken along lines E-E' of FIGS. 9, 11, and 13, respectively. FIGS. 10F, 12F, and 14F are sectional views taken along lines F-F' of FIGS. 9, 11, and 13, respectively.

Referring to FIGS. 5 and 6A to 6D, the substrate 100 including the first region RG1 and the second region RG2 may be provided. The sacrificial layers SAL and active layers ACL may be alternately stacked on the substrate 100. The sacrificial layers SAL may be formed of or include one of silicon (Si), germanium (Ge), and silicon-germanium (SiGe), and the active layers ACL may be formed of or include another one of silicon (Si), germanium (Ge), and silicon-germanium (SiGe).

For example, the sacrificial layers SAL may be formed of or include silicon-germanium (SiGe), and the active layers ACL may be formed of or include silicon (Si). A germanium concentration of each of the sacrificial layers SAL may range from 10 at % to 30 at %.

The first region RG1 and the second region RG2 of the substrate 100 may be patterned to form the trenches TR defining first to fourth active patterns AP1 to AP4. The first and second active patterns AP1 and AP2 may be formed on the first PMOS and NMOS regions PR1 and NR1 of the first region RG1, respectively. The third and fourth active patterns AP3 and AP4 may be formed on the second PMOS and NMOS regions PR2 and NR2 of the second region RG2, respectively.

A stacking pattern STP may be formed on each of the first to fourth active patterns AP1 to AP4. The stacking pattern STP may include the sacrificial layers SAL and the active layers ACL, which are alternatingly stacked. The stacking pattern STP may be formed along with the first to fourth active patterns AP1 to AP4.

The device isolation layer ST may be formed to fill the trench TR. In detail, an insulating layer may be formed on the substrate 100 to cover the first to fourth active patterns AP1 to AP4 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed at a level higher than the device isolation layer ST, and may be exposed to the outside of the device isolation layer ST. In other words, the stacking patterns STP may protrude vertically above the device isolation layer ST.

Referring to FIGS. 7 and 8A to 8D, a first sacrificial pattern PP1 may be formed on the first region RG1 to cross the stacking patterns STP on the first and second active patterns AP1 and AP2. Second sacrificial patterns PP2 may be formed on the second region RG2 to cross the stacking patterns STP on the third and fourth active patterns AP3 and AP4. Each of the first and second sacrificial patterns PP1 and PP2 may be a line- or bar-shaped pattern extending in the first direction D1. The first sacrificial pattern PP1 may be formed to have a width that is greater than a width of the second sacrificial pattern PP2. Each of the first and second sacrificial patterns PP1 and PP2 may be referred to as dummy gate structure.

In detail, the formation of the first and second sacrificial patterns PP1 and PP2 may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

In an embodiment, the patterning process to form the first and second sacrificial patterns PP1 and PP2 may include a lithography process using an extreme ultraviolet (EUV) light. In the present specification, the EUV light may have a wavelength ranging from 4 nm to 124 nm and, in particular, from 4 nm to 20 nm and may be, for example, an ultraviolet light having a wavelength of 13.5 nm. The EUV light may have an energy of 6.21 eV to 124 eV and, in particular, of 90 eV to 95 eV.

The lithography process using the EUV light may include performing an exposing process of irradiating a photoresist layer with the EUV light and performing a developing process. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. In a plan view, the photoresist patterns may be formed to have a line shape extending in a specific direction, an island shape, a zigzag shape, a honeycomb shape, or a circular shape, but the inventive concept is not limited to these examples.

The hard mask patterns MP may be formed by patterning at least one mask layer, which is disposed below the photoresist patterns, using the photoresist patterns as an etch mask. Thereafter, desired patterns (i.e., the first and second sacrificial patterns PP1 and PP2) may be formed on a wafer by patterning a target layer (i.e., the sacrificial layer) using the hard mask patterns MP as an etch mask.

In a comparative example, a multi-patterning technology (MPT) using two or more photomasks is required to form fine-pitch patterns on the wafer. By contrast, in the case where the EUV lithography process according to an embodiment is performed, the first and second sacrificial patterns PP1 and PP2 may be formed to have a fine pitch, even when just one photomask is used.

For example, the minimum pitch between the first and second sacrificial patterns PP1 and PP2, which are realized by the EUV lithography process according to the present embodiment, may be less than or equal to 45 nm. In other words, since the EUV lithography process is performed to form the first and second sacrificial patterns PP1 and PP2, the first and second sacrificial patterns PP1 and PP2 may be precisely and finely formed, without a multi-patterning technology.

In an embodiment, the EUV lithography process may be used in the patterning process for forming not only the first and second sacrificial patterns PP1 and PP2 but also the first to fourth active patterns AP1 to AP4 described above, but the inventive concept is not limited to this example.

A pair of gate spacers GS may be respectively formed on opposite side surfaces of each of the first and second sacrificial patterns PP1 and PP2 in the second direction D2. The formation of the gate spacers GS may include conformally forming a gate spacer layer on the substrate 100 and anisotropically etching the gate spacer layer. In an embodiment, the gate spacer layer may be formed of or include at least one of SiCN, SiCON, or SiN. Alternatively, the gate spacer layer may include at least two layers, each of which is formed of at least one of SiCN, SiCON, or SiN; that is, the gate spacer layer may have a multi-layered structure.

Referring to FIGS. 9 and 10A to 10F, first to fourth source/drain patterns SD1 to SD4 may be formed on the first to fourth active patterns AP1 to AP4, respectively. For example, the first source/drain patterns SD1 may be formed in an upper portion of the first active pattern AP1. The first source/drain patterns SD1 may be respectively formed at both sides of the first sacrificial pattern PP1.

In detail, first recess regions RS1 may be formed by etching the stacking pattern STP on the first active pattern AP1 using the hard mask patterns MP and the gate spacers GS as an etch mask. The device isolation layer ST may be recessed during the etching of the stacking pattern STP (e.g., see FIG. 10C). The first to third semiconductor patterns SP1, SP2 and SP3, which are sequentially stacked between the adjacent ones of the first recess regions RS1, may be formed from the active layers ACL of the stacking pattern STP. The first to third semiconductor patterns SP1, SP2 and SP3 between the adjacent ones of the first recess regions RS1 may constitute the first channel pattern CH1.

A first SEG process, in which an inner surface of the first recess region RS1 of the stacking pattern STP is used as a seed layer, may be performed to form the first semiconductor layer SEL1. The first semiconductor layer SEL1 may be grown using the first to third semiconductor patterns SP1, SP2 and SP3 and the substrate 100, which are exposed through the first recess region RS1, as a seed. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be formed to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be formed by performing a second SEG process on the first semiconductor layer SELL The second semiconductor layer SEL2 may be formed to completely fill the first recess region RS1. The second semiconductor layer SEL2 may be provided to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have a first conductivity type (e.g., p-type).

The second source/drain patterns SD2 may be formed in an upper portion of the second active pattern AP2. The second source/drain patterns SD2 may be respectively formed at both sides of the first sacrificial pattern PP1. As a result of the formation of the second source/drain patterns SD2, the second channel pattern CH2 including the first to third semiconductor patterns SP1, SP2 and SP3 may be defined between the second source/drain patterns SD2.

In detail, second recess regions RS2 may be formed by etching the stacking pattern STP on the second active pattern AP2 using the hard mask patterns MP and the gate spacers GS as an etch mask. The second source/drain pattern SD2 may be formed by performing a selective epitaxial growth process, in which an inner side surface of the second recess region RS2 of the stacking pattern STP is used as a seed layer. The second source/drain patterns SD2 may be formed of or include the same semiconductor material (e.g., Si) as the substrate 100. The second source/drain patterns SD2 may be doped to have a second conductivity type (e.g., n-type).

Before the formation of the second source/drain pattern SD2, the sacrificial layers SAL exposed through the second recess region RS2 may be partially removed. The inner spacer IP may be formed by filling a region, which is formed by partially removing the sacrificial layers SAL, with an insulating material.

The third source/drain patterns SD3 may be formed in the stacking pattern STP on the third active pattern AP3 through substantially the same method as that for the first source/drain patterns SD1 described above. In an embodiment, the first source/drain patterns SD1 and the third source/drain patterns SD3 may be formed at the same time. As a result of the formation of the third source/drain patterns SD3, the third channel pattern CH3 including the first to third semiconductor patterns SP1, SP2 and SP3 may be defined between the third source/drain patterns SD3.

The fourth source/drain patterns SD4 may be formed in the stacking pattern STP on the fourth active pattern AP4 through substantially the same method as that for the second source/drain patterns SD2 described above. In an embodiment, the second source/drain patterns SD2 and the fourth source/drain patterns SD4 may be formed at the same time. As a result of the formation of the fourth source/drain patterns SD4, the fourth channel pattern CH4 including the first to third semiconductor patterns SP1, SP2 and SP3 may be defined between the fourth source/drain patterns SD4. The inner spacer IP may be formed, before the formation of the fourth source/drain patterns SD4.

Referring to FIGS. 11 and 12A to 12F, the first interlayer insulating layer 110 may be formed on the first to fourth source/drain patterns SD1 to SD4, the hard mask patterns MP, and the gate spacers GS. As an example, the first interlayer insulating layer 110 may include a silicon oxide layer.

The first interlayered insulating layer 110 may be planarized to expose top surfaces of the first and second sacrificial patterns PP1 and PP2. The planarization of the first interlayer insulating layer 110 may be performed using an etch-back or chemical-mechanical polishing (CMP) process. All of the hard mask patterns MP may be removed during the planarization process. As a result, the first interlayered insulating layer 110 may have a top surface that is substantially coplanar with the top surfaces of the first and second sacrificial patterns PP1 and PP2 and the top surfaces of the gate spacers GS.

The first and second sacrificial patterns PP1 and PP2 may be selectively removed. As a result of the removal of the first sacrificial pattern PP1, an outer region ORG may be formed to expose the first and second channel patterns CH1 and CH2. As a result of the removal of the second sacrificial patterns PP2, an outer region ORG may be formed to expose the third and fourth channel patterns CH3 and CH4. The removal of the sacrificial patterns PP may include a wet etching process which is performed using an etching solution capable of selectively etching polysilicon.

The sacrificial layers SAL, which are exposed through the outer region ORG, may be selectively removed to form first to third inner regions IRG1 to IRG3. In detail, by performing a process of selectively etching the sacrificial layers SAL, it may be possible to leave the first to third semiconductor patterns SP1, SP2 and SP3 and remove the sacrificial layers SAL. The etching process may be chosen to have a high etch rate for a material (e.g., SiGe) having a relatively high germanium concentration. For example, the etching process may have a high etch rate for silicon-germanium of which germanium concentration is higher than 10 at %.

The sacrificial layers SAL on the first and second regions RG1 and RG2 may be removed during the etching process. The etching process may be a wet etching process. An etchant material, which is used in the etching process, may be chosen to quickly remove the sacrificial layer SAL having a relatively high germanium concentration. Meanwhile, due to the first semiconductor layer SEL1 having the relatively low germanium concentration, each of the first and third source/drain patterns SD1 and SD3 may be protected during the etching process.

Since the sacrificial layers SAL are selectively removed, the stacked first to third semiconductor patterns SP1, SP2 and SP3 may be left on each of the first to fourth active patterns AP1 to AP4. Regions, from which the sacrificial layers SAL are removed, may form the first to third inner regions IRG1, IRG2, and IRG3, respectively. In detail, the first inner region IRG1 may be formed between the active pattern AP1 to AP4 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

The first to third inner regions IRG1, IRG2, and IRG3 and the outer region ORG on the first region RG1 may constitute a first empty space ET1. The first to third semiconductor patterns SP1, SP2 and SP3 of each of the first and second channel patterns CH1 and CH2 may be exposed through the first empty space ET1. The first to third inner regions IRG1, IRG2, and IRG3 and the outer region ORG on the second region RG2 may constitute a second empty space ET2. The first to third semiconductor patterns SP1, SP2 and SP3 of each of the third and fourth channel patterns CH3 and CH4 may be exposed through the second empty space ET2.

Referring to FIGS. 13 and 14A to 14F, the first and second gate insulating layers GI1 and GI2 may be formed in the first and second empty spaces ET1 and ET2, respectively. The first gate insulating layer GI1 may be formed in the first empty space ET1 to enclose each of the first to third semiconductor patterns SP1, SP2 and SP3. The second gate insulating layer GI2 may be formed in the second empty space ET2 to enclose each of the first to third semiconductor patterns SP1, SP2 and SP3.

The first and second gate electrodes GE1 and GE2 may be formed in the first and second empty spaces ET1 and ET2, respectively. The first gate electrode GE1 may include the first to third portions PO1, PO2 and PO3 filling the first to third inner regions IRG1 to IRG3 of the first empty space ET1 and the fourth portion PO4 filling the outer region ORG. The second gate electrode GE2 may include the first to third portions PO1, PO2 and PO3 filling the first to third inner regions IRG1 to IRG3 of the second empty space ET2 and the fourth portion PO4 filling the outer region ORG. The gate capping pattern GP may be formed on each of the first and second gate electrodes GE1 and GE2.

Referring back to FIGS. 1 and 2A to 2H, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first to fourth source/drain patterns SD1, SD2, SD3, and SD4. The gate contacts GC may be formed to penetrate the second interlayer insulating layer 120 and the gate capping pattern GP and to be electrically connected to the first and second gate electrodes GE1 and GE2.

The third interlayer insulating layer 130 may be formed on the second interlayer insulating layer 120. The first metal layer M1 may be formed in the third interlayer insulating layer 130. The formation of the first metal layer M1 may include forming the first interconnection lines IL1. The fourth interlayer insulating layer 140 may be formed on the first metal layer M1. The second metal layer M2 may be formed in the fourth interlayer insulating layer 140. The formation of the second metal layer M2 may include forming the second interconnection lines IL2.

According to an embodiment, at least one of the interconnection lines IL1 and IL2 in the first and second metal layers M1 and M2 may be formed by an EUV lithography process. The EUV lithography process, which is used in the process of forming the interconnection line (i.e., the back-end-of-line (BEOL) process), may be performed in substantially the same manner as the afore-described method of forming the first and second sacrificial patterns PP1 and PP2. For example, in the case where the first interconnection lines IL1 are formed by the EUV lithography process according to the present embodiment, the minimum pitch between the first interconnection lines IL1 may be equal to or less than 45 nm.

Figure 15A:
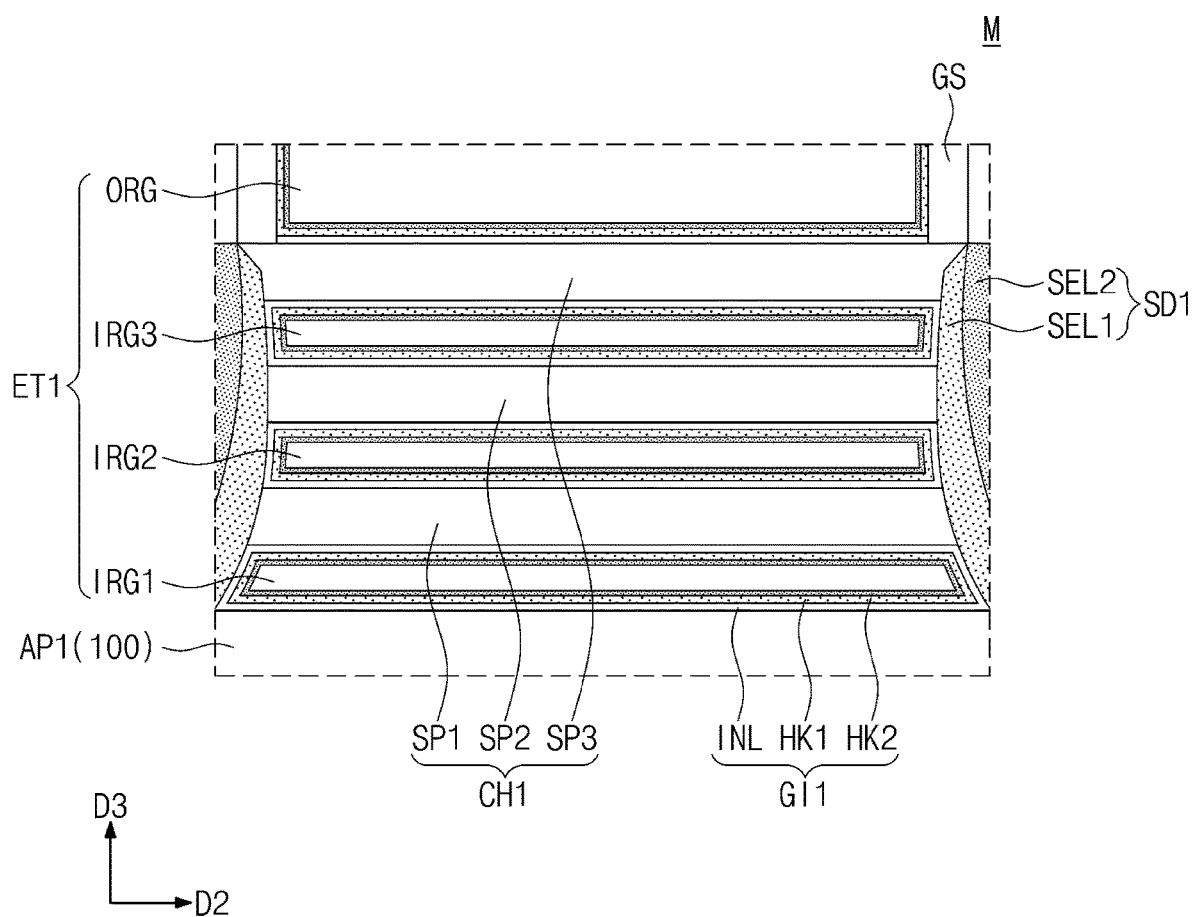
FIGS. 15A to 16D are sectional views illustrating a method of forming first and second gate insulating layers, according to an embodiment.
Figure 15B:
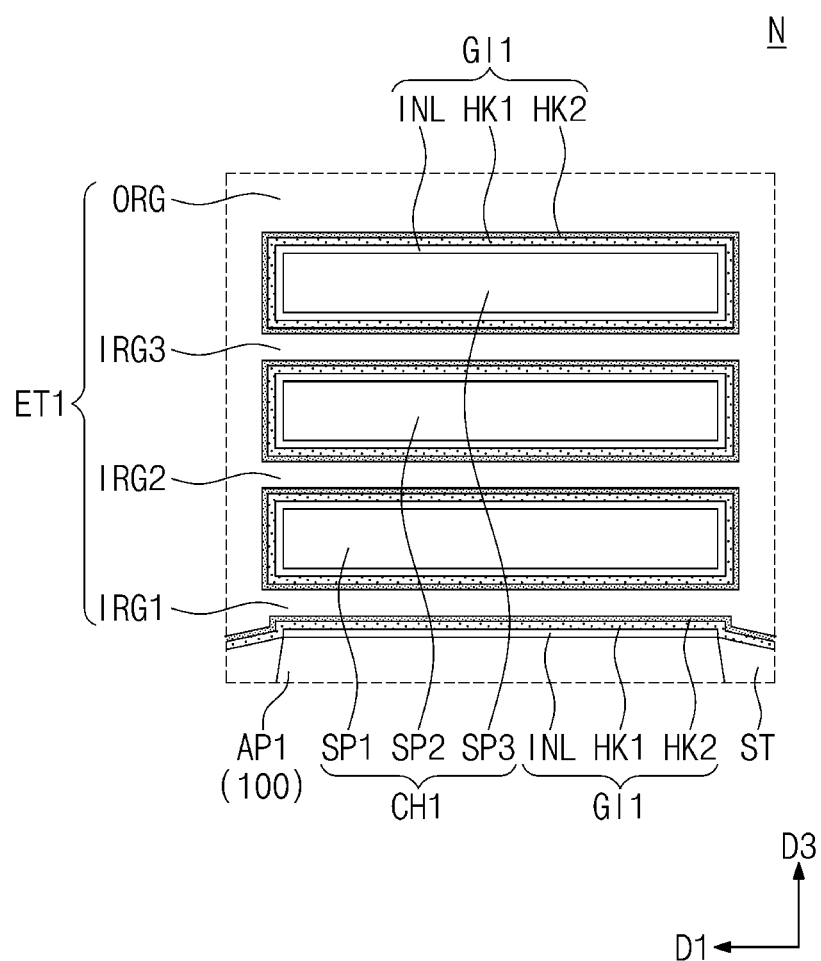
Figure 15C:
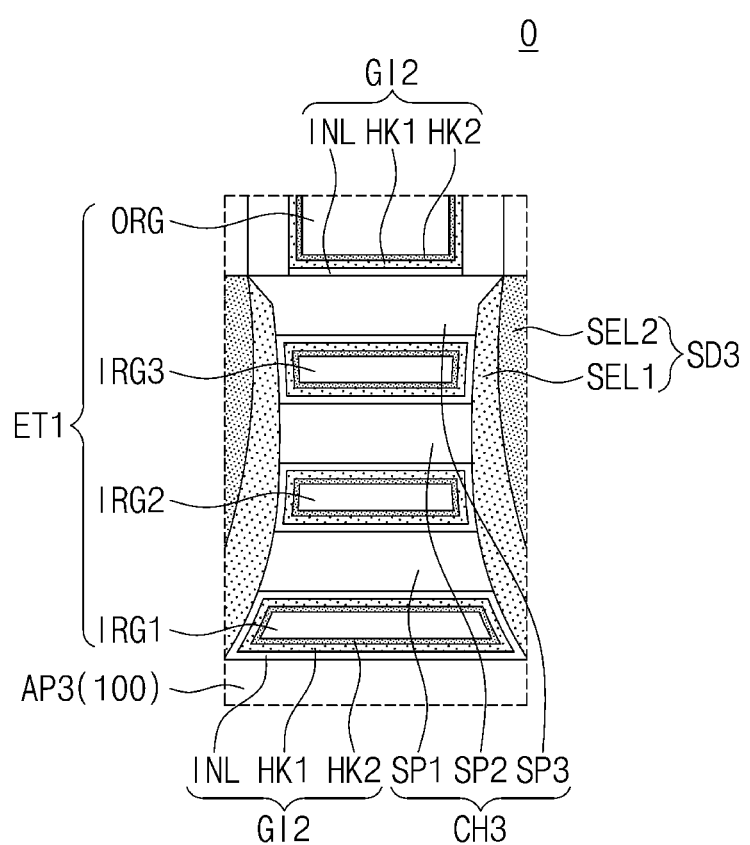
Figure 15D:
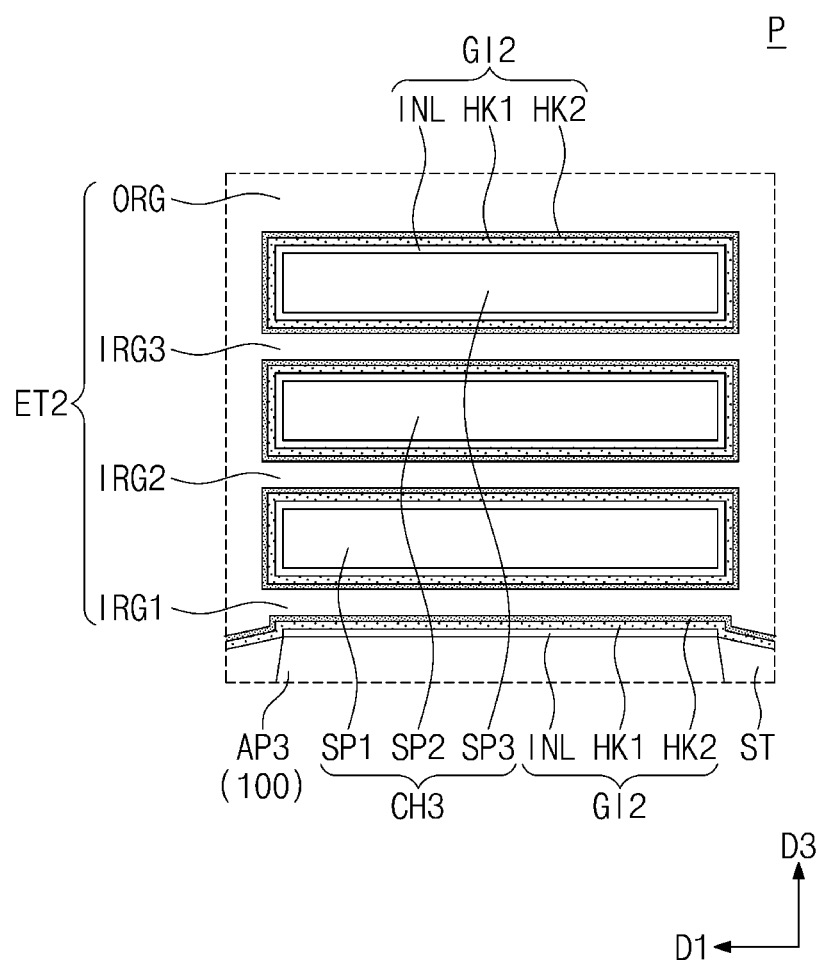
Figure 16A:
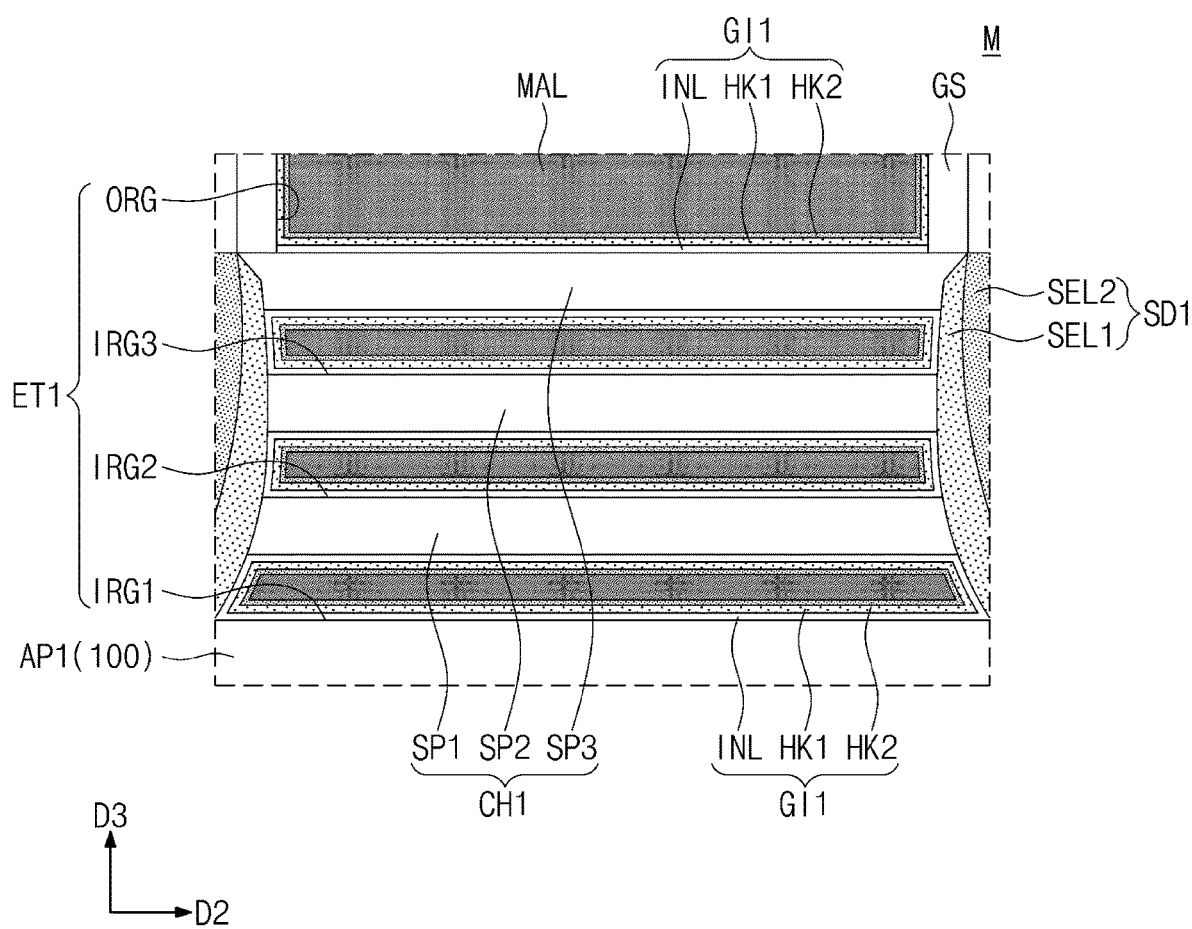
Figure 16B:
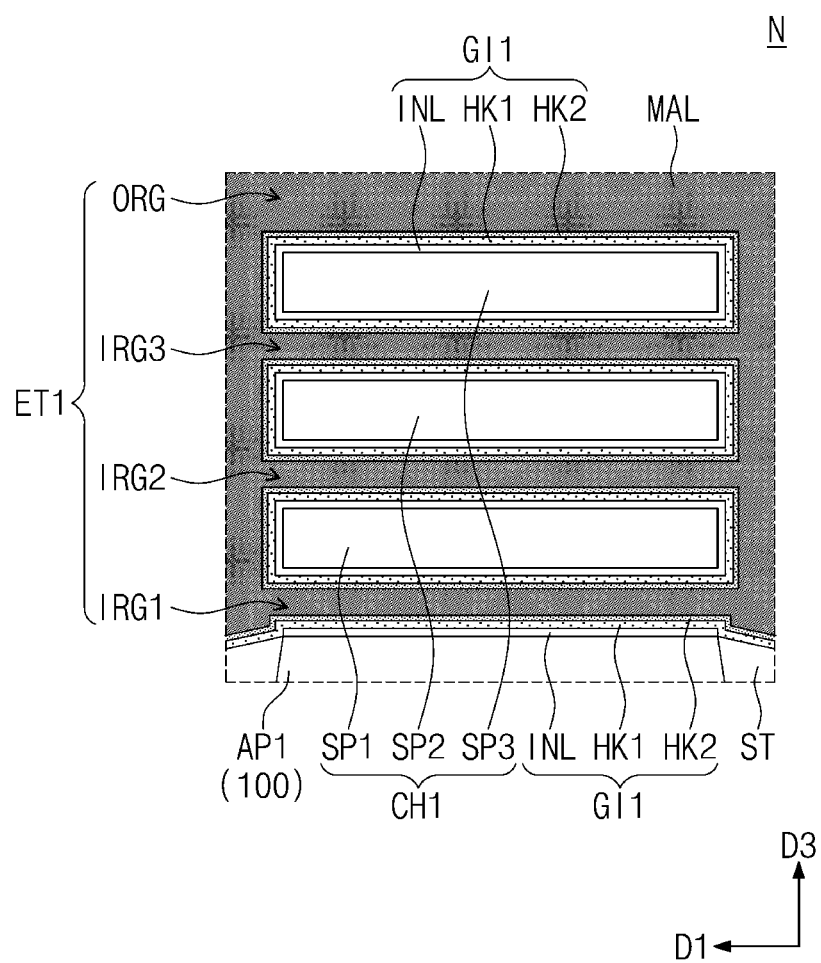
Figure 16C:
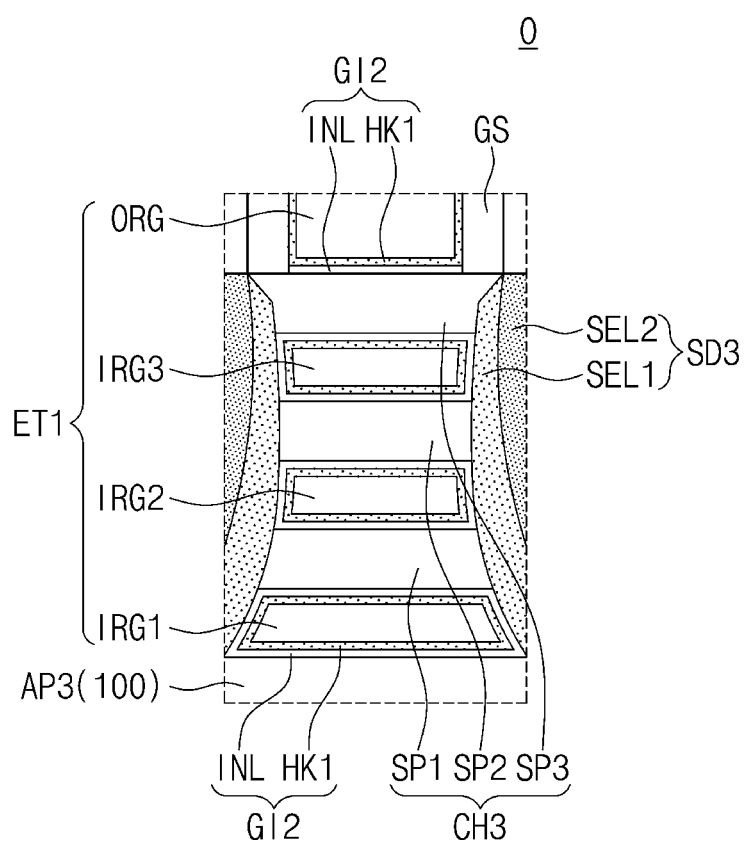
Figure 16D:
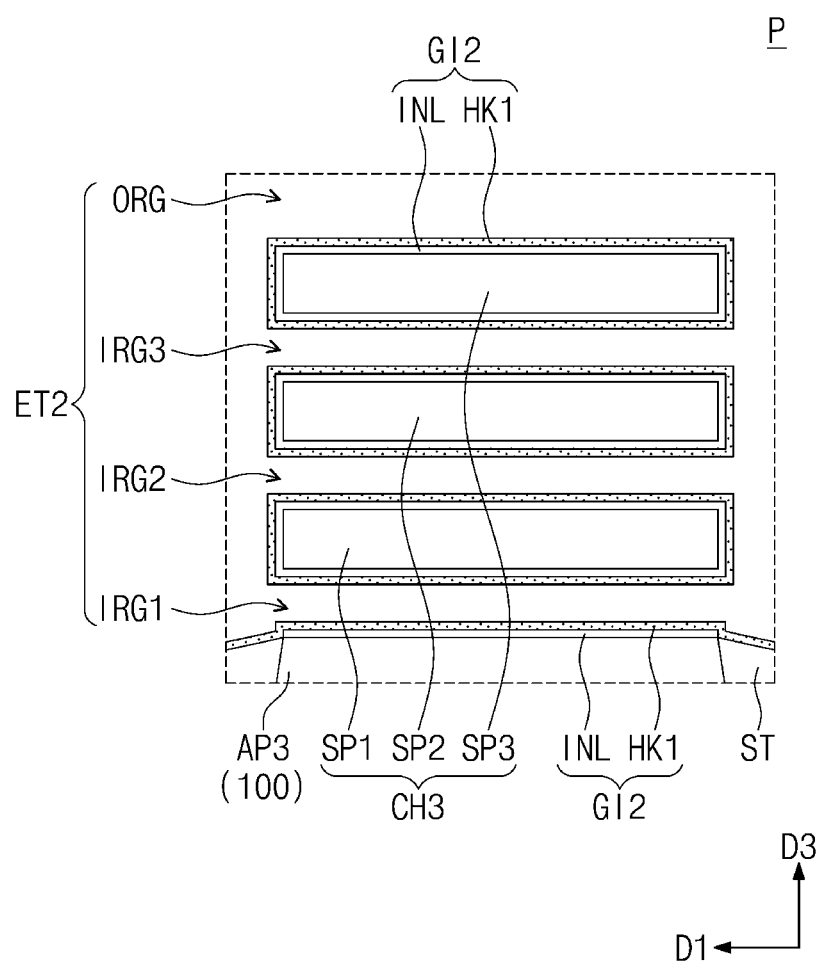

FIGS. 15A to 16D are sectional views illustrating the first and second gate insulating layers GI1 and GI2 according to a method of forming an embodiment. In detail, FIGS. 15A and 16A are sectional views illustrating a method of forming a portion 'M' of FIG. 14A. FIGS. 15B and 16B are sectional views illustrating a method of forming a portion 'N' of FIG. 14C. FIGS. 15C and 16C are sectional views illustrating a method of forming a portion 'O' of FIG. 14D. FIGS. 15D and 16D are sectional views illustrating a method of forming a portion 'P' of FIG. 14F.

Referring to FIGS. 15A to 15D, the interface layer INL, the first high-k dielectric layer HK1, and the second high-k dielectric layer HK2 may be sequentially formed on the structure illustrated in FIGS. 11 and 12A to 12F. In detail, the interface layer INL, the first high-k dielectric layer HK1, and the second high-k dielectric layer HK2 may be sequentially formed in the first and second empty spaces ET1 and ET2. In other words, the interface layer INL, the first high-k dielectric layer HK1, and the second high-k dielectric layer HK2 may be formed on both of the first and second regions RG1 and RG2.

In an embodiment, the interface layer INL may be formed by performing an oxidation process or a deposition process on the exposed semiconductor materials (e.g., the first to third semiconductor patterns SP1 to SP3 and the first to fourth source/drain patterns SD1 to SD4). The formation of the interface layer INL may include one of chemical oxidation, ozone oxidation, millisecond oxidation, and atomic layer deposition (ALD) processes. The interface layer INL may include a silicon oxide layer. The interface layer INL may be formed to have a thickness of 1.0 nm to 2.5 nm.

The first high-k dielectric layer HK1 may be formed on the interface layer INL. The first high-k dielectric layer HK1 may be conformally formed using a deposition process (e.g., an atomic layer deposition (ALD) process or a chemical vapor deposition (CVD) process). The first high-k dielectric layer HK1 may be formed of or include at least one of hafnium oxide, zirconium oxide, yttrium oxide, or a compound thereof. The first high-k dielectric layer HK1 may be formed to have a thickness of 0.5 nm to 1.5 nm.

Although not shown, a dipole-containing layer may be formed on the first high-k dielectric layer HK1. The dipole-containing layer may be formed on the first high-k dielectric layer HK1 to have a very small thickness (e.g., less than 1 nm). The dipole-containing layer may be thermally treated to diffuse a dipole element in the dipole-containing layer into the interface layer INL and the first high-k dielectric layer HK1. The dipole-containing layer may be formed only when necessary, and in an embodiment, it may not be formed.

The second high-k dielectric layer HK2 may be formed on the first high-k dielectric layer HK1. The second high-k dielectric layer HK2 may be conformally formed by a deposition process (e.g., an atomic layer deposition (ALD) process or a chemical vapor deposition (CVD) process). The second high-k dielectric layer HK2 may be formed of a material (e.g., aluminum oxide) of which a band gap is greater than the first high-k dielectric layer HK1. The second high-k dielectric layer HK2 may be formed to have a thickness of 0.5 nm to 1.0 nm.

The interface layer INL, the first high-k dielectric layer HK1, and the second high-k dielectric layer HK2 may be formed to partially fill the first to third inner regions IRG1 to IRG3 and the outer region ORG of the first and second empty spaces ET1 and ET2.

Referring to FIGS. 16A to 16D, a mask layer MAL may be formed in the first empty space ET1 on the first region RG1. In an embodiment, the mask layer MAL may be formed on only the first region RG1 and to expose the second region RG2. Thus, the second high-k dielectric layer HK2, which is formed on the second region RG2, may be exposed through the second empty space ET2, even after the formation of the mask layer MAL.

The second high-k dielectric layer HK2, which is exposed on the second region RG2, may be selectively removed. The removal of the second high-k dielectric layer HK2 may include a process of selectively etching the second high-k dielectric layer HK2. Since the second high-k dielectric layer HK2 includes a material having and etch selectivity with respect to the first high-k dielectric layer HK1, it may be possible to leave the first high-k dielectric layer HK1 and selectively etch the second high-k dielectric layer HK2.

As a result, only the interface layer INL and the first high-k dielectric layer HK1 may be left in the second empty space ET2 on the second region RG2, and the interface layer INL and the first high-k dielectric layer HK1, which are left on the second region RG2 may constitute the second gate insulating layer GI2.

Meanwhile, the interface layer INL, the first high-k dielectric layer HK1, and the second high-k dielectric layer HK2 on the first region RG1 may be protected by the mask layer MAL and may be left as they are. The interface layer INL, the first high-k dielectric layer HK1, and the second high-k dielectric layer HK2, which are left on the first region RG1, may constitute the first gate insulating layer GI1.

Referring back to FIGS. 3A to 3D, the mask layer MAL may be removed. The first and second gate electrodes GE1 and GE2 may be formed in the first and second empty spaces ET1 and ET2, respectively.

In the method of fabricating a semiconductor device according to the present embodiment, the interface layer INL, the first high-k dielectric layer HK1, and the second high-k dielectric layer HK2 may be formed on both of the first and second regions RG1 and RG2, and then, the second high-k dielectric layer HK2 may be selectively removed from only the second region RG2. Thus, it may be possible to easily form the first gate insulating layer GI1 and the second gate insulating layer GI2, which have different properties on the first and second regions RG1 and RG2. According to the present embodiment, it may be possible to realize a region-dependent difference in structure between the first gate insulating layer GI1 and the second gate insulating layer GI2 through a simple process, and this may make it possible to improve efficiency in the fabrication and reliability of the device.

According to an embodiment, an EG device may include a first high-k dielectric layer and a second high-k dielectric layer, which are provided instead of an EG oxide layer, and by combining the first and second high-k dielectric layers, it may be possible to secure an improved reliability property and a high breakdown voltage even when it has a thin thickness. In addition, since a gate insulating layer of the EG device has a relatively small thickness, it may be possible to sufficiently secure a space for a work-function metal, between semiconductor patterns serving as channel patterns. As a result, electric characteristics of a semiconductor device may be improved.

In a manufacturing method according to an embodiment, the gate insulating layer of the EG device and a gate insulating layer of an SG device may be formed at the same time, and this may make it possible to improve efficiency in the fabrication and reliability of the device.

While example embodiments have been particularly shown and described, it will be understood by one of ordinary skill in the art that variations in form and detail may be made therein without departing from the spirit and scope of the attached claims.

What is claimed is:

1. A semiconductor device comprising:
    a substrate comprising a first region and a second region;
    a first active pattern on the first region and a second active pattern on the second region;
    a pair of first source/drain patterns on the first active pattern and a first channel pattern therebetween, the first channel pattern comprising a plurality of first semiconductor patterns stacked on the first active pattern;
    a pair of second source/drain patterns on the second active pattern and a second channel pattern therebetween, the second channel pattern comprising a plurality of second semiconductor patterns stacked on the second active pattern;
    a first gate electrode and a second gate electrode provided on the first and second channel patterns, respectively; and
    a first gate insulating layer between the first channel pattern and the first gate electrode, and a second gate insulating layer between the second channel pattern and the second gate electrode,
    wherein each of the first and second gate insulating layers comprises an interface layer and a first high-k dielectric layer on the interface layer,
    wherein the first gate insulating layer further comprises a second high-k dielectric layer on the first high-k dielectric layer,
    wherein a width of the first gate electrode is greater than a width of the second gate electrode in a channel length direction,
    wherein the second high-k dielectric layer is not included in the second gate insulating layer, and
    wherein the second high-k dielectric layer comprises a material of which a band gap is greater than the first high-k dielectric layer.

2. The semiconductor device of claim 1, wherein the first high-k dielectric layer comprises hafnium oxide, zirconium oxide, yttrium oxide, or a compound thereof, and
    wherein the second high-k dielectric layer comprises aluminum oxide, magnesium oxide, or a compound thereof.

3. The semiconductor device of claim 1, wherein the first gate insulating layer comprises a dipole element,
    wherein a concentration of the dipole element in the first high-k dielectric layer is higher than a concentration of the dipole element in the second high-k dielectric layer, and
    wherein a concentration of the dipole element in the interface layer is higher than the concentration of the dipole element in the first high-k dielectric layer.

4. The semiconductor device of claim 1, wherein a thickness of the interface layer of the first gate insulating layer is substantially equal to a thickness of the interface layer of the second gate insulating layer, and
    wherein a thickness of the first high-k dielectric layer of the first gate insulating layer is substantially equal to a thickness of the first high-k dielectric layer of the second gate insulating layer.

5. The semiconductor device of claim 1, wherein a thickness of the second high-k dielectric layer is smaller than a thickness of the first high-k dielectric layer, and
    wherein the thickness of the second high-k dielectric layer is smaller than a thickness of the interface layer.

6. The semiconductor device of claim 5, wherein the thickness of the interface layer ranges from 1.0 nm to 2.5 nm,
    wherein the thickness of the first high-k dielectric layer ranges from 0.5 nm to 1.5 nm, and
    wherein the thickness of the second high-k dielectric layer ranges from 0.5 nm to 1.0 nm.

7. The semiconductor device of claim 1, wherein the first region is a region, in which an extra gate (EG) device is provided, and
    wherein the second region is a region, in which a single gate (SG) device is provided.

8. The semiconductor device of claim 1, wherein the first gate electrode comprises a first portion interposed between the first semiconductor patterns which are vertically adjacent to each other,
    wherein the second gate electrode comprises a second portion interposed between the second semiconductor patterns which are vertically adjacent to each other, and
    wherein a thickness of the first portion in a vertical direction is smaller than a thickness of the second portion in the vertical direction.

9. The semiconductor device of claim 8, wherein the first portion comprises a work-function metal comprising metal nitride.

10. The semiconductor device of claim 1, wherein the first gate electrode is in a direct contact with the second high-k dielectric layer, and
    wherein the second gate electrode is in a direct contact with the first high-k dielectric layer.

11. A semiconductor device comprising:
    an active pattern on a core/peri region of a substrate;
    a pair of source/drain patterns on the active pattern and a channel pattern therebetween, the channel pattern comprising first to third semiconductor patterns, which are sequentially stacked on the active pattern and are spaced apart from each other;
    a gate electrode on the first to third semiconductor patterns, the gate electrode comprising a first portion between the active pattern and the first semiconductor pattern, a second portion between the first semiconductor pattern and the second semiconductor pattern, a third portion between the second semiconductor pattern and the third semiconductor pattern, and a fourth portion on the third semiconductor pattern;
    a gate insulating layer between the first to third semiconductor patterns and the gate electrode, the gate insulating layer enclosing each of the first to third semiconductor patterns;
    wherein the gate insulating layer comprises an interface layer, a first high-k dielectric layer, and a second high-k dielectric layer, which are sequentially stacked on each of the first to third semiconductor patterns, wherein the interface layer covers the first semiconductor pattern, the second semiconductor pattern and the third semiconductor pattern, wherein the gate insulating layer comprises a dipole element, wherein a concentration of the dipole element in the first high-k dielectric layer is higher than a concentration of the dipole element in the second high-k dielectric layer, wherein a concentration of the dipole element in the interface layer is higher than the concentration of the dipole element in the first high-k dielectric layer, wherein a thickness of the gate insulating layer ranges from 3 nm to 5 nm, and wherein a thickness of the second portion of the gate electrode in a vertical direction ranges from 4 nm to 8 nm.

12. The semiconductor device of claim 11, wherein the second high-k dielectric layer comprises a material of which a band gap is greater than the first high-k dielectric layer.

13. The semiconductor device of claim 11, wherein a thickness of the second high-k dielectric layer is smaller than a thickness of the first high-k dielectric layer, and wherein the thickness of the second high-k dielectric layer is smaller than a thickness of the interface layer.

14. The semiconductor device of claim 11, wherein the first to third portions comprise a work-function metal comprising metal nitride.

15. A semiconductor device comprising:
a substrate;
a first channel pattern on the substrate;
a first gate electrode surrounding all sides of the first channel pattern in a cross-sectional view of a channel width direction;
a first gate insulating layer interposed between the first channel pattern and the first gate electrode, wherein the first gate insulating layer comprises:
  an interface layer comprising a first oxide layer;
  a first high-k dielectric layer comprising a second oxide layer; and
  a second high-k dielectric layer comprising a material different from the first high-k dielectric layer, which are sequentially stacked on the channel pattern, wherein the second high-k dielectric layer comprises a third oxide layer;
a second channel pattern on the substrate;
a second gate electrode surrounding all sides of the second channel pattern in a cross-sectional view of the channel width direction;
a second gate insulating layer interposed between the second channel pattern and the second gate electrode, wherein the second gate insulating layer comprises another interface layer comprising the first oxide layer; and
another first high-k dielectric layer comprising the second oxide layer, wherein the second gate insulating layer does not comprise another second high-k dielectric layer comprising the third oxide layer.

16. The semiconductor device of claim 15, wherein a width of the first gate electrode is greater than a width of the second gate electrode in a channel length direction.

* * * * *